United States Patent
Takemura et al.

(10) Patent No.: US 11,150,556 B2
(45) Date of Patent: *Oct. 19, 2021

(54) POLYMER OF POLYIMIDE PRECURSOR, POSITIVE TYPE PHOTOSENSITIVE RESIN COMPOSITION, NEGATIVE TYPE PHOTOSENSITIVE RESIN COMPOSITION, PATTERNING PROCESS, METHOD FOR FORMING CURED FILM, INTERLAYER INSULATING FILM, SURFACE PROTECTIVE FILM, AND ELECTRONIC PARTS

(71) Applicant: SHIN-ETSU CHEMICAL CO., LTD., Tokyo (JP)

(72) Inventors: Katsuya Takemura, Joetsu (JP); Hiroyuki Urano, Joetsu (JP); Masashi Iio, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 129 days.

This patent is subject to a terminal disclaimer.

(21) Appl. No.: 15/918,261

(22) Filed: Mar. 12, 2018

(65) Prior Publication Data
US 2018/0275513 A1    Sep. 27, 2018

(30) Foreign Application Priority Data

Mar. 22, 2017 (JP) .............................. JP2017-55656

(51) Int. Cl.
| | |
|---|---|
| G03F 7/004 | (2006.01) |
| G03F 7/023 | (2006.01) |
| G03F 7/039 | (2006.01) |
| G03F 7/038 | (2006.01) |
| G03F 7/30 | (2006.01) |
| C08G 73/12 | (2006.01) |
| C08G 73/10 | (2006.01) |
| C08G 73/14 | (2006.01) |
| G03F 7/40 | (2006.01) |
| G03F 7/32 | (2006.01) |

(Continued)

(52) U.S. Cl.
CPC ....... *G03F 7/0233* (2013.01); *C08G 73/1039* (2013.01); *C08G 73/1042* (2013.01); *C08G 73/1071* (2013.01); *C08G 73/12* (2013.01); *C08G 73/14* (2013.01); *C09D 179/08* (2013.01); *G03F 7/0387* (2013.01); *G03F 7/0388* (2013.01); *G03F 7/0392* (2013.01); *G03F 7/20* (2013.01); *G03F 7/30* (2013.01); *G03F 7/322* (2013.01); *G03F 7/38* (2013.01); *G03F 7/40* (2013.01)

(58) Field of Classification Search
CPC ........ G03F 7/0387; G03F 7/0046; G03F 7/38; G03F 7/0233; G03F 7/0392; G03F 7/0388; C08G 73/1039; C08G 73/12; C08G 73/14
See application file for complete search history.

(56) References Cited

U.S. PATENT DOCUMENTS

| | | | | |
|---|---|---|---|---|
| 4,897,461 A | * | 1/1990 | Uekita | .................... C08G 73/10 525/436 |
| 5,518,864 A | * | 5/1996 | Oba | ....................... G03F 7/0233 430/325 |

(Continued)

FOREIGN PATENT DOCUMENTS

| | | | | |
|---|---|---|---|---|
| EP | 0532183 A2 | * | 3/1993 | ........... G03F 7/0387 |
| EP | 0961169 A1 | | 12/1999 | |

(Continued)

OTHER PUBLICATIONS

Oct. 9, 2018 European Search Report issued in Patent Application No. 18163279.5.

(Continued)

*Primary Examiner* — John S Chu
(74) *Attorney, Agent, or Firm* — Oliff PLC

(57) ABSTRACT

This is to provide a polymer of a polyimide precursor which is soluble in an aqueous alkaline solution, and capable of using a base resin of a positive type and negative type photosensitive resin composition which is capable of forming a fine pattern and obtaining high resolution. Also provided is a positive type and negative type photosensitive resin composition using such a polymer of a polyimide precursor. Further provided are a patterning process and a method of forming a cured film using the composition.

Provided is a polymer of a polyimide precursor which comprises a structural unit represented by the following general formula (1),

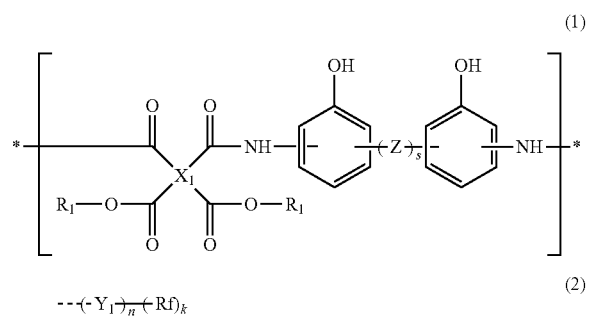

wherein, $X_1$, $R_1$, Z, a repeating number "s", $Y_1$, Rf, a repeating number "n" and "k" represent the same meanings as mentioned in the specification.

16 Claims, No Drawings

(51) Int. Cl.
*G03F 7/20* (2006.01)
*C09D 179/08* (2006.01)
*G03F 7/38* (2006.01)

(56) References Cited

U.S. PATENT DOCUMENTS

| | | | |
|---|---|---|---|
| 6,001,534 A | 12/1999 | Kato | |
| 6,232,032 B1 | 5/2001 | Nunomura et al. | |
| 7,026,080 B2 * | 4/2006 | Nakayama | C08L 79/08 |
| | | | 430/18 |
| 7,282,323 B2 * | 10/2007 | Kanatani | G03F 7/035 |
| | | | 430/18 |
| 8,071,273 B2 * | 12/2011 | Sakayori | C08G 73/10 |
| | | | 430/270.1 |
| 10,216,085 B2 * | 2/2019 | Takemura | C07C 69/80 |
| 2001/0009746 A1 | 7/2001 | Nunomura et al. | |
| 2009/0181224 A1 | 7/2009 | Minegishi | |
| 2011/0171436 A1 | 7/2011 | Minegishi | |
| 2017/0298186 A1 | 10/2017 | Takemura et al. | |
| 2018/0024434 A1 | 1/2018 | Takemura et al. | |

FOREIGN PATENT DOCUMENTS

| | | |
|---|---|---|
| EP | 3235803 A1 | 10/2017 |
| EP | 3275857 A1 | 1/2018 |
| JP | S49-115541 A | 11/1974 |
| JP | S55-45746 A | 3/1980 |
| JP | 3232022 B2 | 11/2001 |
| JP | 2005-049504 A | 2/2005 |
| JP | 3627488 B2 | 3/2005 |
| JP | 2007-199653 A | 8/2007 |
| JP | 5417623 B2 | 2/2014 |
| KR | 19990088649 A | 12/1999 |
| KR | 20080052668 A | 6/2008 |
| WO | 2013/168675 A1 | 11/2013 |

OTHER PUBLICATIONS

Apr. 29, 2019 Korean Office Action issued in Korean Patent Application No. 10-2018-0033124.
Jan. 14, 2021 Office Action issued in European Patent Application No. 18 163 279.5.

* cited by examiner

POLYMER OF POLYIMIDE PRECURSOR, POSITIVE TYPE PHOTOSENSITIVE RESIN COMPOSITION, NEGATIVE TYPE PHOTOSENSITIVE RESIN COMPOSITION, PATTERNING PROCESS, METHOD FOR FORMING CURED FILM, INTERLAYER INSULATING FILM, SURFACE PROTECTIVE FILM, AND ELECTRONIC PARTS

TECHNICAL FIELD

The present invention relates to a polymer of a polyimide precursor, a positive type photosensitive resin composition and a negative type photosensitive resin composition using the polymer of a polyimide precursor as a base resin, a patterning process using the positive type photosensitive resin composition or the negative type photosensitive resin composition capable of developing with an aqueous alkaline solution, a method for forming a cured film, an interlayer insulating film, a surface protective film, and electronic parts.

BACKGROUND ART

Along with miniaturization and high performance of various electronic devices such as personal computers, digital cameras, cellular phones and the like, demands for further downsizing, thinning and high density in semiconductor devices are rapidly increasing. For this reason, in order to cope with an increase in a substrate area in improvement of productivity, and in a high-density packaging technology such as a chip size package or a chip scale package (CSP) or three-dimensional lamination, development of photosensitive insulation materials with fine and high aspect ratio has been desired.

In the high-density packaging technology such as three-dimensional lamination, a polyimide film has been utilized as a protective film or insulating layer for a photosensitive insulating material which can form a pattern on a substrate, and its insulating property, mechanical strength, adhesiveness to the substrate and the like are kept drawing attention, and development is active even now.

As a photosensitive polyimide-based material, a material utilizing a polyamic acid which is a precursor of polyimide, for example, a material obtained by introducing a photosensitive group into a carboxyl group of the polyamic acid by an ester bond (Patent Document 1 and Patent Document 2) has heretofore been proposed. However, in these proposals, an imidization treatment at a high temperature exceeding 300° C. is indispensable in order to obtain an objective polyimide film after forming a patterned film. Thus, in order to withstand this high temperature, there were problems that the underlying substrate was restricted and the copper of the wiring was oxidized.

As an improvement thereof, a photosensitive polyimide using a solvent-soluble resin already imidized for lowering the post-curing temperature has been proposed (Patent Document 3 and Patent Document 4). The negative type photosensitive resin composition using the polyimide disclosed in Patent Document 3 is subjected to development using N-methyl-2-pyrrolidone (NMP) in pattern formation. However, N-methyl-2-pyrrolidone is concerned about a load to environment and health hazards, in particular aspiration respiratory hazards. In particular, N-methyl-2-pyrrolidone is included in SVHC (Substance of Very High Concern) in the European REACH (Registration, Evaluation, Authorization and Restriction of Chemicals) Regulation. From these facts, N-methyl-2-pyrrolidone is a solvent which should be avoided as much as possible. Further, in Patent Document 3, there is no specific description about the resolution performance in pattern formation.

In Patent Document 4, there is disclosed an example of a patterning process of a photosensitive resin composition using a material utilizing a polyamic acid which is a precursor of a polyimide, for example, a resin in which an ester bond is introduced into a carboxyl group of the polyamic acid, and heating to be carried out to obtain an objective polyimide film after formation of the film can be carried out at a relatively low temperature of 250° C. However, the solvent of the photosensitive resin composition is N-methyl-2-pyrrolidone, and an organic solvent of N-methyl-2-pyrrolidone is used in the development. As mentioned above, use of an organic solvent of N-methyl-2-pyrrolidone for the developing solution shall be avoided as much as possible. Also, there is no disclosure about specific resolution performance in this Patent Document.

Also, there is Patent Document 5 with regard to the patterning formation of a negative type photosensitive resin composition using a precursor of the polyimide. Although the solvent of the photosensitive resin composition is N-methyl-2-pyrrolidone-based, cyclopentanone is used for development of the photosensitive resin composition. With regard to the resolution performance, it is specifically disclosed and it has been disclosed that an aspect ratio of 1 or more can be accomplished. However, this aspect ratio is not the ratio of the finished film thickness or the height of the pattern to the pattern dimension, but represents the ratio of the film thickness to the dimension after coating and drying, and this resolution performance is not a practical value and an improvement is required. Although it is preferable to use a versatile organic solvent such as cyclopentanone for the developing solution, when the organic solvent is used, the disadvantage that the pattern shape immediately after development tends to be an overhang profile due to swelling of the film during the development is occasionally exposes.

On the other hand, the photosensitive resin composition proposed in Patent Document 6 uses a base resin that has already been imidized, which is constructed in consideration of low-temperature curing. The solvent of the composition is cyclopentanone and an aqueous alkaline solution is used in the developing process, so that use of N-methyl-2-pyrrolidone can be avoided. However, the resolution performance still needs to be improved. That is, the pattern formation using the photosensitive resin composition disclosed in Patent Document 6 is carried out with an ultrathin film, and a size of the pattern to be resolved is also large. This insufficiency of the resolution performance is due to poor solubility of the polyimide resin which is a base resin disclosed in Patent Document 6 in an aqueous alkaline solution used for the developing solution. It is a key to heighten the solubility in the developing solution for improving the resolution performance in the pattern formation.

Actually, as the resolution performance of the photosensitive insulating material in the high density packaging technology such as a three-dimensional lamination which has been required in recent years, the aspect ratio (finished film thickness (or height of the pattern)/dimension of the pattern) of the formed pattern is required to be 1 or more and 2 or so. That is, when the desired finished film thickness or height of the pattern is 10 μm, a dimension of 10 μm or less or a pattern of near 5 μm must be formed.

Further, there is Patent Document 7 with regard to the patterning formation of a negative type photosensitive resin composition using a precursor of a polyimide. A solvent of the photosensitive resin composition is γ-butyrolactone, and the developing solution is an aqueous alkaline solution. In this patterning process, an alkali-soluble group such as an acid group, i.e., a carboxyl group is made to contain in the resin of the polyimide precursor, whereby solubility is improved in an aqueous alkaline solution which is a developing solution and pattern formation by developing with the aqueous alkaline solution is carried out. Development with an aqueous alkaline solution has the advantages that it is difficult to cause swelling, the pattern shape is good, and the resolution performance is also improved. However, when the alkali-soluble group is made to contain in the resin, it exerts an advantage in improving the resolution, but after curing, it cannot eliminate the problem that the resistance to a peeling liquid having extremely strong alkalinity which is used for peeling the resist pattern for plating to be used in applying a metal wiring is impaired. In order to form an excellent protective insulating film, it is necessary to completely seal the alkali-soluble group present on the resin or completely remove it from the system.

Thus, as the density and integration of the chips will increase in future, the miniaturization of the pattern in the rewiring technology of the insulating protective film will be more and more advanced, so that in the photosensitive resin composition using a polymer having a polyimide precursor structural unit, it has been strongly desired to develop a composition capable of realizing high resolution without impairing excellent characteristics such as the pattern of the polyimide obtained by heating and the mechanical strength, adhesiveness, and the like of the protective film.

It has been also strongly desired that the insulating protective film subjected to pattern formation and curing has heat resistance in various processes and resistance to various chemicals to be variously used.

That is, rapid development of a photosensitive resin composition having all these features without lacking any of them has been earnestly desired.

PRIOR ART DOCUMENTS

Patent Documents

Patent Document 1: Japanese Patent Laid-Open Publication No. Sho. 49-115541
Patent Document 2: Japanese Patent Laid-Open Publication No. Sho. 55-45746
Patent Document 3: Japanese Patent No. 3,232,022
Patent Document 4: Japanese Patent Laid-Open Publication No. 2005-49504
Patent Document 5: WO 2013/168675
Patent Document 6: Japanese Patent No. 5,417,623
Patent Document 7: Japanese Patent No. 3,627,488

SUMMARY OF INVENTION

Technical Problem

The present invention has been accomplished in view of the circumstance, and an object thereof is to provide a polymer of a polyimide precursor which is soluble in an aqueous alkaline solution and is capable of using as a base resin of a positive type photosensitive resin composition and a negative type photosensitive resin composition capable of forming a fine pattern and obtaining high resolution.

Also, another object thereof is to provide a positive type photosensitive resin composition and a negative type photosensitive resin composition each of which uses the polymer of a polyimide precursor which is soluble in an aqueous alkaline solution, excellent in resolution and capable of forming a fine pattern in pattern formation.

Solution to Problem

In order to solve the problems, the present invention is to provide a polymer of a polyimide precursor which comprises a structural unit represented by the following general formula (1),

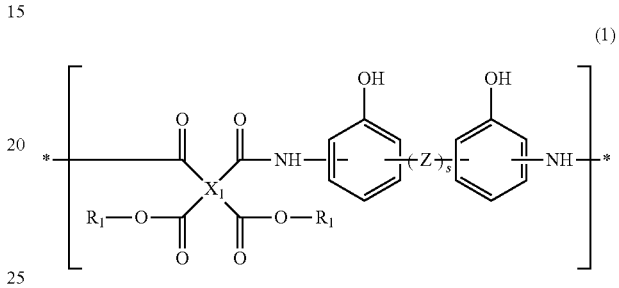

wherein, $X_1$ represents a tetravalent organic group; $R_1$s each represent a group represented by the following general formula (2); a repeating number "s" represents 0 or 1; Z represents a divalent bonding group, and when "s" is 0, two aromatic rings in the formula directly bond without via a bonding group, $(Y_1)_n(Rf)_k$ (2)

wherein, the dotted line represents a bond; $Y_1$ represents a (k+1) valent organic group; Rf represents a linear, branched, or cyclic alkyl group having 1 to 20 carbon atoms or an aromatic group in which a part of or whole of hydrogen atom(s) is/are substituted by a fluorine atom(s); "k" represents 1, 2, or 3; and a repeating number "n" represents 0 or 1.

Such a polymer of a polyimide precursor is soluble in a versatile and safe organic solvent as a solvent of a composition, and can be used as a base resin of a photosensitive resin composition. In addition, as long as it is such a polymer of a polyimide precursor, it can be used as a base resin of a photosensitive resin composition which is soluble in an alkaline aqueous solution and is capable of forming a fine pattern and can obtain high resolution.

At this time, Z in the general formula (1) is preferably a divalent group represented by the following general formula (3) or (4),

wherein, the dotted line represents a bond.

When such a polymer of a polyimide precursor is used as a base resin of a photosensitive resin composition, in pattern formation, solubility in the aqueous alkaline solution of the developing solution can be increased.

Also, at this time, $Y_1$ in the general formula (2) is preferably a linear or branched divalent organic group having 1 to 6 carbon atoms.

When such a material is employed, the effects of the present invention can be sufficiently obtained.

Further, at this time, $R_1$ in the general formula (1) is preferably an organic group selected from either of the following general formulae (5), (6), (7), and (8),

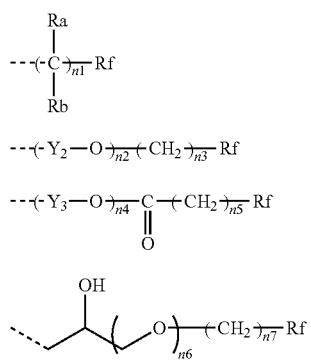

wherein, the dotted line represents a bond; Rf represents the same meaning as before; Ra and Rb each represent a hydrogen atom or an alkyl group having 1 to 3 carbon atoms; $Y_2$ and $Y_3$ each represent a linear or branched alkylene group having 1 to 6 carbon atoms; a repeating number "n1" represents an integer of 0 to 6; a repeating number "n2" represents an integer of 1 to 6; a repeating number "n3" represents an integer of 0 to 6; a repeating number "n4" represents an integer of 1 to 6; a repeating number "n5" represents an integer of 0 to 6; a repeating number "n6" represents 0 or 1; and a repeating number "n7" represents an integer of 0 to 6.

$R_1$ is preferably such a group from the viewpoint of easy availability of a compound serving as a raw material for introducing $R_1$.

Further, $R_1$ in the general formula (1) is preferably a group represented by the following general formula (5-1),

wherein, the dotted line represents a bond; and Rf represents the same meaning as before.

When such a group is employed, stabilization of the molecule can be done by separating the alkyl group substituted by a fluorine atom(s) and the ester portion.

In addition, the polymer of a polyimide precursor preferably further contains at least one of the structural units represented by the following general formulae (9) to (13),

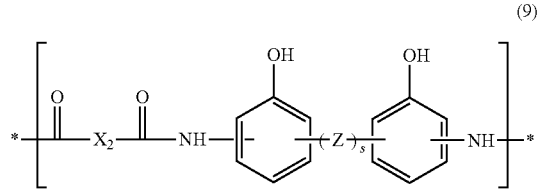

wherein, $X_2$ represents a divalent organic group; and the repeating number "s" and Z represent the same meanings as before,

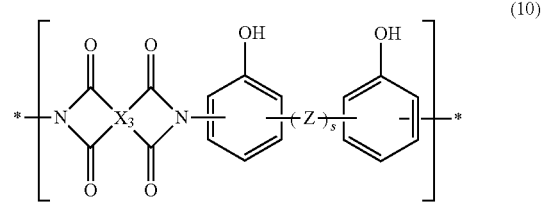

wherein, $X_3$ represents a tetravalent organic group which is the same as or different from the $X_1$; and the repeating number "s" and Z represent the same meanings as before,

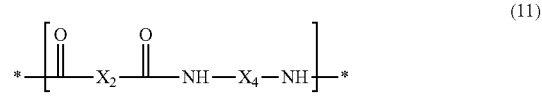

wherein, $X_2$ represents the same meaning as before; and $X_4$ represents a divalent organic group,

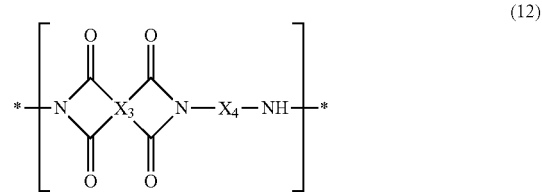

wherein, $X_3$ and $X_4$ represent the same meanings as before,

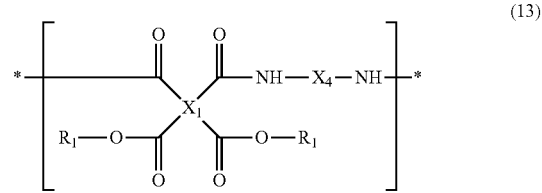

wherein, $X_1$, $X_4$, and $R_1$ represent the same meanings as before.

When the polymer of a polyimide precursor containing one kind or more of either of the structural units represented by the general formulae (9) and (10) is employed, in pattern formation of the photosensitive resin composition using the polymer as a base resin, it is preferable since solubility in an aqueous alkaline solution of the developing solution can be easily controlled.

When the polymer of a polyimide precursor containing one kind or more of either of the structural units represented by the general formula (9), (10), (11), and (12) is employed, the polyimide structure and the polyamide structure contained in the polymer can increase the mechanical strength and the adhesion to the substrate of the film obtained by pattern formation, so that it is preferable. In addition, these structural units are preferable because it is not necessary to perform a ring-closing reaction in post-curing and it is possible to lower the curing reaction temperature relatively.

Also, on the other hand, when the polymer of a polyimide precursor containing the structural unit represented by the general formula (13) is employed, the polymer is more easily dissolved in a versatile and safe organic solvent as a solvent of the composition, and it can be preferably used for the base resin of the photosensitive resin composition.

Further, it is preferable that the polymer of a polyimide precursor further contains either one or both of the structural units represented by the following general formulae (14) and (15),

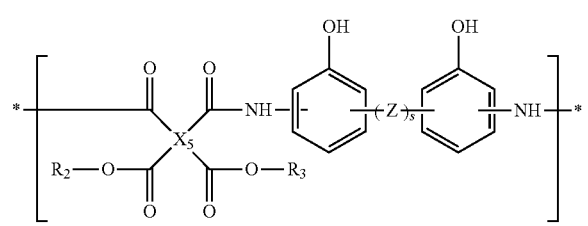

(14)

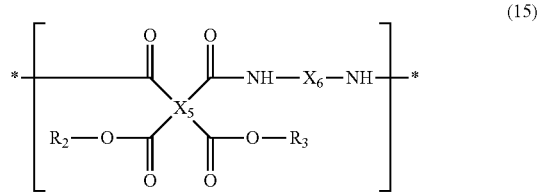

(15)

wherein, $X_5$ represents a tetravalent organic group which is the same as or different from the $X_1$; $X_6$ represents a divalent organic group; the repeating number "s" and Z represent the same meanings as before; $R_2$ and $R_3$ each independently represent a hydrogen atom, a linear, branched or cyclic alkyl group having 1 to 6 carbon atoms or an organic group represented by the following general formula (16), and either one of or both of $R_2$ and $R_3$ is/are an organic group represented by the following general formula (16),

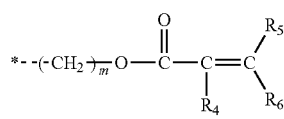

(16)

wherein, the dotted line represents a bond; $R_4$ represents a hydrogen atom or an organic group having 1 to 3 carbon atoms; $R_5$ and $R_6$ each independently represent a hydrogen atom or an organic group having 1 to 3 carbon atoms; and a repeating number "m" is an integer of 2 to 10.

When such a material is employed, since it has a polymerizable unsaturated bonding group in the structural unit, by combining with a photoradical initiator mentioned later, radical polymerization proceeds using the radicals generated in the exposed portion in pattern formation as initiators, which has characteristics that it becomes insoluble in a developing solution, so that a negative type photosensitive resin composition can be provided without newly adding a crosslinking agent.

Also, when the polymer of a polyimide precursor containing the structural unit represented by the general formula (14) is employed, in pattern formation of the photosensitive resin composition using the polymer as a base resin, it is preferable since solubility in an aqueous alkaline solution of the developing solution can be easily controlled.

Moreover, in the present invention, it is provided a positive type photosensitive resin composition which comprises (A) the polymer of a polyimide precursor mentioned above,
(B) a photosensitive agent which generates an acid by light to increase a dissolution rate in an aqueous alkaline solution and is a compound having a quinonediazide structure, and
(D) a solvent.

Thus, by using the photosensitive agent of the component (B), in pattern formation, the exposed portion becomes soluble by increasing a dissolution rate to a developing solution of an aqueous alkaline solution, and in the unexposed portion, it does not dissolve due to dissolution inhibiting property in alkali by the photosensitive agent to give a positive image. In the polymer of a polyimide precursor containing the structural unit represented by the general formula (1), the polymer per se shows alkali solubility, so that residues such as scum and the pattern deterioration such as trailing difficulty occur at the bottom of the opened pattern, which act dominantly for fine pattern formation.

At this time, the positive type photosensitive resin composition preferably further contains (C) at least one of a crosslinking agent(s) selected from an amino condensate modified by formaldehyde or formaldehyde-alcohol, a phenol compound having two or more methylol groups or alkoxymethylol groups in one molecule in average, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

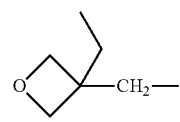

(C-1)

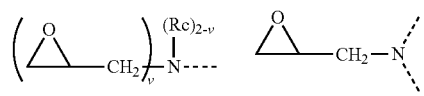

(C-2)

wherein, the dotted line represents a bond; Rc represents a linear, branched or cyclic alkyl group having 1 to 6 carbon atoms; and "v" represents 1 or 2.

When the positive type photosensitive resin composition containing such a component (C) is employed, a crosslinking reaction can be caused in post-curing after the pattern formation to further increase the strength of the cured product.

At this time, it is also preferable that the positive type photosensitive resin composition further contains (E) a compound which generates an acid or a radical by heat.

By containing such a component (E), crosslinking and curing reaction can be further promoted, and the mechanical strength, chemical resistance, adhesiveness and the like of the obtained pattern or film can be further improved.

Also, in the present invention, it is provided a negative type photosensitive resin composition which comprises (A') a polymer of a polyimide precursor containing either one of or both of the structural units represented by the general formula (14) and (15) among the polymer of a polyimide precursor mentioned above,
(B') a photoradical initiator, and
(D) a solvent.

As mentioned above, the polymer of a polyimide precursor of the component (A') contains a polymerizable unsaturated bonding group in the polymer molecule, so that a negative type photosensitive resin composition can be obtained by the combination of such a polymer and a photoradical initiator.

Moreover, in the present invention, it is provided a negative type photosensitive resin composition which comprises
(A') a polymer of a polyimide precursor containing at least one of the structural units represented by the general formula (14) and (15) among the polymer of a polyimide precursor mentioned above,
(B') a photoradical initiator,
(C') a crosslinking agent having two or more photopolymerizable unsaturated bonding groups in one molecule, and
(D) a solvent.

Here, in the polymer of a polyimide precursor of the component (A'), it is assumed that the polymerizable or crosslinkable structure in the polymer molecule is not sufficient. Therefore, it is possible to form a negative type photosensitive resin composition by supplementing a crosslinking agent having a photopolymerizable unsaturated bonding group. On the other hand, the polymer of a polyimide precursor of the component (A') further contains, in addition to the structural unit represented by the general formula (1), either one kind or both of the structural units represented by the general formulae (14) and (15), and a polymerizable unsaturated bonding group is already present in the molecule of the polymer, but a crosslinking agent may be newly added.

Further, in the present invention, it is provided a negative type photosensitive resin composition which comprises
(A") the polymer of a polyimide precursor containing the structural unit represented by the general formula (1), or a polymer of a polyimide precursor further containing, in addition to the structural unit represented by the general formula (1), at least one of the structural units represented by the general formula (9) to (13):
(B") a photoacid generator,
(C) at least one of a crosslinking agent(s) selected from an amino condensate modified by formaldehyde or formaldehyde-alcohol, a phenol compound having two or more methylol groups or alkoxymethylol groups in one molecule in average, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

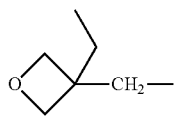

(C-1)

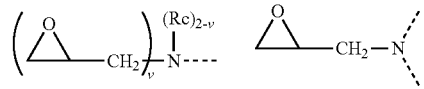

(C-2)

wherein, the dotted line represents a bond; Rc represents a linear, branched or cyclic alkyl group having 1 to 6 carbon atoms; and "v" represents 1 or 2, and
(D) a solvent.

Thus, by using the photoacid generator of the component (B"), in the pattern formation, an acid is generated in the exposed portion, and a crosslinking group of the crosslinking agent of the added component (C) and a crosslinking reaction point of the polymer are crosslinked whereby a composition for obtaining a negative image which is insoluble in a developing solution can be prepared.

Further, in the present invention, there is provided a patterning process which comprises
(1) coating a positive type photosensitive resin composition on a substrate to form a film of a photosensitive material,
(2) then, after heat treatment, exposing the film of the photosensitive material by a high energy beam with a wavelength of 190 to 500 nm or an electron beam through a photomask, and
(3) developing the film using a developing solution of an aqueous alkaline solution.

Thus, in the positive type photosensitive resin composition of the present invention, it is possible to carry out development by an alkali using an aqueous alkaline solution.

Furthermore, in the present invention, there is provided a patterning process which comprises
(I) coating the negative type photosensitive resin composition onto a substrate to form a film of a photosensitive material,
(II) then, after heat treatment, exposing the film of the photosensitive material by a high energy beam with a wavelength of 190 to 500 nm or an electron beam through a photomask, and
(III) developing the film using a developing solution of an aqueous alkaline solution.

The polymer of a polyimide precursor which is a base resin of the negative type photosensitive resin composition according to the present invention contains the structural unit represented by the general formula (1), so that it is possible to carry out development by an alkali using an aqueous alkaline solution. Also, such a patterning process is particularly suitable for a negative type photosensitive resin composition using a polymer having a polymerizable unsaturated bonding group as a base resin.

At this time, it is preferable to carry out heating after the exposure between the exposing and the developing.

In the case of the polymer of a polyimide precursor, in particular, the negative type photosensitive resin composition contains a polymer of a polyimide precursor which further contains, in addition to the structural unit represented by the general formula (1), either one of or both of the structural units represented by the general formulae (14) and (15), by subjecting to heating (post-exposure baking (PEB)) after the exposure, a crosslinking reaction between the crosslinking group of the crosslinking agent and the crosslinking reaction point of the polymer can be promoted using an acid generated from the photoacid generator by exposure as a catalyst.

Moreover, in the present invention, there is provided a method for forming a cured film which comprises heating and post-curing the film subjected to the pattern formation obtained by the patterning process at a temperature of 100 to 300° C.

The polymer of a polyimide precursor of the present invention contains the structural unit represented by the general formula (1) so that it is soluble in an alkali developing solution, and easily soluble in a versatile and safe organic solvent by having an Rf group such as a perfluoroalkyl group and the like at the terminal of the substituent, and as a result, a composition using the versatile and safe organic solvent can be prepared. However, in the post-curing and heating, an imide ring-closing reaction occurs due to the structural unit of the polyimide precursor in the polymer of a polyimide precursor, and the Rf group such as a perfluoroalkyl group and the like is split off and removed from the system. Accordingly, the cured film after the post-curing becomes an extremely stable film comprising a polyimide resin, so that a cured film in which chemical resistance is improved, in particular, extremely improved in resistance to an alkaline peeling solution having extremely strong alkalinity which is used for peeling a resist pattern for plating to be used in the process of applying a metal wiring, can be formed. These cured films obtained by having a pattern can be made an excellent protective film for electric and electronic parts, or an insulating protective film.

Further, in the present invention, there is provided an interlayer insulating film comprising a cured film in which the positive type photosensitive resin composition or the negative type photosensitive resin composition is cured.

Moreover, in the present invention, there is provided a surface protective film comprising a cured film in which the positive type photosensitive resin composition or the negative type photosensitive resin composition is cured.

when such an interlayer insulating film or a surface protective film is employed, it can be suitably used as a protective film for electric and electronic parts, a semiconductor device and the like.

Furthermore, in the present invention, there are provided electronic parts having the interlayer insulating film or the surface protective film.

When such electronic parts are employed, the resulting materials become materials excellent in reliability.

Advantageous Effects of Invention

According to the present invention, it is possible to provide a polymer of a polyimide precursor which is soluble in a versatile and safe organic solvent as a solvent of a composition and which is suitable as a base resin of a photosensitive resin composition. In addition, the polymer of a polyimide precursor of the present invention is soluble in an aqueous alkaline solution, so that it is possible to carry out development using an aqueous alkaline solution in the pattern formation using a photosensitive resin composition containing such a polymer of a polyimide precursor, residues such as scum and the pattern deterioration such as trailing can be suppressed at the bottom of the opened pattern, and it is possible to resolve patterns with fine and high resolution.

Further, according to the present invention, by post-curing the film having the obtained pattern, a protective film excellent in chemical resistance can be provided since the function of the organic solvent solubility which worked predominantly in the pattern formation is removed from the system by the imide ring-closing reaction and a stable polyimide film is provided. In addition, the resulting film is a protective film excellent in mechanical strength, substrate adhesiveness, electric characteristics, and reliability which are characteristics of a polyimide.

DESCRIPTION OF EMBODIMENTS

It has been demanded to provide a polymer of a polyimide precursor which is soluble in a versatile and safe organic solvent as a solvent for a composition and can be used as a base resin of a photosensitive resin composition capable of developing with an alkali as mentioned above.

The present inventors have intensively studied to accomplish the objects, and as a result, they have found that when a polymer having a structural unit of a polyimide precursor (a polymer of a polyimide precursor) represented by the following general formula (1) is used as a base resin of a photosensitive resin composition, the polymer is useful for constituting the composition since it is easily soluble in a versatile and safe organic solvent, and the polymer can be utilized for both a positive type photosensitive resin composition capable of developing with an aqueous alkaline solution and a negative type photosensitive resin composition capable of developing with an aqueous alkaline solution since it is soluble in a developing solution comprising an aqueous alkaline solution, and the pattern obtained by using these photosensitive resin compositions becomes fine and has good pattern shape.

In addition, they have found that the polymer having the structural unit of the polyimide precursor (the polymer of a polyimide precursor) represented by the following general formula (1) is a resin soluble in an aqueous alkaline solution, and a film obtained by subjecting to pattern formation and heating by using the photosensitive resin composition containing the polymer is excellent in resistance to a strongly alkaline plating peeling liquid.

Further, they have found that the protective film obtained by using the photosensitive resin composition containing the polymer having the structural unit of the polyimide precursor as a base resin, and subjecting to pattern formation and heating is excellent in mechanical strength and adhesiveness. That is, they have found that the cured film obtained by having a pattern which has been formed by using the photosensitive resin composition containing the polymer having the structural unit of the polyimide precursor as a base resin is excellent as a protective film for electric and electronic parts, and insulating protective film, whereby they have accomplished the present invention.

That is, the present invention is directed to a polymer of a polyimide precursor containing a structural unit represented by the following general formula (1) (hereinafter also referred to as the structural unit (1)),

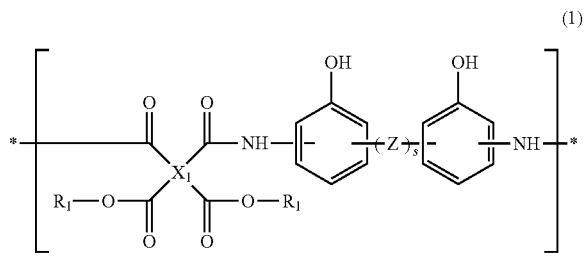

(1)

wherein, $X_1$ represents a tetravalent organic group; $R_1$s each represent a group represented by the following general formula (2); a repeating number "s" represents 0 or 1; and Z represents a divalent bonding group, and when "s" is 0, two aromatic rings in the formula directly bond without via a bonding group, $(Y_1)_n(Rf)_k$ (2)

wherein, the dotted line represents a bond; $Y_1$ represents a (k+1) valent organic group; Rf represents a linear, branched, or cyclic alkyl group having 1 to 20 carbon atoms or an aromatic group in which a part of or whole of hydrogen atom(s) is/are substituted by a fluorine atom(s); "k" represents 1, 2, or 3; and a repeating number "n" represents 0 or 1.

In the following, details of the present invention are explained, but the present invention is not limited by these.

[Polymer of Polyimide Precursor]

The polymer of a polyimide precursor of the present invention contains the structural unit represented by the following general formula (1),

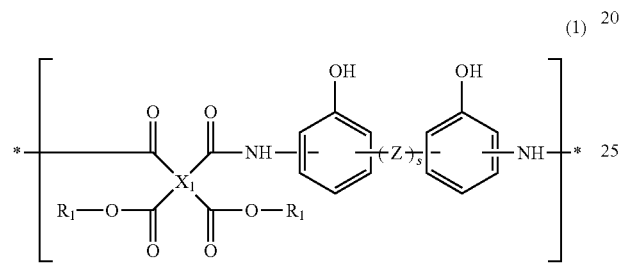
(1)

wherein, $X_1$ represents a tetravalent organic group; $R_1$s each represent a group represented by the following general formula (2); a repeating number "s" represents 0 or 1; and Z represents a divalent bonding group, and when "s" is 0, two aromatic rings in the formula bond directly without via a bonding group, $(Y_1)_n(Rf)_k$ (2)

wherein, the dotted line represents a bond; $Y_1$ represents a (k+1) valent organic group; Rf represents a linear, branched, or cyclic alkyl group having 1 to 20 carbon atoms or an aromatic group in which a part of or whole of hydrogen atom(s) is/are substituted by a fluorine atom(s); "k" represents 1, 2, or 3; and a repeating number "n" represents 0 or 1.

$X_1$ in the general formula (1) is a tetravalent organic group, and it is not limited as long as it is a tetravalent organic group. It is preferably a tetravalent organic group of an alicyclic aliphatic group having 4 to 40 carbon atoms or an aromatic group, and more preferably a tetravalent organic group represented by the following formula (17). Also, the structure of $X_1$ may be one kind or a combination of two or more kinds,

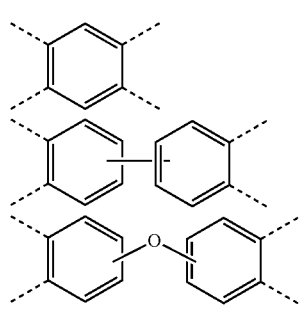
(17)

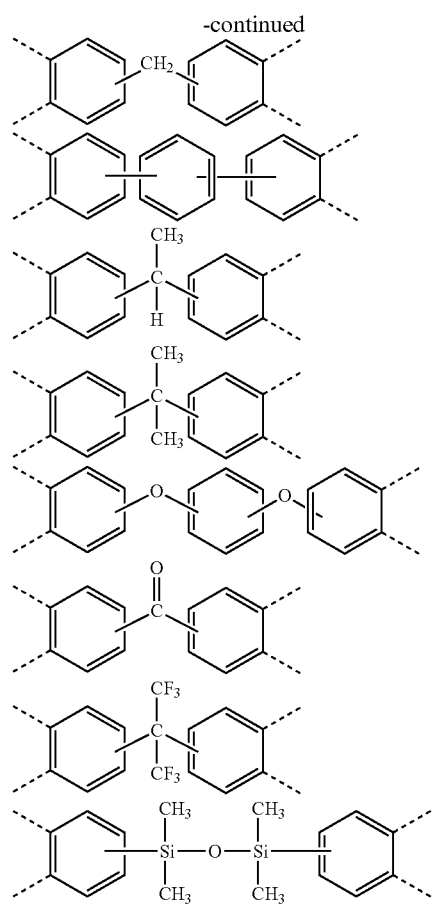

wherein, the dotted line represents a bond.

The repeating number "s" in the general formula (1) represents 0 or 1, and when "s" is 0, two aromatic rings in the general formula (1) bond directly without via the divalent bonding group Z.

On the other hand, when s=1, two aromatic rings in the general formula (1) bond via the divalent bonding group Z. Z is not limited as long as it is a divalent group. It is preferably a divalent organic group of an alicyclic aliphatic group having 4 to 40 carbon atoms or an aromatic group, more preferably a divalent bonding group represented by the following formula (18). In addition, the structure of Z may be one kind or a combination of two or more kinds.

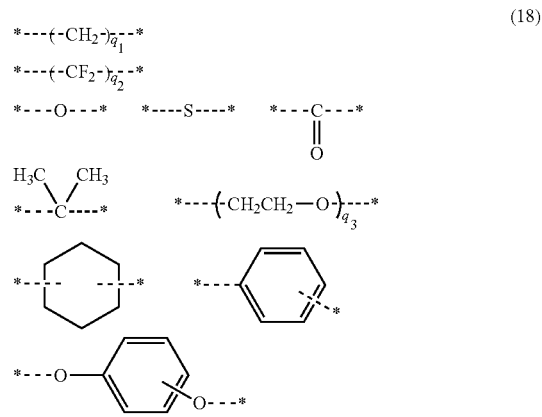
(18)

-continued

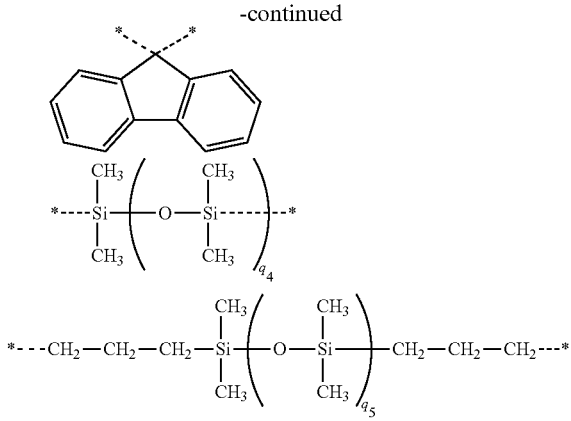

wherein, "$q_1$", "$q_2$", and "$q_3$" each represent an integer of 1 to 6; "$q_4$" and "$q_5$" each represent an integer of 1 to 10; and the dotted line represents a bond.

Particularly preferable divalent bonding group Z is a divalent group represented by the following general formula (3) or (4),

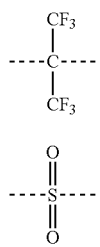

wherein, the dotted line represents a bond.

The structural unit represented by the general formula (1) is preferably the structural unit represented by the following general formula (1-1) when Z in the general formula (1) is the group represented by the formula (3), and preferably the structural unit represented by the following general formula (1-2) when Z in the general formula (1) is the group represented by the formula (4),

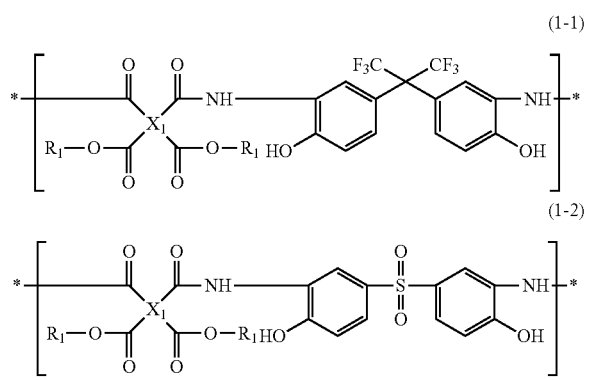

wherein, $X_1$ and $R_1$ represent the same meanings as before.

As in the general formula (1-1), when Z which is the divalent bonding group is a hexafluoropropylene group represented by the formula (3), and positioned at the p-position of the phenolic hydroxyl group, the acidity of the phenolic hydroxyl group is high since the hexafluoropropylene group is an electron attractive group, and solubility to a developing solution of an aqueous alkaline solution is improved so that it is preferable.

Similarly, as in the general formula (1-2), when Z which is the divalent bonding group is a sulfone group represented by the formula (4), and positioned at the p-position of the phenolic hydroxyl group, the acidity of the phenolic hydroxyl group is high since the sulfone group is also an electron attractive group, and solubility to a developing solution of an aqueous alkaline solution is improved so that it is preferable.

Next, $R_1$ in the general formula (1) is explained. $Y_1$ in the general formula (2) is preferably a linear or branched divalent organic group having 1 to 6 carbon atoms (for example, an alkylene group).

Further, it is preferable that $R_1$ in the general formula (1) is an organic group selected from either of the groups represented by the following formula (5), (6), (7) and (8),

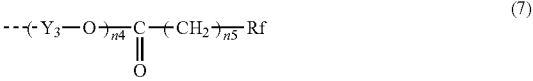

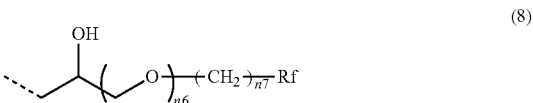

wherein, the dotted line represents a bond; Rf represents the same meaning as before; Ra and Rb each represent a hydrogen atom or an alkyl group having 1 to 3 carbon atoms; $Y_2$ and $Y_3$ each represent a linear or branched alkylene group having 1 to 6 carbon atoms; a repeating number "n1" represents an integer of 0 to 6; a repeating number "n2" represents an integer of 1 to 6; a repeating number "n3" represents an integer of 0 to 6; a repeating number "n4" represents an integer of 1 to 6; a repeating number "n5" represents an integer of 0 to 6; a repeating number "n6" represents 0 or 1; and a repeating number "n7" represents an integer of 0 to 6.

In addition, when $R_1$ in the general formula (1) is an organic group represented by the general formula (5), the organic group represented by the general formula (5) is particularly preferably a group represented by the following general formula (5-1). When such a group is employed, stabilization of the molecule can be done by separating the alkyl group substituted by a fluorine atom(s) and the ester portion,

wherein, the dotted line represents a bond; and Rf represents the same meaning as before.

In the organic group represented by the general formula (5), a preferably used organic group may be specifically mentioned the following groups, but it is not limited by these,

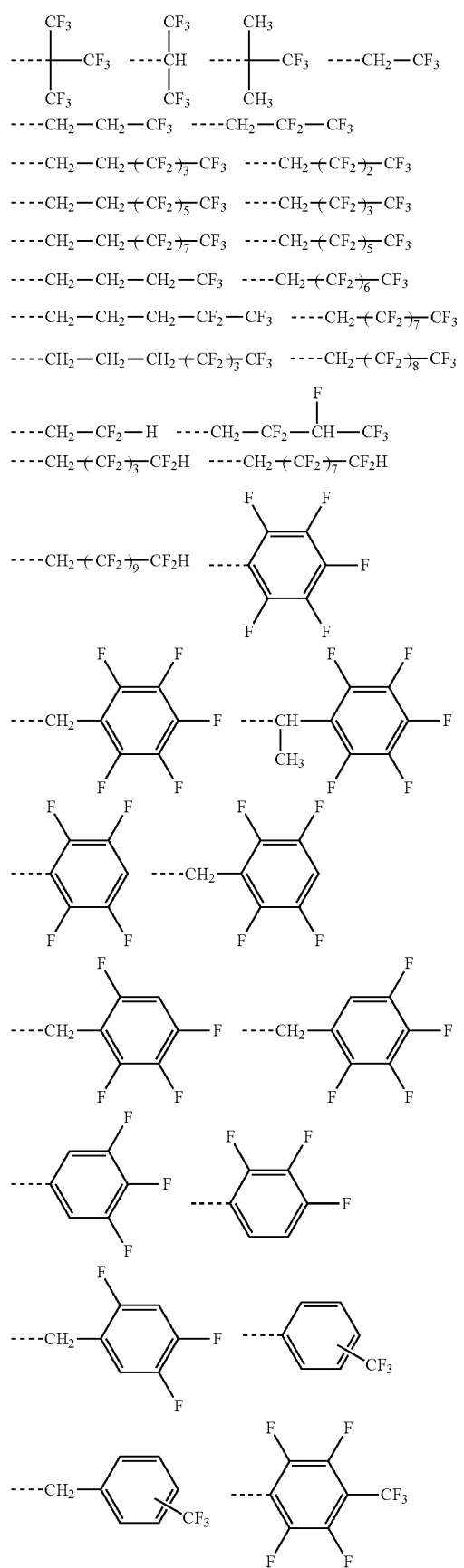
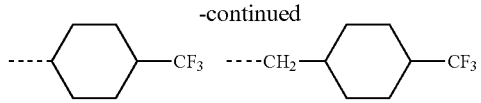
wherein, the dotted line represents a bond.
In the organic group represented by the general formula (6), a preferably used organic group may be specifically mentioned the following groups, but it is not limited by these,
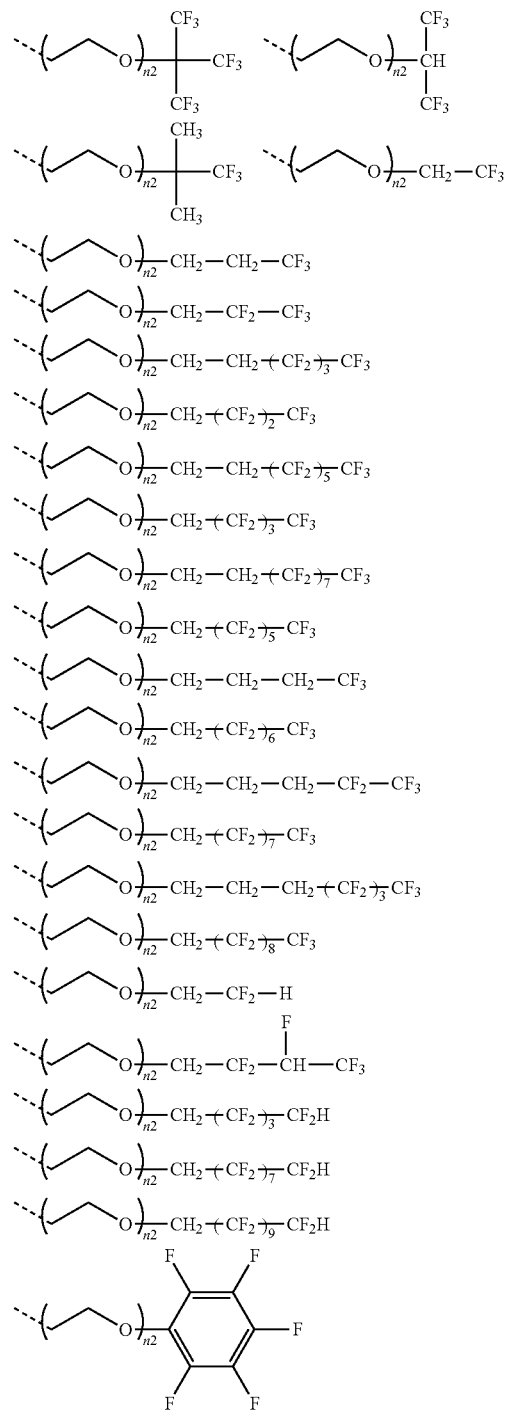

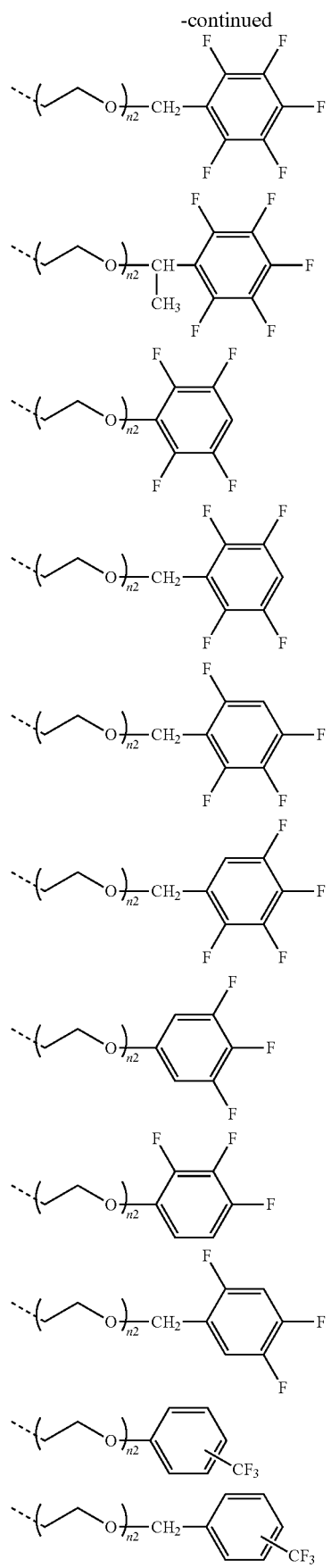
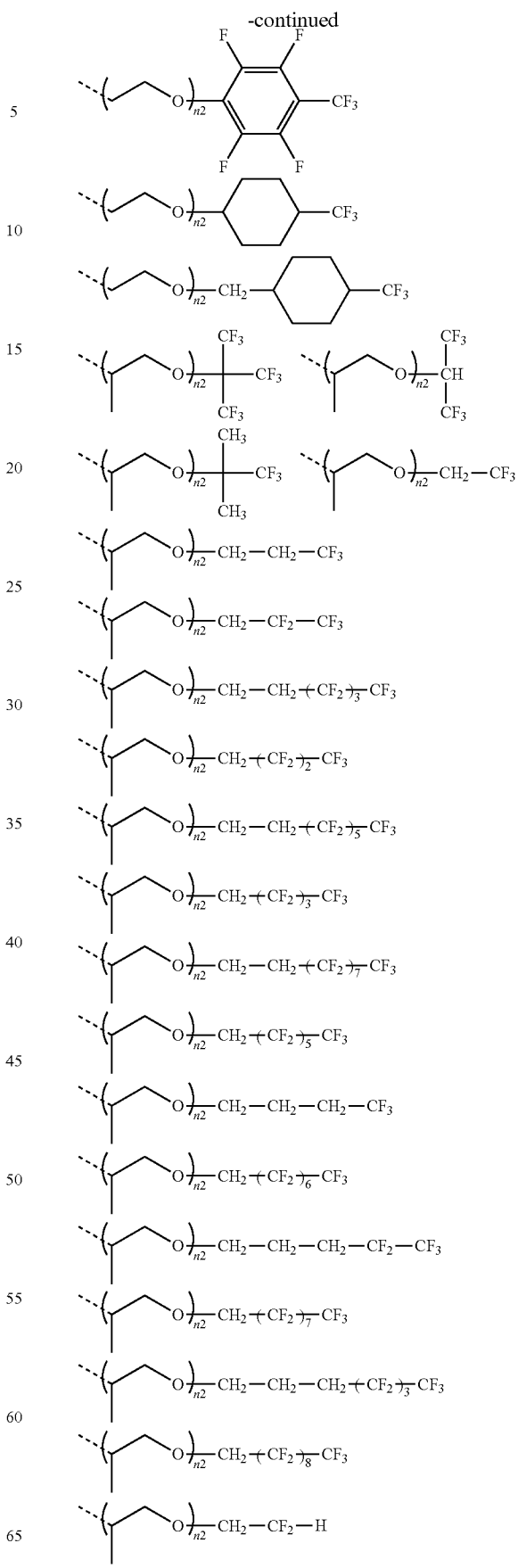

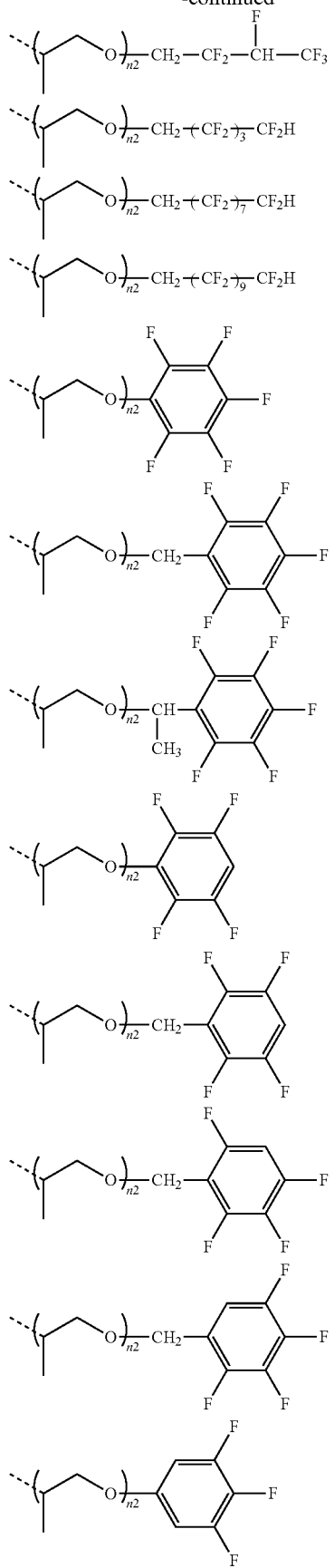
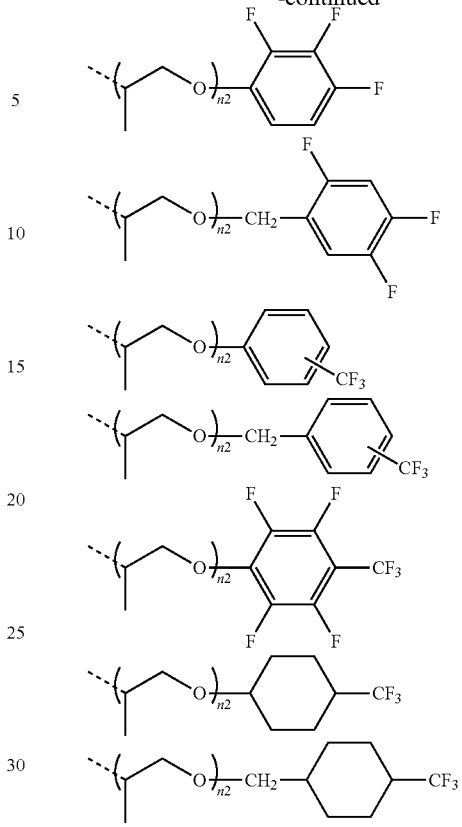
wherein, the dotted line represents a bond; and a repeating number "n2" represents an integer of 1 to 6, preferably an integer of 1 to 3, more preferably 1 or 2, and most preferably 1.
In the organic group represented by the general formula (7), a preferably used organic group may be specifically mentioned the following groups, but it is not limited by these,
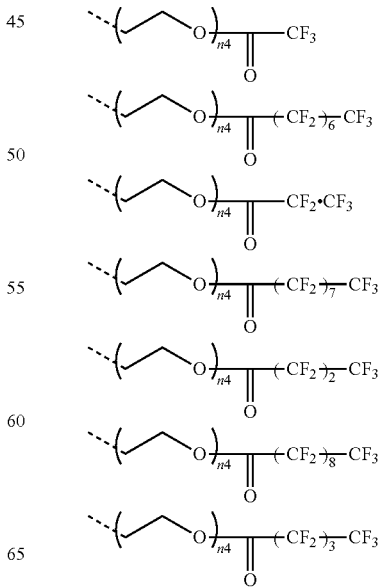

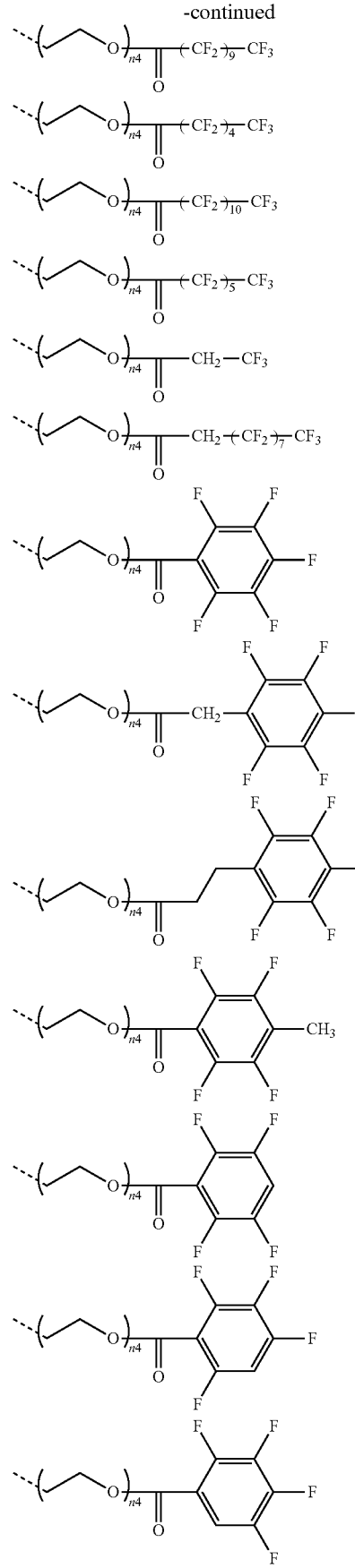

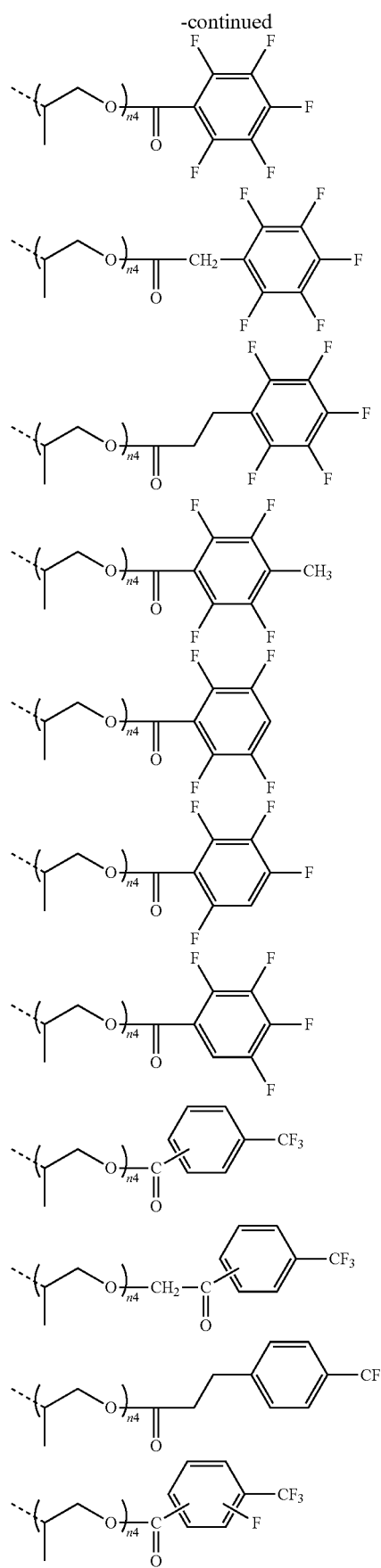
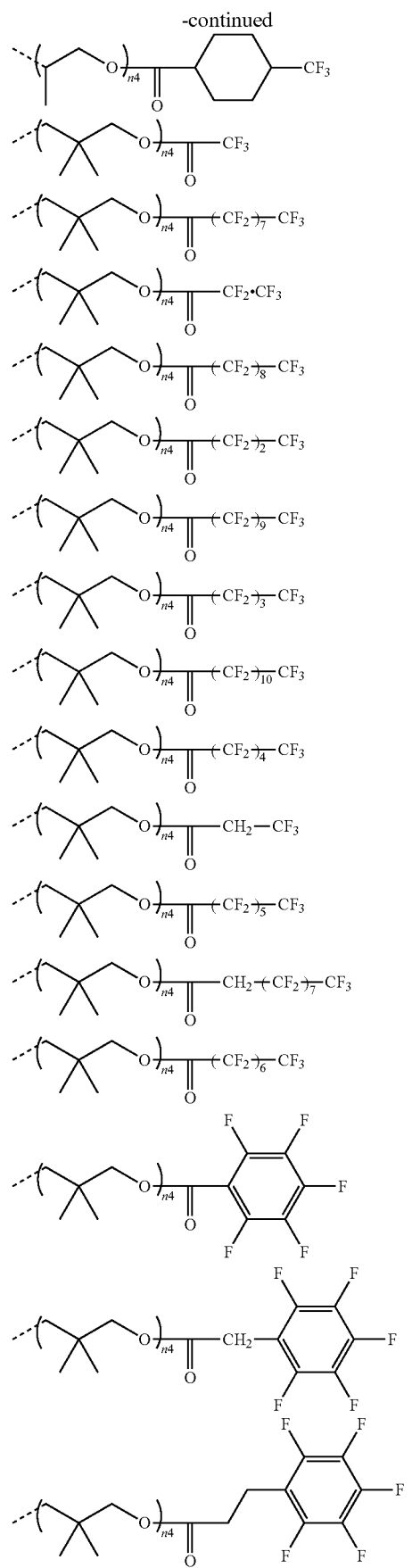

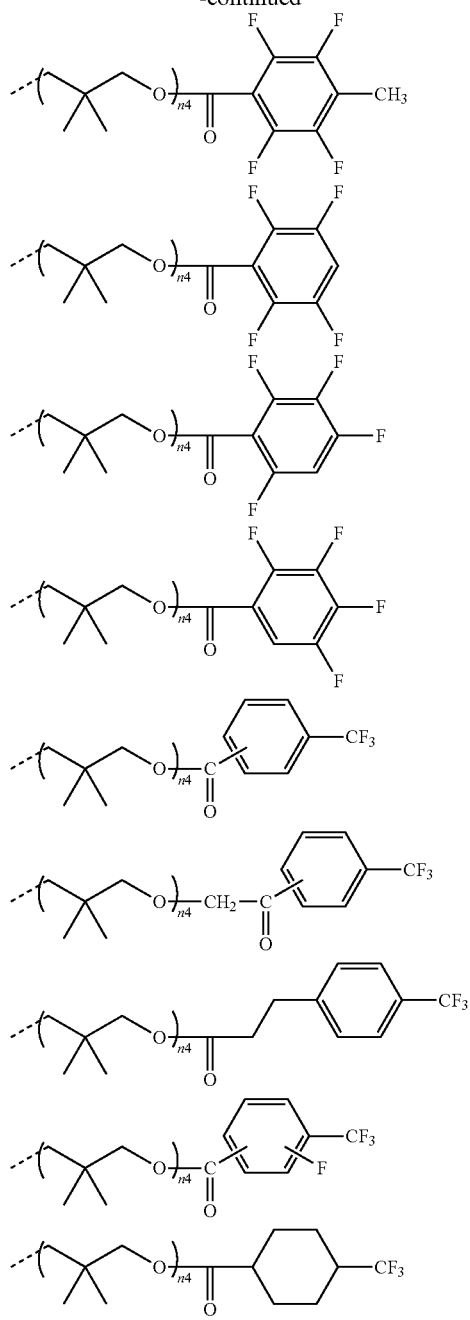

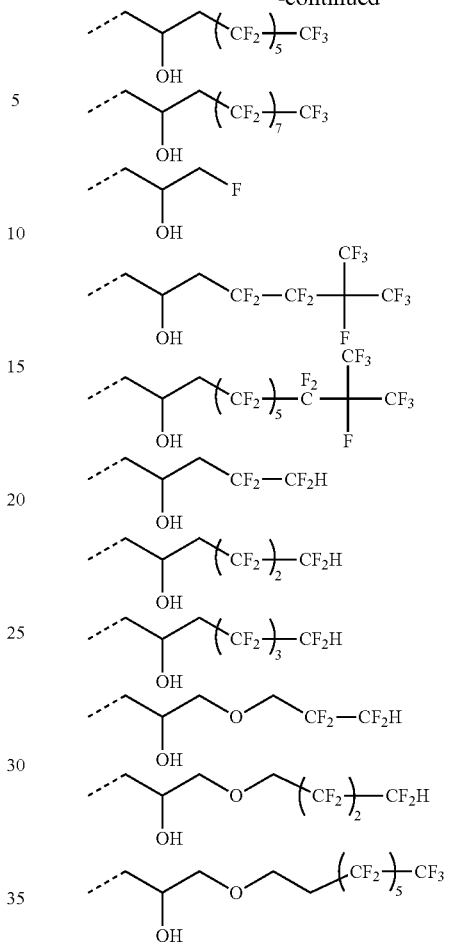

wherein, the dotted line represents a bond; a repeating number "n4" represents an integer of 1 to 6, preferably an integer of 1 to 3, more preferably 1 or 2, and most preferably 1.

In the organic group represented by the general formula (8), a preferably used organic group may be specifically mentioned the following groups, but it is not limited by these,

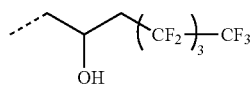

wherein, the dotted line represents a bond.

Here, after subjecting to patterning using the photosensitive resin composition which uses the polymer having the structural unit of the polyimide precursor of the present invention as a base resin, in the heating of post-curing, a ring-closing reaction by imidation proceeds at the structural unit of the polyimide precursor, and at this time, the introduced $R_1$ is split off and removed from the system, so that reduction in the film thickness of the formed film is observed. Accordingly, in order to minimize a reduction of the film thickness during post-curing, further preferable $R_1$ is that having a small molecular weight.

Also, the polymer of a polyimide precursor of the present invention preferably further contains, in addition to the structural unit represented by the general formula (1), the structural unit represented by the following general formula (9) (hereinafter also referred to as the structural unit (9)),

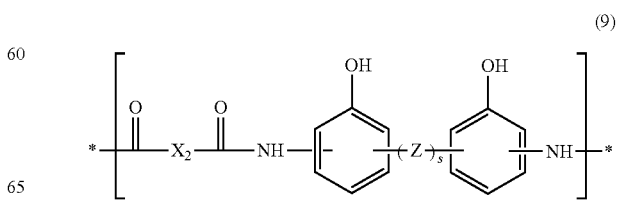

(9)

wherein, $X_2$ represents a divalent organic group; the repeating number "s" and Z represent the same meanings as before.

$X_2$ in the general formula (9) is a divalent organic group, and is not limited as long as it is a divalent organic group. It is preferably a divalent organic group with an aliphatic long-chain structure having 4 to 40 carbon atoms or an alicyclic aliphatic group or an aromatic group. It is more preferably a divalent organic group represented by the following formula (19). Also, the structure of $X_2$ may be one kind or a combination of two or more kinds,

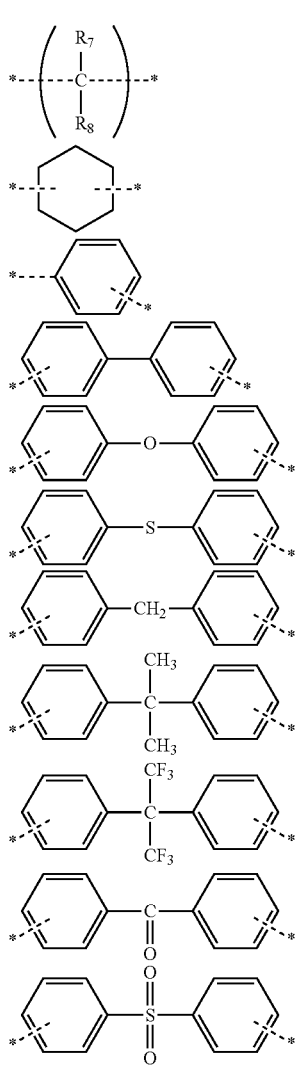

wherein, $R_7$ and $R_8$ each independently represent a hydrogen atom, a fluorine atom or an alkyl group having 1 to 6 carbon atoms; a repeating number "$q_6$" represents an integer of 1 to 30; and the dotted line represents a bond.

When $X_2$ in the general formula (9) is a divalent organic group with an aliphatic long-chain structure, it is preferable since mechanical strength, in particular, elongation of a cured film of the photosensitive resin composition using the polymer of a polyimide precursor of the present invention as a base resin becomes high.

Further, the polymer of a polyimide precursor of the present invention preferably further contains, in addition to the structural unit represented by the general formula (1), the structural unit represented by the following general formula (10) (hereinafter also referred to as the structural unit (10)),

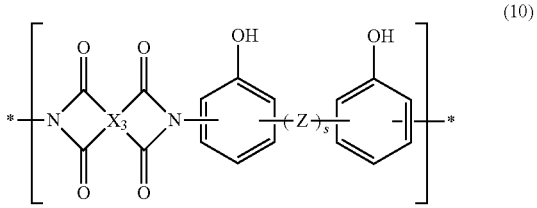

wherein, $X_3$ represents a tetravalent organic group which is the same as or different from the $X_1$; and the repeating number "s" and Z represent the same meanings as before.

$X_3$ in the general formula (10) is a tetravalent organic group, which may be the same as or different from the $X_1$, and is not limited as long as it is a tetravalent organic group. It is preferably a tetravalent organic group of an alicyclic aliphatic group having 4 to 40 carbon atoms or an aromatic group, more preferably a tetravalent organic group represented by the formula (17). Also, the structure of $X_3$ may be one kind or a combination of two or more kinds.

Moreover, the polymer of a polyimide precursor of the present invention preferably further contains, in addition to the structural unit represented by the general formula (1), the structural unit represented by the following general formula (11) (hereinafter also referred to as the structural unit (11)),

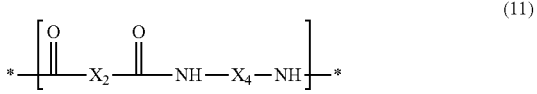

wherein, $X_2$ represents the same meaning as before; and $X_4$ represents a divalent organic group.

$X_4$ in the general formula (11) is a divalent organic group, is not limited as long as it is a divalent organic group, and is preferably a divalent organic group having 6 to 40 carbon atoms, and more preferably a cyclic organic group having 1 to 4 aromatic ring(s) having a substituent(s) or an alicyclic ring(s), or an aliphatic group having no cyclic structure or a siloxane group. More preferable $X_4$ may be mentioned a structure represented by the following formula (20) or (21). Also, the structure of $X_4$ may be one kind or a combination of two or more kinds,

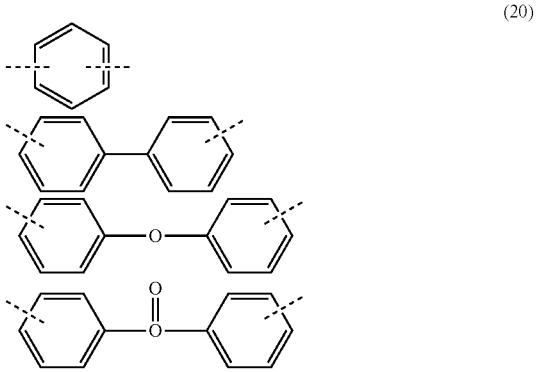

-continued

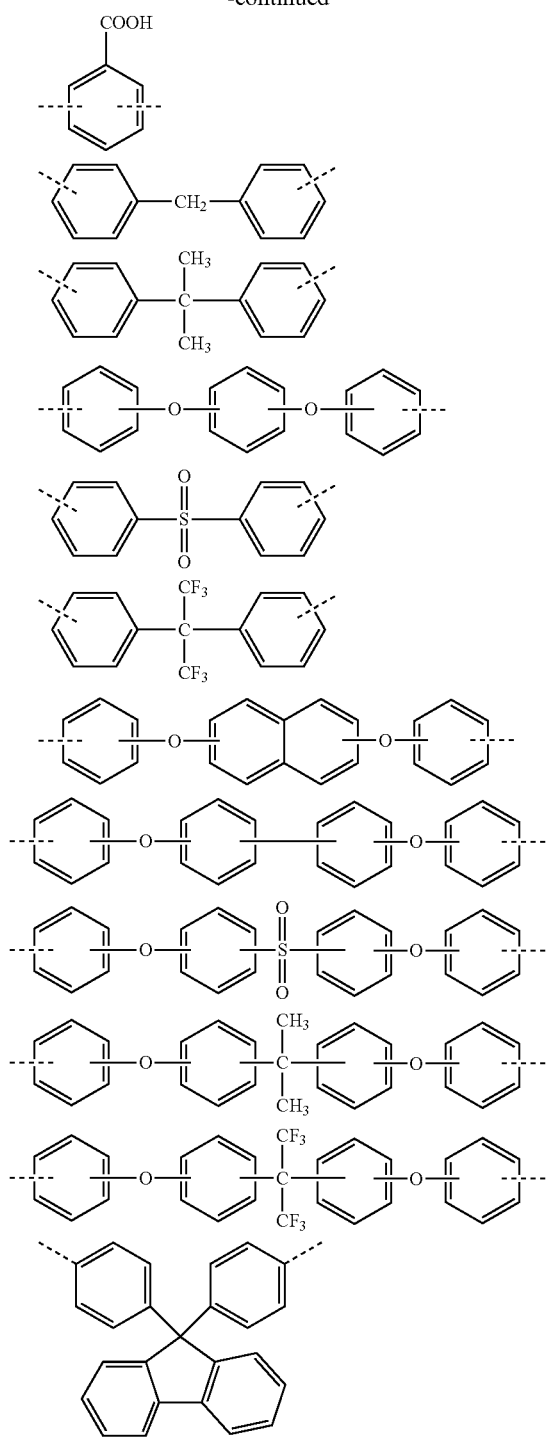

wherein, the dotted line represents a bond with an amino group.

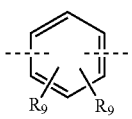 (21)

-continued

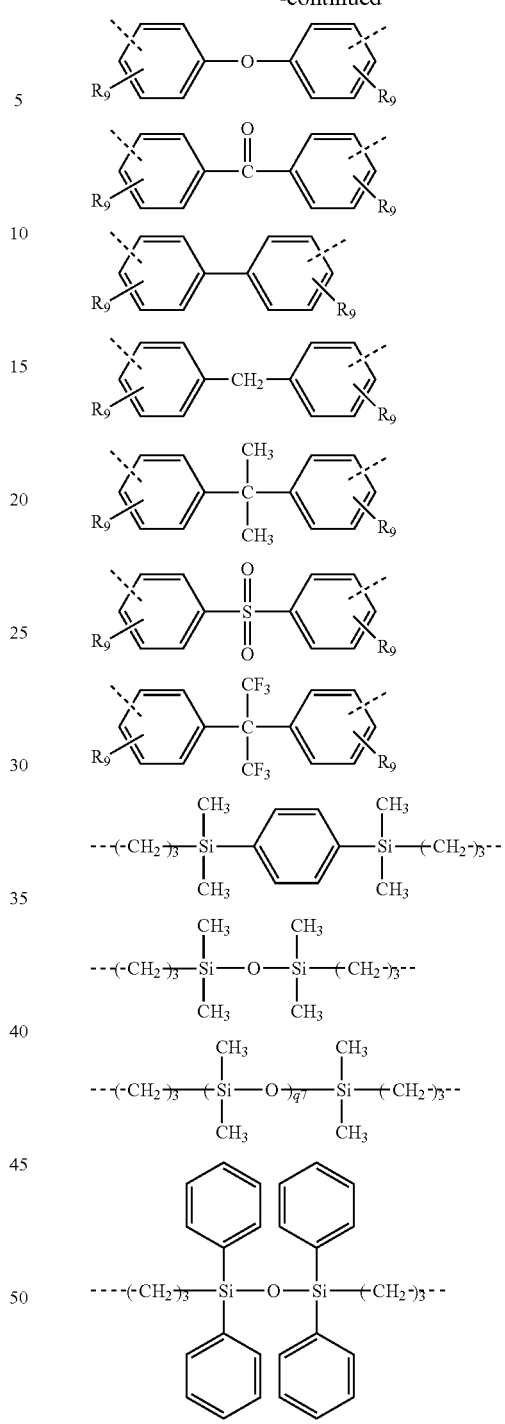

wherein, the dotted line represents a bond with an amino group; $R_9$s each independently represent a methyl group, an ethyl group, a propyl group, an n-butyl group, or a trifluoromethyl group, and a repeating number "$q_7$" represents a positive number of 2 to 20.

Furthermore, the polymer of a polyimide precursor of the present invention preferably further contains, in addition to the structural unit represented by the general formula (1), the structural unit represented by the following general formula (12) (hereinafter also referred to as the structural unit (12)),

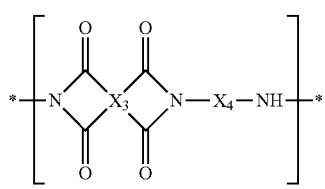

(12)

wherein, $X_3$ and $X_4$ represent the same meanings as before.

Further, the polymer of a polyimide precursor of the present invention preferably further contains, in addition to the structural unit represented by the general formula (1), the structural unit represented by the following general formula (13) (hereinafter also referred to as the structural unit (13)),

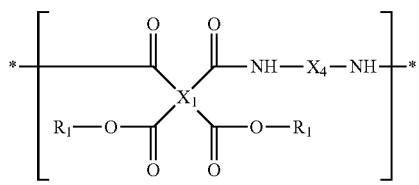

(13)

wherein, $X_1$, $X_4$, and $R_1$ represent the same meanings as before.

Moreover, the polymer of a polyimide precursor of the present invention preferably further contains, in addition to the structural unit represented by the general formula (1), the structural unit represented by the following general formula (14) or (15) (hereinafter also referred to as the structural unit (14) and the structural unit (15), respectively),

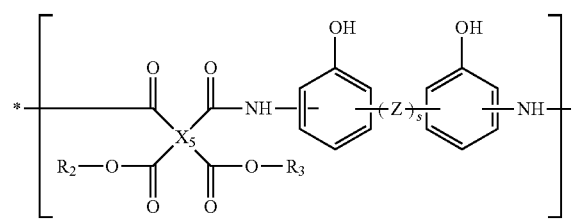

(14)

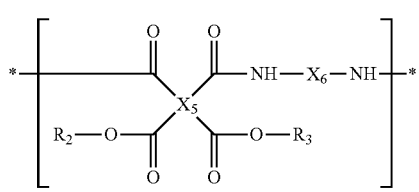

(15)

wherein, $X_5$ represents a tetravalent organic group which is the same as or different from the $X_1$; $X_6$ represents a divalent organic group, the repeating number "s" and Z represent the same meanings as before; $R_2$ and $R_3$ each independently represent a hydrogen atom, a linear, branched or cyclic alkyl group having 1 to 6 carbon atoms or an organic group represented by the following general formula (16), and either one of or both of $R_2$ and $R_3$ is/are an organic group represented by the following general formula (16),

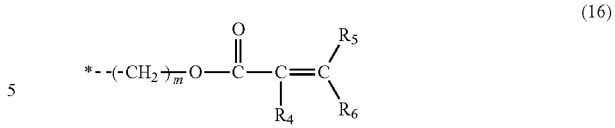

(16)

wherein, the dotted line represents a bond; $R_4$ represents a hydrogen atom or an organic group having 1 to 3 carbon atoms; $R_5$ and $R_6$ each independently represent a hydrogen atom or an organic group having 1 to 3 carbon atoms; and the repeating number "m" is an integer of 2 to 10.

$X_5$ in the general formulae (14) and (15) is a tetravalent organic group, which may be the same as or different from the $X_1$, and is not limited as long as it is a tetravalent organic group. It is preferably a tetravalent organic group of an alicyclic aliphatic group having 4 to 40 carbon atoms or an aromatic group, more preferably a tetravalent organic group represented by the formula (17). Also, the structure of $X_5$ may be one kind or a combination of two or more kinds.

On the other hand, $X_6$ in the general formula (15) is a divalent organic group, which may be the same as or different from the $X_4$, and is not limited as long as it is a divalent organic group. It is preferably a divalent organic group having 6 to 40 carbon atoms, and more preferably a cyclic organic group having 1 to 4 aromatic ring(s) having a substituent(s) or an alicyclic ring(s), or an aliphatic group having no cyclic structure or a siloxane group. More preferable $X_6$ may be mentioned a structure represented by the formula (20) or (21). Also, the structure of $X_6$ may be one kind or a combination of two or more kinds.

$R_4$ in the general formula (16) is not limited as long as it is a hydrogen atom or a monovalent organic group having 1 to 3 carbon atoms, and it is preferably a hydrogen atom or a methyl group from the viewpoint of photosensitive characteristics of the photosensitive resin composition.

$R_5$ and $R_6$ in the general formula (16) are not limited as long as each is independently a hydrogen atom or a monovalent organic group having 1 to 3 carbon atoms, and it is preferably a hydrogen atom from the viewpoint of photosensitive characteristics of the photosensitive resin composition.

The repeating number "m" in the general formula (16) is an integer of 2 to 10, and preferably an integer of 2 to 4 from the viewpoint of photosensitive characteristics. The repeating number "m" is more preferably 2.

$R_2$ and $R_3$ in the general formulae (14) and (15) each independently represent a hydrogen atom, a linear, branched, or cyclic alkyl group having 1 to 6 carbon atoms, or an organic group represented by the general formula (16), and either one of or both of $R_2$ and $R_3$ is/are an organic group(s) represented by the general formula (16).

[Producing Method of Polymer of Polyimide Precursor]

The polymer of a polyimide precursor containing the structural unit represented by the following general formula (1) can be obtained by reacting a tetracarboxylic acid diester compound represented by the following general formula (22) and a diamine represented by the following general formula (25), (1)

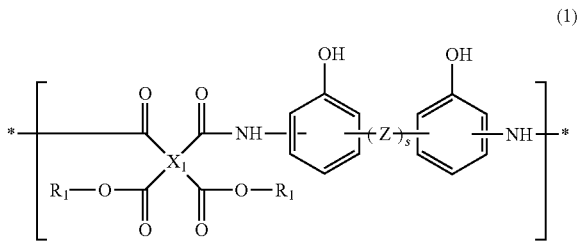

wherein, $X_1$, $R_1$, the repeating number "s", and Z represent the same meanings as before, (22)

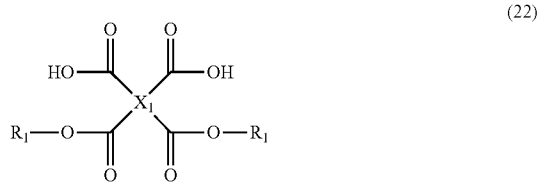

wherein, $R_1$ and $X_1$ represent the same meanings as before, (25)

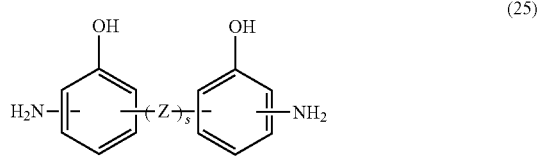

wherein, the repeating number "s" and Z represent the same meanings as before.

A method for producing the tetracarboxylic acid diester compound represented by the general formula (22) may be mentioned a method in which a tetracarboxylic dianhydride represented by the following general formula (23) and a compound having a hydroxyl group at the terminal represented by the following general formula (24) are reacted in the presence of a basic catalyst such as pyridine, and the like, to introduce $R_1$. Here, the tetracarboxylic dianhydride represented by the following general formula (23) is a compound which becomes an origin of $X_1$ (for example, the tetravalent organic group represented by the formula (17)) in the general formula (1), and the compound having a hydroxyl group at the terminal represented by the following general formula (24) is a compound which can introduce the group represented by the general formula (2), (23)

wherein, $X_1$ represents the same meaning as before,

(24)

wherein, $Y_1$, Rf, "k", and the repeating number "n" represent the same meanings as before.

Suitable examples of the tetracarboxylic dianhydride represented by the general formula (23) may be mentioned an aromatic acid dianhydride, an alicyclic acid dianhydride, an aliphatic acid dianhydride, and the like. The aromatic acid dianhydride may be mentioned, for example, pyromellitic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoxy)benzene dianhydride, p-phenylenebis-(trimellitic acid monoester acid anhydride), bis(1,3-dioxo-1,3-dihydroisobenzfuran-5-carboxylic acid)1,4-phenylene, 2,2-bis(4-(4-aminophenoxy)phenyl) propane, 1,2,5,6-naphthalenetetracarboxylic dianhydride, 2,3,6,7-naphthalenetetracarboxylic dianhydride, 9,9-bis(3,4-dicarboxyphenyl)fluorene dianhydride, 2,3,5,6-pyridine-tetracarboxylic dianhydride, 3,4,9,10-perylenetetra-carboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoro pyromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)-biphenyl dianhydride, 2,2'-bis[(dicarboxyphenoxy)phenyl]propane dianhydride, 2,2'-bis[(dicarboxyphenoxy)phenyl]hexafluoropropane dianhydride, or an acid dianhydride compound in which the aromatic ring of the above is substituted by an alkyl group, an alkoxyl group, a halogen atom, or the like, but it is not limited by these.

The alicyclic acid dianhydride may be mentioned, for example, 1,2,3,4-cyclobutanetetracarboxylic dianhydride, 1,2,3,4-cyclopentanetetracarboxylic dianhydride, 1,2,4,5-cyclohexanetetracarboxylic dianhydride, 1,2,4,5-cyclopentanetetracarboxylic dianhydride, 1,2,3,4-tetramethyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetrahydro-1-naphthalenesuccinic dianhydride, bicyclo[3.3.0]octane-2,4,6,8-tetracarboxylic dianhydride, bicyclo[4.3.0]nonane-2,4,7,9-tetracarboxylic dianhydride, bicyclo[4.4.0]decane-2,4,7,9-tetracarboxylic dianhydride, bicyclo[4.4.0]decane-2,4,8,10-tetracarboxylic dianhydride, tricyclo[6.3.0.0<2,6>]undecane-3,5,9,11-tetracarboxylic dianhydride, bicyclo[2.2.2]octane-2,3,5,6-tetracarboxylic dianhydride, bicyclo[2.2.2]oct-7-ene-2,3,5,6-tetracarboxylic dianhydride, bicyclo[2.2.1]heptanetetracarboxylic dianhydride, bicyclo[2.2.1]heptane-5-carboxymethyl-2,3,6-tricarboxylic dianhydride, 7-oxabicyclo[2.2.1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, 5-(2,5-dioxotetrahydro-3-franyl)-3-methyl-3- cyclohexene-1,2-dicarboxylic anhydride, and "RIKACID" (Registered trademark) BT-100 (all tradenames, available from New Japan Chemical Co., Ltd.) and their derivatives, and an acid dianhydride compound in which an alicyclic ring of the above is substituted by an alkyl group, an alkoxy group, a halogen atom, and the like, but the invention is not limited by these.

The aliphatic dianhydride may be mentioned, for example, 1,2,3,4-butanetetracarboxylic dianhydride, 1,2,3,4-pentanetetracarboxylic dianhydride, and a derivative thereof, and the like, but the invention is not limited by these.

These aromatic dianhydrides, alicyclic dianhydrides, or aliphatic dianhydrides may be used singly or in combination of two or more kinds.

The reaction of the tetracarboxylic dianhydride represented by the general formula (23) and the compound having a hydroxyl group at the terminal represented by the general formula (24) is carried out by subjecting to stirring, dissolution, and mixing the tetracarboxylic dianhydride represented by the general formula (23) and the compound having a hydroxyl group at the terminal represented by the general formula (24) in the presence of a basic catalyst such as pyridine, and the like, in a reaction solvent, at a reaction temperature of 20 to 50° C. for 4 to 10 hours, whereby a half esterification reaction of the acid dianhydride proceeds and the desired tetracarboxylic acid diester compound represented by the general formula (22) can be obtained as a solution in which it is dissolved in a reaction solvent.

The obtained tetracarboxylic acid diester compound may be isolated, or the obtained solution may be used as such in the next reaction with a diamine mentioned later.

The reaction solvent is preferably a material which can well dissolve the tetracarboxylic acid diester compound, and the polymer having the structural unit of the polyimide precursor obtained by the polycondensation reaction of the tetracarboxylic acid diester compound and the diamines subsequently carried out, and may be mentioned, for example, N-methyl-2-pyrrolidone, N,N-dimethylacetamide, N,N-dimethylformamide, dimethylsulfoxide, tetramethylurea, γ-butyrolactone, and the like. In addition, ketones, esters, lactones, ethers, halogenated hydrocarbons, hydrocarbons, and the like, may be used, and there may be more specifically mentioned acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene, xylene, and the like. These may be used singly or in admixture of two or more kinds, if necessary. However, it is desirable to avoid the use of N-methyl-2-pyrrolidone as explained above.

On the other hand, the repeating number "s" in the general formula (25) represents 0 or 1 similarly to the repeating number "s" in the general formula (1), and when "s" is 0, two aromatic rings in the general formula (25) are directly bonded without via the divalent bonding group Z.

In addition, when the repeating number "s" in the general formula (25) is s=1, Z in the general formula (25) is the same as the divalent bonding group Z in the general formula (1), and Z is not limited as long as it is a divalent group. It is preferably a divalent organic group of an alicyclic aliphatic group having 4 to 40 carbon atoms or an aromatic group as mentioned above, and more preferably a divalent bonding group represented by the formula (18). In addition, the structure of Z may be one kind or a combination of two or more kinds.

Further, suitable examples of the diamine represented by the general formula (25) are compounds represented by the following general formulae (26) and (27),

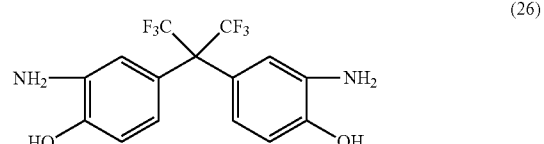

(26)

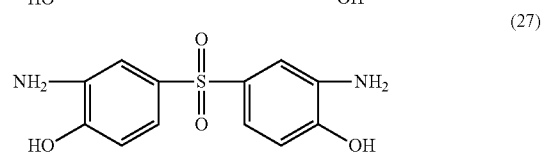

(27)

The polymer of a polyimide precursor obtained by reacting the diamine represented by the general formula (26) and the tetracarboxylic acid diester compound represented by the general formula (22) becomes a polymer containing the structural unit represented by the general formula (1-1) which is a preferred structural unit.

On the other hand, the polymer of a polyimide precursor obtained by reacting the diamine represented by the general formula (27) and the tetracarboxylic acid diester compound represented by the general formula (22) becomes a polymer containing the structural unit represented by the general formula (1-2) which is a preferred structural unit.

Here, the polymer containing the structural unit (1) can be obtained, for example, by reacting the tetracarboxylic acid diester compound represented by the general formula (22) and the diamine represented by the general formula (25) in the presence of a dehydration condensation agent. That is, the tetracarboxylic acid diester compound represented by the general formula (22) is used in the reaction in the state of dissolving in a reaction solvent, a conventionally known dehydration condensation agent (for example, dicyclohexylcarbodiimide, 1-ethoxycarbonyl-2-ethoxy-1,2-dihydroquinoline, 1,1-carbonyldioxy-di-1,2,3-benzotriazole, N,N'-disuccinimidyl carbonate, and the like) is added to the reaction solution under ice-cooling and mixed to convert the tetracarboxylic acid diester compound represented by the general formula (22) to a polyacid anhydride, then, a material in which a diamine represented by the general formula (25) is separately dissolved or dispersed in a solvent is added thereto dropwise to carry out polycondensation whereby a polymer of a polyimide precursor containing the structural unit (1) can be obtained.

Also, as another method for obtaining the polymer of a polyimide precursor containing the structural unit (1) by reacting the tetracarboxylic acid diester compound represented by the general formula (22) and the diamine represented by the general formula (25) (the diamine compound), there may be mentioned a synthesizing method in which the tetracarboxylic acid diester compound represented by the general formula (22) is converted into an acid chloride by using a chlorinating agent such as thionyl chloride or dichlorooxalic acid, and the like, and it is reacted with the diamine represented by the general formula (25).

In the reaction of converting the tetracarboxylic acid diester compound into an acid chloride by using a chlorinating agent, a basic compound may be used. As the basic compound, there may be used, for example, pyridine, 4-dimethylaminopyridine, triethylamine, and the like.

Then, the obtained acid chloride of the tetracarboxylic acid diester compound and the diamine represented by the general formula (25) are reacted in the presence of a basic catalyst to obtain the objective polymer of a polyimide precursor containing the structural unit (1). At this time, as the basic catalyst, there may be mentioned pyridine, dimethylaminopyridine, 1,8-diazabicyclo[5.4.0]undca-7-ene, 1,5-diazabicyclo[4.3.0]nona-5-ene, and the like.

Among the methods for producing the polymer of a polyimide precursor of the present invention, as a solvent to be used in the method via an acid chloride, those which can well dissolve the tetracarboxylic acid diester compound and an acid chloride thereof, and further the polymer of a polyimide precursor obtained by polycondensation reaction with the diamines are preferable, and the same solvent as the above-mentioned solvents can be used. There may be more specifically mentioned N-methyl-2-pyrrolidone, N,N-dimethylacetamide, N,N-dimethylformamide, dimethylsulfoxide, tetramethylurea, hexamethylphosphoric triamide, γ-butyrolactone, and the like. In addition, ketones, esters, lactones, ethers, halogenated hydrocarbons, hydrocarbons, and the like, may be also used, other than the polar solvent (s). For example, acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, xylene, and the like. These organic solvents may be used alone or in combination of two or more kinds.

The polymer of a polyimide precursor containing the structural unit (1) may further contain the following structural unit (13) (the structural unit of the polyimide precursor) as mentioned above,

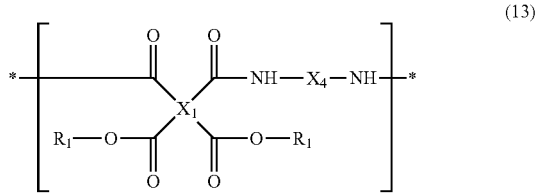

(13)

wherein, $X_1$, $X_4$, and $R_1$ represent the same meanings as before.

The polymer of a polyimide precursor containing the structural unit (13) can be obtained by reacting the tetracarboxylic acid diester compound represented by the general formula (22) and both of the diamine represented by the general formula (25) and the diamine represented by the following general formula (28) simultaneously. That is, it can be obtained by subjecting to the reaction in the presence of the a dehydration condensation agent as in the same producing method of the polymer containing the structural unit (1) or the reaction to convert the same to an acid chloride using a chlorinating agent, then, reacting the resulting material with the diamine,

(28)

wherein, $X_4$ represents the same meaning as before.

The diamine represented by the general formula (28) may be mentioned an aromatic diamine, an alicyclic diamine, an aliphatic diamine, and the like. Preferable aromatic diamine may be mentioned, for example, 3,4'-diaminodiphenyl ether, 4,4'-diaminodiphenyl ether, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzidine, 2,2'-bis(trifluoromethyl)benzidine, 3,3'-bis(trifluoromethyl)benzidine, 2,2'-dimethylbenzidine, 3,3'-dimethylbenzidine, 2,2'3,3'-tetramethylbenzidine, 2,2'-dichlorobenzidine, 3,3'-dichlorobenzidine, 2,2'3,3'-tetrachlorobenzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl) sulfone, bis[4-(3-amino-phenoxy)phenyl]sulfone, bis(4-aminophenoxy)biphenyl, bis{4-(4-aminophenoxy)phenyl} ether, 1,4-bis(4-aminophenoxy)benzene, 9,9-bis(4-aminophenyl)fluorene, 2,2'-bis[3-(3-aminobenzamide)-4-hydroxyphenyl]hexafluoropropane, 4-aminophenyl-4'-aminobenzoate, 4,4'-diaminobenzanilide, or a diamine compound in which the aromatic ring of the above is substituted by an alkyl group, an alkoxyl group, a halogen atom, and the like, but the invention is not limited by these.

The alicyclic diamine may be mentioned, for example, cyclobutanediamine, isophoronediamine, bicyclo[2.2.1]heptanebismethylamine, tricyclo[3.3.1.1$^{3,7}$]decane-1,3-diamine, 1,2-cyclohexyldiamine, 1,3-cyclohexyldiamine, 1,4-diaminocyclohexane, trans-1,4-diaminocyclohexane, cis-1,4-diaminocyclohexane, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'-diaminodicyclohexylmethane, 3,3',5,5'-tetraethyl-4,4'-diaminodicyclohexylmethane, 3,5-diethyl-3',5'-dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-amino-cyclohexyl) propane, 2,2-bis(3-methyl-4-aminocyclohexyl)-propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl) propane, 2,2-(3,5-diethyl-3',5'-dimethyl-4,4'-diaminodicyclohexyl)propane, or a diamine compound in which an aliphatic ring of the above is substituted by an alkyl group, an alkoxyl group, a halogen atom, and the like, but the invention is not limited by these.

The aliphatic diamine may be mentioned, for example, alkylenediamines such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, and the like, ethylene glycol diamines such as bis(aminomethyl) ether, bis(2-aminoethyl) ether, bis(3-aminopropyl) ether, and the like, and siloxanediamines such as 1,3-bis(3-aminopropyl)tetramethyldisiloxane, 1,3-bis(4-aminobutyl)tetramethyldisiloxane, α,ω-bis(3-aminopropyl)polydimethylsiloxane, and the like, but the invention is not limited by these.

These aromatic diamines, alicyclic diamines, or aliphatic diamines may be used singly or in combination of two or more kinds.

In addition, siloxanediamines are also suitably used.

On the other hand, the polymer of a polyimide precursor of the present invention may further contain the following structural unit(s) (14) and/or (15) as mentioned above,

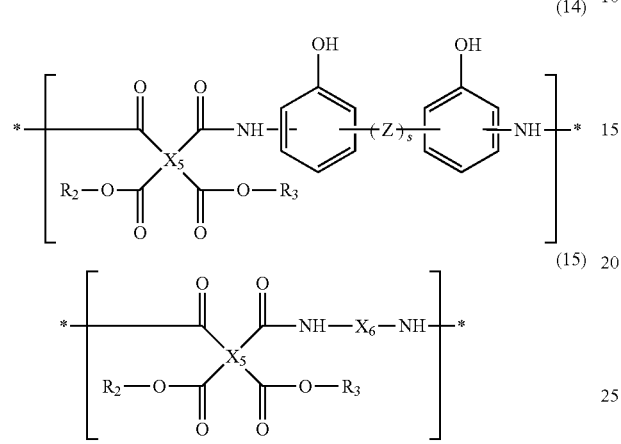

wherein, $X_5$, $X_6$, the repeating number "s", Z, $R_2$, and $R_3$ represent the same meanings as before.

Here, in order to obtain the structural units (14) and (15), a tetracarboxylic acid diester compound represented by the following general formula (49) may be synthesized,

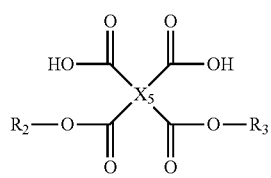

wherein, $R_2$, $R_3$, and $X_5$ represent the same meanings as before.

As the method for producing the tetracarboxylic acid diester compound represented by the general formula (49), by using a tetracarboxylic dianhydride represented by the following general formula (29) and a compound having a hydroxyl group at the terminal represented by the following general formula (30), the objective compound can be obtained by subjecting to the same method as in the synthesis of the tetracarboxylic acid diester compound represented by the general formula (22) mentioned above,

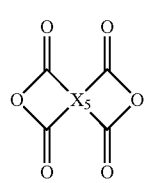

wherein, $X_5$ represents the same meaning as before,

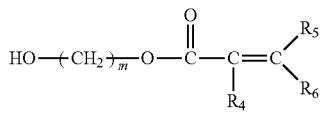

wherein, $R_4$, $R_5$, $R_6$, and the repeating number "m" represent the same meanings as before.

The tetracarboxylic dianhydride represented by the general formula (29) may be mentioned those exemplified in the tetracarboxylic dianhydride represented by the general formula (23) as preferable examples.

On the other hand, among the compounds having a hydroxyl group at the terminal represented by the general formula (30), a preferable compound may be mentioned, for example, 2-acryloyloxyethyl alcohol, 1-acryloyloxy-3-propyl alcohol, 2-methacryloyloxyethyl alcohol, 1-methacryloyloxy-3-propyl alcohol, and the like.

Also, $R_2$ and $R_3$ in the general formula (49) may be each a linear, branched, or cyclic alkyl group having 1 to 6 carbon atoms. As a method for introducing a linear, branched, or cyclic alkyl group having 1 to 6 carbon atoms (that is, $R_2$ and $R_3$ each become a linear, branched, or cyclic alkyl group having 1 to 6 carbon atoms) into the compound represented by the general formula (49), there may be mentioned a method, in the reaction of the compound having a hydroxyl group at the terminal represented by the general formula (30) and the tetracarboxylic dianhydride in the presence of a basic catalyst such as pyridine, and the like, in which a linear, branched, or cyclic alcohol having 1 to 6 carbon atoms is simultaneously added thereto.

As the suitable alcohol which can be used at this time, there may be mentioned methanol, ethanol, 1-propanol, 2-propanol, 1-butanol, 2-butanol, 1-pentanol, 2-pentanol, 3-pentanol, neopentyl alcohol, 1-hexanol, 2-hexanol, 3-hexanol, cyclopentanol, cyclohexanol, and the like.

The polymer containing the structural unit (14) can be obtained from the tetracarboxylic acid diester compound represented by the general formula (22) and the tetracarboxylic acid diester compound represented by the general formula (49), and simultaneously with the diamine represented by the general formula (25), by subjecting to the reaction in the presence of a dehydration condensation agent or the reaction of converting into an acid chloride using a chlorinating agent similarly to the method for producing the polymer containing the structural unit (1).

Also, on the other hand, the polymer containing the structural unit (15) can be obtained from the tetracarboxylic acid diester compound represented by the general formula (22) and the tetracarboxylic acid diester compound represented by the general formula (49), and simultaneously with the diamine represented by the general formula (25) and the diamine represented by the following general formula (31), by subjecting to the reaction in the presence of a dehydration condensation agent or the reaction of converting into an acid chloride using a chlorinating agent similarly to the method for producing the polymer containing the structural unit (1), $$H_2N-X_6-NH_2 \quad (31)$$

wherein, $X_6$ represents the same meaning as before.

The diamine represented by the general formula (31) may be mentioned those exemplified in the diamine represented by the general formula (28) as preferable examples.

The polymer of a polyimide precursor of the present invention may further contain the following structural unit (9), or the following structural unit (11) (a structural unit containing an amide structure),

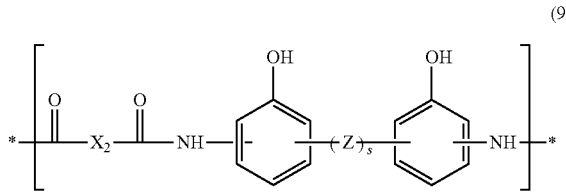
(9)

wherein, $X_2$, the repeating number "s", and Z represent the same meanings as before,

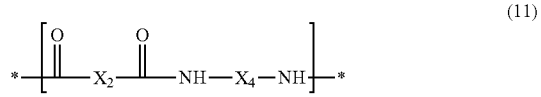
(11)

wherein, $X_2$ and $X_4$ represent the same meanings as before.

The polymer of a polyimide precursor containing the structural unit (9) can be obtained by reacting both of the tetracarboxylic acid diester compound represented by the general formula (22) and the dicarboxylic acid compound represented by the following general formula (32) with the diamine represented by the general formula (25). In the reaction at this time, the product can be obtained by subjecting to the reaction in the presence of a dehydration condensation agent or the reaction of converting into an acid chloride using a chlorinating agent similarly to the method for producing the polymer containing the structural unit (1), and then, subjecting to the reaction with the diamine,

(32)

wherein, $X_2$ represents the same meaning as before.

In the method for producing the polymer of a polyimide precursor, when the tetracarboxylic acid diester compound represented by the general formula (22) is reacted with the diamine after subjecting to the reaction of converting it into an acid chloride using a chlorinating agent, a dichloride compound of the dicarboxylic acid compound represented by the general formula (32) may be used.

Suitable examples of $X_2$ in the dicarboxylic acid compound represented by the general formula (32) may be mentioned those similarly to the above-mentioned groups.

In addition, the dicarboxylic acid compound represented by the general formula (32) may be mentioned, for example, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and the like.

Furthermore, the dicarboxylic acid compound having an aromatic ring may be mentioned, for example, phthalic acid, isophthalic acid, terephthalic acid, 4,4'-diphenyl ether dicarboxylic acid, 3,4'-diphenyl ether dicarboxylic acid, 3,3'-diphenyl ether dicarboxylic acid, 4,4'-biphenyl dicarboxylic acid, 3,4'-biphenyl dicarboxylic acid, 3,3'-biphenyl dicarboxylic acid, 4,4'-benzophenone dicarboxylic acid, 3,4'-benzophenone dicarboxylic acid, 3,3'-benzophenone dicarboxylic acid, 4,4'-hexafluoroisopropylidene dibenzoic acid, 4,4'-dicarboxydiphenylamide, 1,4-phenylenediethanoic acid, bis(4-carboxyphenyl)sulfide, 2,2-bis(4-carboxyphenyl)-1,1,1,3,3,3-hexafluoropropane, bis(4-carboxyphenyl)tetraphenyldisiloxane, bis(4-carboxyphenyl)tetramethyldisiloxane, bis(4-carboxyphenyl)sulfone, bis(4-carboxyphenyl)methane, 5-tert-butylisophthalic acid, 5-bromoisophthalic acid, 5-fluoroisophthalic acid, 5-chloroisophthalic acid, 2,2-bis-(p-carboxyphenyl)propane, 2,6-naphthalene dicarboxylic acid, and the like, but the invention is not limited by these. Also, these materials may be used singly or in admixture.

The polymer of a polyimide precursor containing the structural unit (11) can be obtained by reacting both of the tetracarboxylic acid diester compound represented by the general formula (22) and the dicarboxylic acid represented by the general formula (32) with the diamine represented by the general formula (28). In the reaction at this time, the product can be obtained by subjecting to the reaction in the presence of a dehydration condensation agent or the reaction of converting into an acid chloride using a chlorinating agent similarly to the method for producing the polymer containing the structural unit (1), and then, subjecting to the reaction with the diamine.

In addition, similarly to the above, when the tetracarboxylic acid diester compound represented by the general formula (22) is reacted with the diamine after subjecting to the reaction of converting into an acid chloride using a chlorinating agent, the dichloride compound of the dicarboxylic acid compound represented by the general formula (32) may be used.

The polymer of a polyimide precursor of the present invention may further contain the following structural unit (10), or the following structural unit (12) (a structural unit containing an imide structure) as mentioned above,

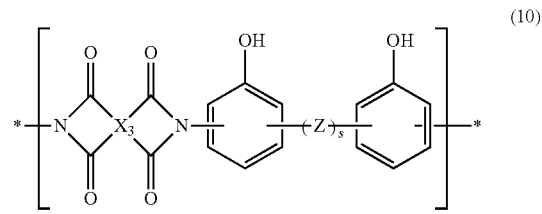
(10)

wherein, $X_3$, the repeating number "s", and Z represent the same meanings as before,

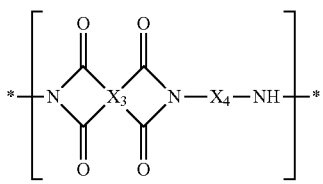

(12)

wherein, $X_3$ and $X_4$ represent the same meanings as before.

The polymer of a polyimide precursor containing the structural unit (10) is prepared, firstly, in the system in which the diamine represented by the general formula (25) is excessive, by reacting the tetracarboxylic dianhydride represented by the following general formula (50) to synthesize an amic acid, and then, an imide oligomer with the terminal of an amine is formed by heat dehydration. After forming the imide oligomer with the terminal of an amine, in order to constitute the structural unit (1), a derivative obtained by converting the tetracarboxylic acid diester compound represented by the general formula (22) into an acid chloride using a chlorinating agent is reacted whereby the polymer of a polyimide precursor containing the structural unit (10) can be obtained,

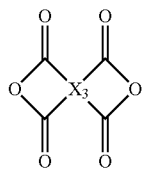

(50)

wherein, $X_3$ represents the same meaning as before.

The tetracarboxylic dianhydride represented by the general formula (50) may be mentioned those exemplified in the tetracarboxylic dianhydride represented by the general formula (23) as preferable examples.

On the other hand, the polymer of a polyimide precursor containing the structural unit (12) can be obtained by subjecting to the same reaction procedures as mentioned above. That is, in the system in which the mixture of the diamine represented by the general formula (25) and the diamine represented by the general formula (28) is excessive, the mixture of these diamines and the tetracarboxylic dianhydride represented by the general formula (50) are reacted to synthesize an amic acid, and then, an imide oligomer with the terminal of an amine is formed by heat dehydration, thereafter, a derivative in which the tetracarboxylic acid diester compound represented by the general formula (22) which constitutes the structural unit (1) is converted into an acid chloride using a chlorinating agent is added thereto and reacted to obtain a polymer of a polyimide precursor containing the structural unit (12).

The production of the imide oligomer can be carried out by dissolving the diamine in a solvent which has a high boiling point and high polarity such as γ-butyrolactone and N-methyl-2-pyrrolidone, then, adding an acid anhydride and reacted at 0 to 80° C., preferably at 10 to 50° C. to make an amic acid, adding a non-polar solvent such as xylene and the like, heating to 100 to 200° C., preferably 130 to 180° C., and subjecting to imidation reaction while removing water from the reaction system.

(Molecular Weight of Polymer and Introduction of Terminal Sealing Agent)

Suitable molecular weight of the polymer of a polyimide precursor is preferably 5,000 to 100,000, more preferably 7,000 to 30,000. If the molecular weight is 5,000 or more, it becomes easy to form a photosensitive resin composition using the polymer of a polyimide precursor as a base resin to form a film with a desired film thickness on the substrate, while if the molecular weight is 100,000 or less, the viscosity of the photosensitive resin composition is not remarkably high, and there is no possibility that the film formation cannot be performed.

The both terminals of the polymer of a polyimide precursor may be sealed by a terminal sealing agent for the purpose of controlling the molecular weight in the polycondensation reaction, and suppressing change in the molecular weight of the obtained polymer with a lapse of time, that is, gelation. Examples of the terminal sealing agent which reacts with an acid dianhydride may be mentioned a monoamine and a monovalent alcohol and the like. Also, examples of the terminal sealing agent which reacts with a diamine compound may be mentioned an acid anhydride, a monocarboxylic acid, a monoacid chloride compound, a monoactive ester compound, a dicarbonate ester, a vinyl ether, and the like. By reacting the terminal sealing agent, various organic groups can be introduced as terminal groups.

The monoamine to be used as the sealing agent at the terminal of the acid anhydride group may be mentioned aniline, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, Ameride, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, 4,8-diethynyl-2-aminonaphthalene and the like, but the invention is not limited by these. These may be used a single kind alone or in combination of two or more kinds.

On the other hand, the monovalent alcohol to be used as the sealing agent at the terminal of the acid anhydride group may be mentioned methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-eicosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononyl alcohol, 3,7-dimethyl-3-octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentane monomethylol, dicyclopentane monomethylol, tricyclodecane monomethylol, norborneol, terpineol and the like, and the invention is not limited by these. Also, these may be used a single kind alone or in combination of two or more kinds.

The acid anhydride, the monocarboxylic acid, the monoacid chloride compound and the monoactive ester compound to be used as the sealing agent at the terminal of the amino group may be mentioned an acid anhydride such as phthalic anhydride, maleic anhydride, nadic anhydride, cyclohexanedicarboxylic anhydride, 3-hydroxy phthalic anhydride and the like, the monocarboxylic acids and the monoacid chloride compound in which the carboxyl group of the above is acid chlorinated such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, 8-ethynyl-2-naphthoic acid and the like, the monoacid chloride compound in which the monocarboxyl group alone of the dicarboxylic acids is acid chlorinated such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, 2,7-dicarboxynaphthalene and the like, and the active ester compound obtained by the reaction of the monoacid chloride compound and N-hydroxybenzotriazole or N-hydroxy-5-norbornene-2,3-dicarboxyimide and the like.

The dicarbonic acid ester compound to be used as the sealing agent at the terminal of the amino group may be mentioned di-tert-butyl dicarbonate, dibenzyl dicarbonate, dimethyl dicarbonate, diethyl dicarbonate and the like.

The vinyl ether compound to be used as the sealing agent at the terminal of the amino group may be mentioned chloroformic acid esters such as tert-butyl chloroformate, n-butyl chloroformate, isobutyl chloroformate, benzyl chloroformate, allyl chloroformate, ethyl chloroformate, isopropyl chloroformate and the like, isocyanate compounds such as butyl isocyanate, 1-naphthyl isocyanate, octadecyl isocyanate, phenyl isocyanate and the like, and butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, benzyl vinyl ether and the like.

The other compounds to be used as the sealing agent at the terminal of the amino group may be mentioned benzoyl chloride, fluorenylmethyl chloroformate, 2,2,2-trichloroethyl chloroformate, methanesulfonic acid chloride, p-toluenesulfonic acid chloride, phenylisocyanate and the like.

The introduction rate of the sealing agent at the end of the acid anhydride group is preferably in the range of 0.1 to 60 mol %, particularly preferably 5 to 50 mol %, and further preferably 5 to 20 mol % based on the tetracarboxylic dianhydride component corresponding to the general formula (23) which is a starting material of the polymer of a polyimide precursor of the present invention. In addition, the introduction rate of the sealing agent at the end of the amino group is preferably in the range of 0.1 to 100 mol %, and particularly preferably 5 to 90 mol % based on the diamine component. Also, by reacting a plurality of terminal sealing agents, a plurality of different terminal groups may be introduced.

[Photosensitive Resin Composition]

Next, the photosensitive resin composition using the polymer of a polyimide precursor of the present invention as a base resin will be explained. In the present invention, a positive type photosensitive resin composition or a negative type photosensitive resin composition can be obtained by using the polymer of a polyimide precursor of the present invention as a base resin.

[Positive Type Photosensitive Resin Composition]

First, in the photosensitive resin composition using the polymer of a polyimide precursor of the present invention as a base resin, a positive type photosensitive resin composition capable of developing with an alkali will be explained. The positive type photosensitive resin composition of the present invention can be made, for example, two embodiments explained below, but the invention is not limited thereto.

The first embodiment of the positive type photosensitive resin composition of the present invention comprises
(A) the polymer of a polyimide precursor (the polymer of a polyimide precursor containing the structural unit (1)) mentioned above,
(B) a photosensitive agent which generates an acid by light to increase a dissolution rate in an aqueous alkaline solution and is a compound having a quinonediazide structure, and
(D) a solvent.

The polymer of a polyimide precursor containing the structural unit (1) of the component (A) in the positive type photosensitive resin composition of the present invention contains $R_1$ as mentioned above. The $R_1$ has an Rf group of a linear, branched, or cyclic alkyl group having 1 to 20 carbon atoms in which a part or whole of the hydrogen atom(s) has/have been substituted by a fluorine atom(s) (for example, a perfluoroalkyl group) or an aromatic group at the end of the substituent. In general, most of the polymers having the structural unit of the polyimide precursor have characteristics that they dissolve only in polar solvents such as N-methyl-2-pyrrolidone, but the use of N-methyl-2-pyrrolidone shall be avoided as much as possible. Preferably, by introducing an Rf group such as a perfluoroalkyl group or the like into the polymer molecule at the terminal of the substituent like the structural unit represented by the general formula (1), it easily becomes soluble in a versatile organic solvent, so that a safe composition can be obtained.

A suitable ratio of the Rf group such as a perfluoroalkyl group and the like to the terminal of the substituent introduced into the component (A) can be described by the number of moles of the $R_1$ in 100 g of the component (A). That is, the preferable introducing ratio of the $R_1$ which can be easily dissolved in a versatile organic solvent is 0.01 mol or more and 0.15 mol or less, more preferably 0.01 mol or more and 0.10 mol or less in 100 g of the component (A). More preferable introducing amount of the $R_1$ is 0.01 mol or more and 0.05 mol or less in 100 g of the component (A). If the introducing amount of the $R_1$ is 0.01 mol or more in 100 g of the component (A), it is possible to improve the solubility in a versatile organic solvent used for the development by the organic solvent. On the other hand, in the heating at the post-curing after subjecting to the patterning, ring-closing reaction of imidation proceeds in the structural unit of the polyimide precursor, and at this time, the introduced $R_1$ is split off and removed from the system, so that if the introducing amount of the $R_1$ is 0.15 mol or less, it is preferable since the decrease in the film thickness of the formed film does not become remarkable.

From the viewpoint of obtaining alkali solubility of the positive type photosensitive resin composition according to the present invention, it can be mentioned by the number of moles of a phenolic hydroxyl group derived from the diamine represented by the general formula (25) in the structural unit (1) in 100 g of the component (A). That is, in 100 g of the component (A), the number of moles of the phenolic hydroxyl group is 0.10 mol or more and 0.40 mol or less, more preferably 0.20 mol or more and 0.35 mol or less, and most preferably 0.25 mol or more and 0.35 mol or less. If the number of moles of the phenolic hydroxyl group is 0.10 mol or more, a desired alkali dissolution rate can be obtained with respect to the developing solution which is an aqueous alkaline solution, and at the time of the pattern formation, there is no possibility of causing obstruction in the opening of the pattern or observing scum at the bottom portion of the pattern, and there is no possibility that resolution is impaired. On the other hand, the amount that can be introduced into 100 g of the component (A) of the phenolic hydroxyl group in 100 g of the component (A) can be made about 0.40 mol in the design of the polymer of a polyimide precursor of the present invention. At this time, it is possible to expect high solubility of the aqueous alkaline solution with respect to the developing solution. However, in the present invention, after subjecting to patterning using the photosensitive resin composition, post-curing is carried out to form a cured film, but in order to eliminate fears that a large amount of phenolic hydroxyl groups which are alkali-soluble remain in the cured film and concerns that resistance of the obtained cured film to alkaline chemicals is impaired, the introducing amount of the phenolic hydroxyl group is preferably small enough to give alkali solubility.

The component (B) in the positive type photosensitive resin composition of the present invention is a photosensitive agent which generates an acid by light to increase a dissolution rate in an aqueous alkaline solution and is a compound having a quinonediazide structure. The component (B) may be mentioned a compound having a 1,2-naphthoquinonediazide sulfonyl group in the molecule.

The compound having a 1,2-naphthoquinonediazide sulfonyl group in the molecule may be mentioned a compound having a 1,2-naphthoquinonediazide sulfonyl group represented by the following general formula (33) or (34),

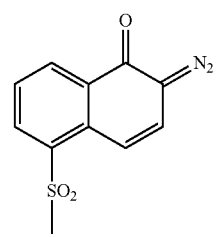

(33)

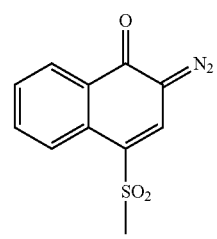

(34)

As the compound into which the 1,2-naphthoquinonediazide sulfonyl group is to be introduced, more specifically, trihydroxybenzophenone or tetrahydroxybenzophenone, or a ballast molecule which has a phenolic hydroxyl group and represented by the following general formula (35), or a novolac resin having a repeating unit represented by the following formula (40) and a weight average molecular weight in the range of 2,000 to 20,000, preferably 3,000 to 10,000 is preferably used. That is, those obtained by substituting a hydrogen atom(s) of the phenolic hydroxyl group of the resin or compound which has the phenolic hydroxyl group mentioned below with the 1,2-naphthoquinonediazide sulfonyl group are suitably used as the component (B),

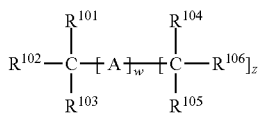 (35)

Here, $R^{101}$ to $R^{106}$ each independently represent a hydrogen atom, a methyl group, a group represented by the following formula (36) or a group represented by the following formula (37). A repeating number "w" is an integer of 0 to 2, a repeating number "z" is an integer of 0 to 2, and when "z" is 0, then, "w" is 1 or 2. A represents, when "z" is 0 and "w" is 1, a hydrogen atom, a methyl group, or a group represented by the following formula (36), when "z" is 0 and "w" is 2, one of which represents a methylene group or a group represented by the following formula (38), and another represents a hydrogen atom, a methyl group or a group represented by the following formula (36), and when "z" is 1, it represents a methylene group or a group represented by the following formula (38). When "z" is 2, then, "w" is 1, A represents a methine group or a group represented by the following formula (39), and when "w" is 2, one of As represents a methylene group or a group represented by the following formula (38), and the other represents a methine group or a group represented by the following formula (39),

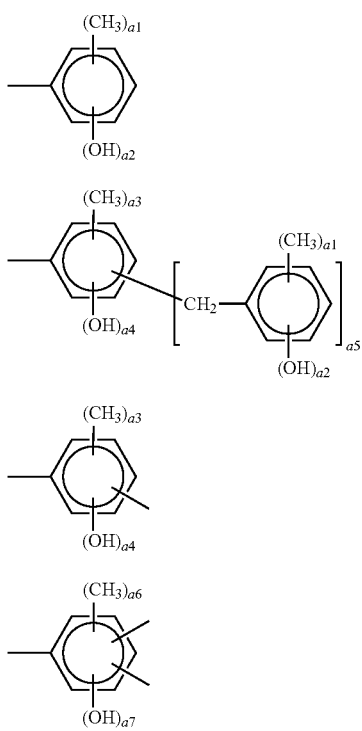

wherein, repeating numbers "a1", "a2", "a3", "a4", "a5", "a6", and "a7" each represent an integer of 0 to 3, and satisfy a1+a2≤5, a3+a4≤4, and a6+a7≤3.

In this case, it is preferable that the low nuclide component (ballast molecule) of the formula (35) has the number of the benzene rings of 2 to 20, more preferably 2 to 10, further preferably 3 to 6, and a ratio of the number of the phenolic hydroxyl groups and the number of the benzene rings is 0.5 to 2.5, more preferably 0.7 to 2.0, and further preferably 0.8 to 1.5.

Such a low nuclide component (ballast molecule) may be more specifically mentioned the following,

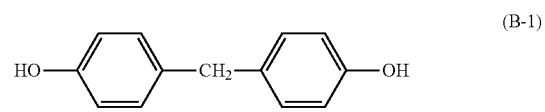 (B-1)

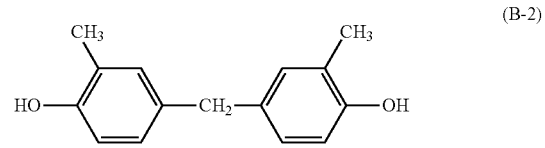 (B-2)

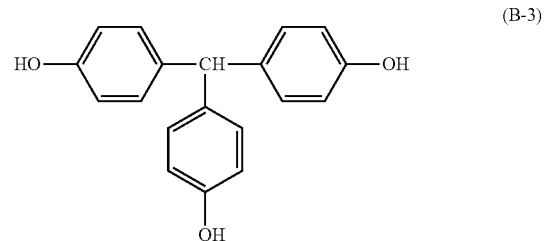 (B-3)

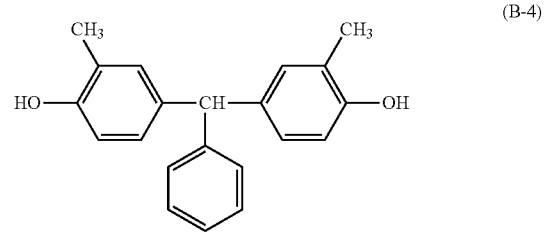 (B-4)

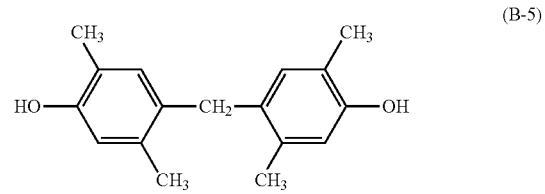 (B-5)

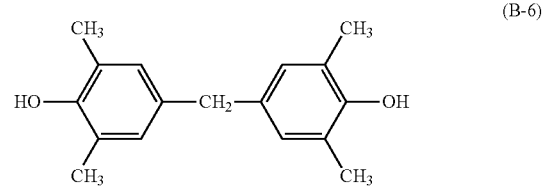 (B-6)

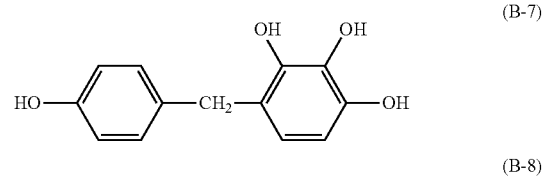 (B-7)

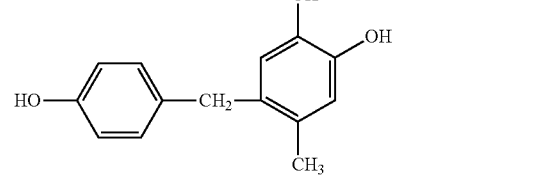 (B-8)

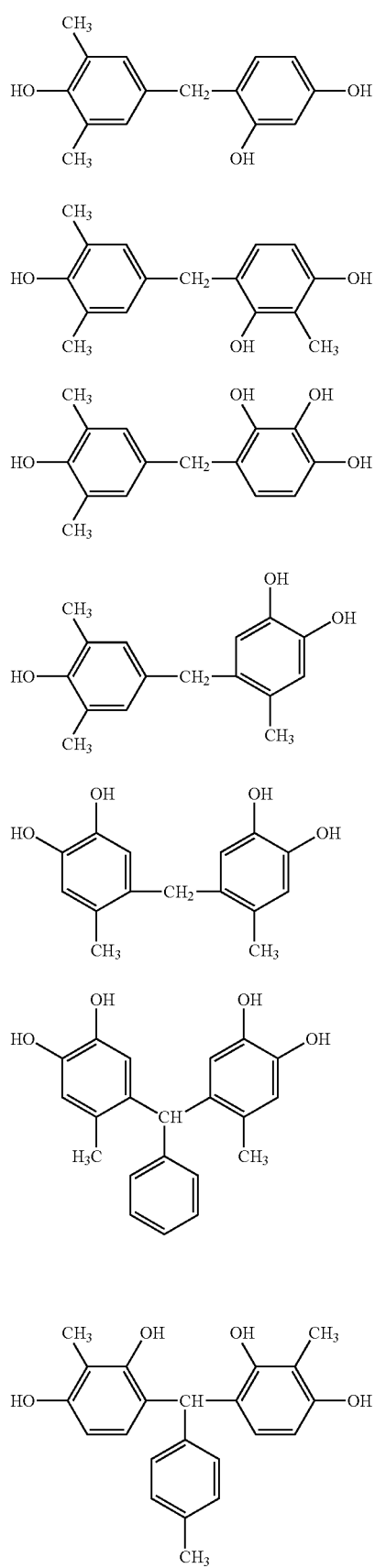
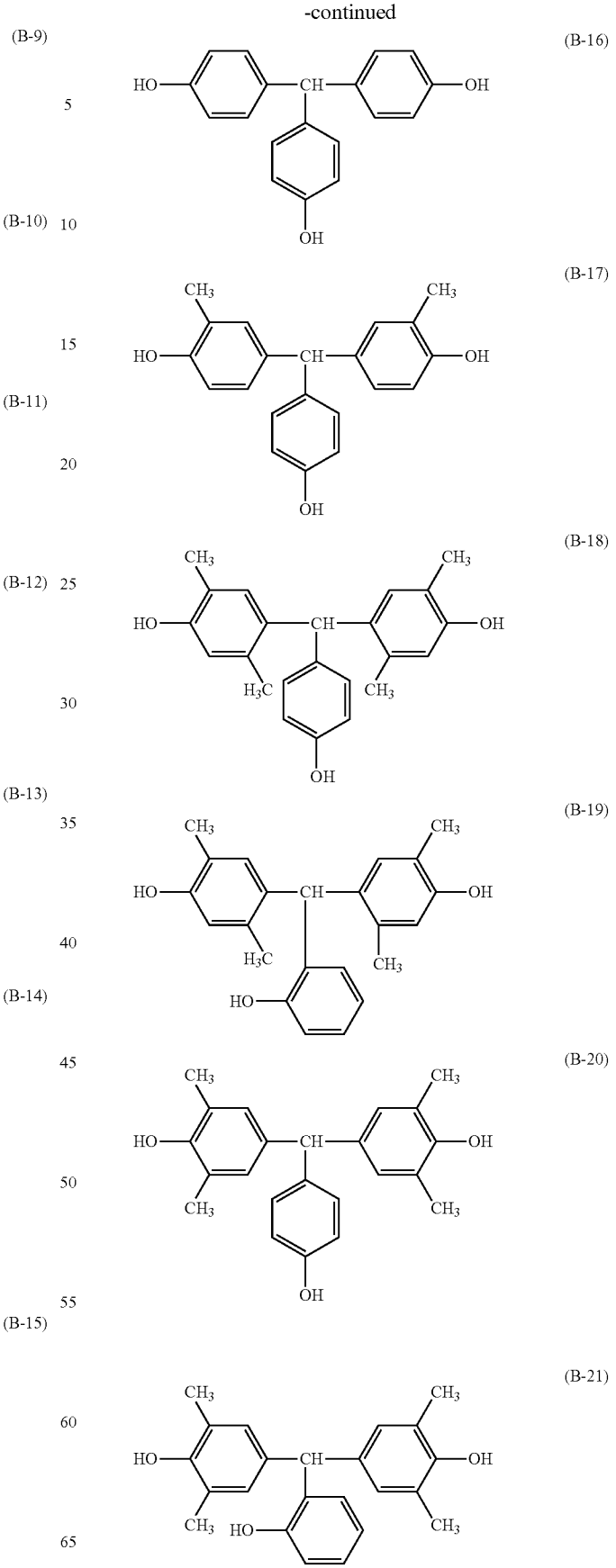

-continued
(B-22)
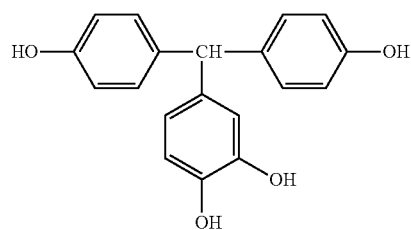
(B-23)
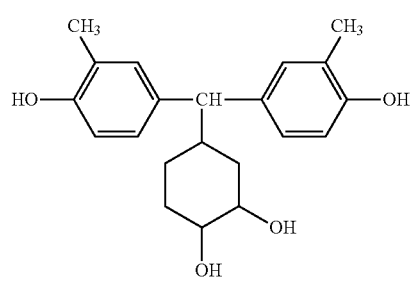
(B-24)
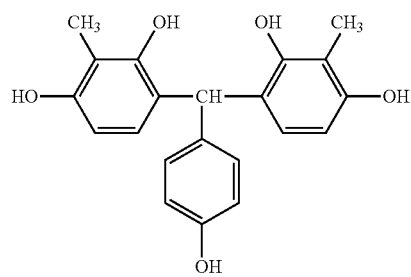
(B-25)
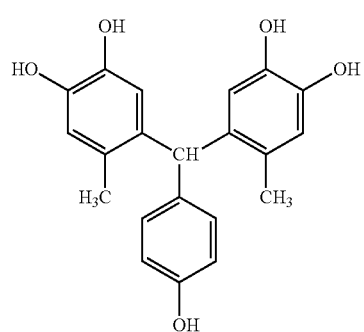
(B-26)
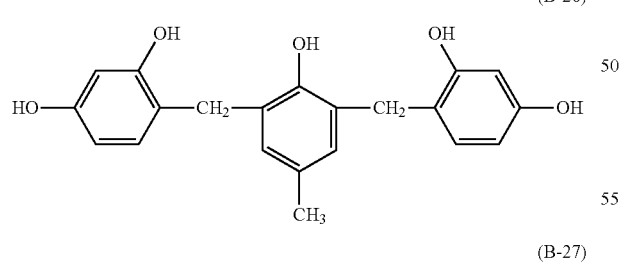
(B-27)
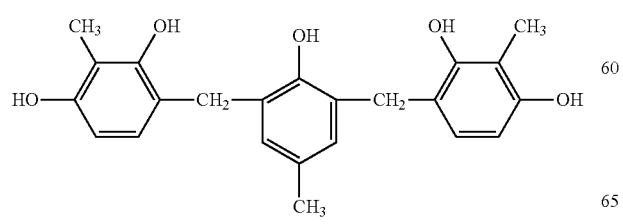
-continued
(B-28)
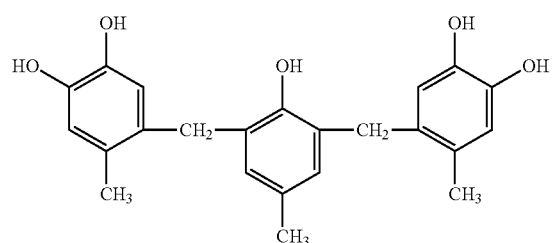
(B-29)
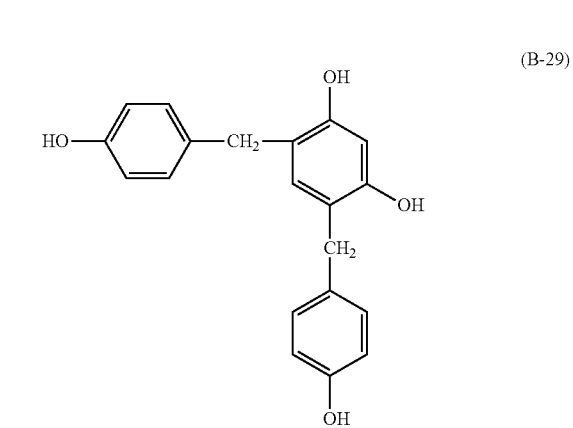
(B-30)
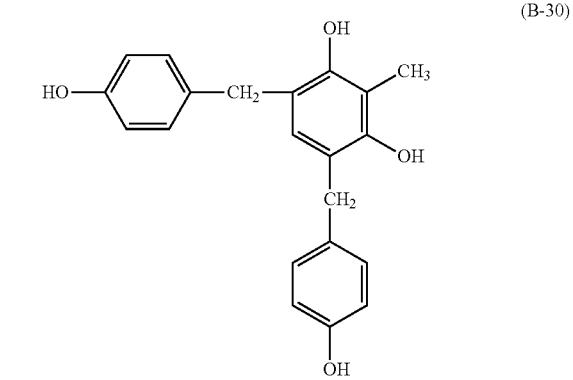
(B-31)
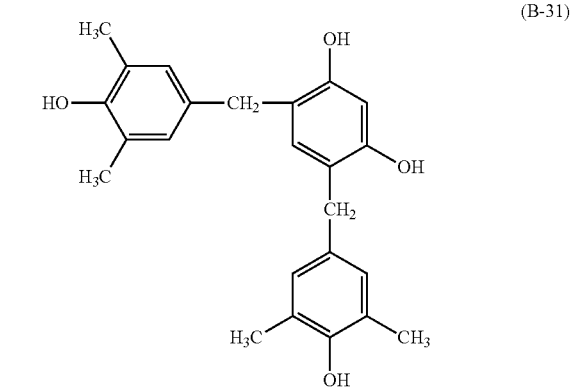

(B-32) (B-33) (B-34) (B-35) (B-36) (B-37) (B-38) (B-39) (B-40) (B-41)

-continued

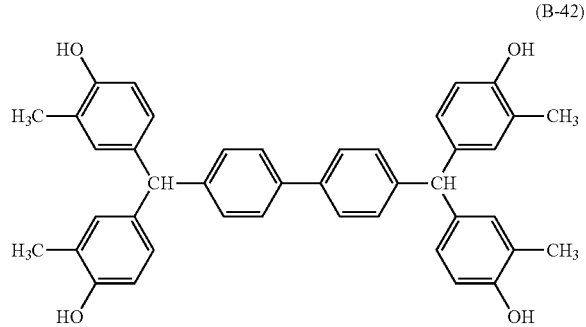
(B-42)

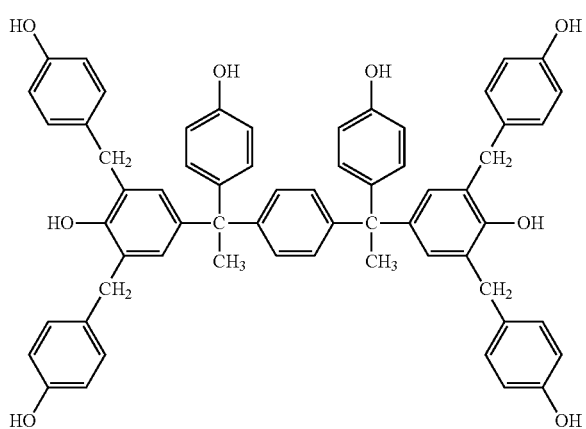
(B-43)

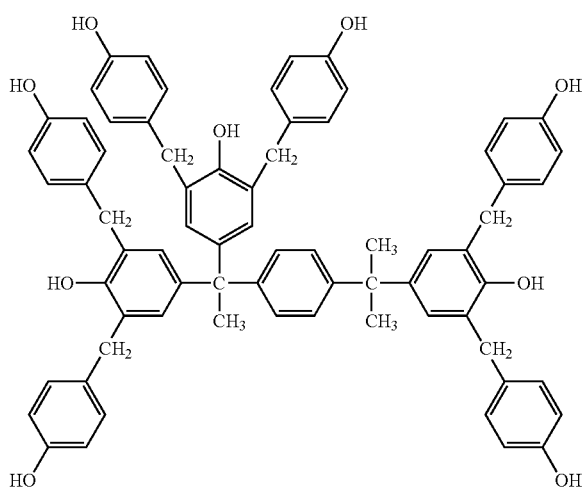
(B-44)

Among the exemplified low nuclide components (ballast molecule), (B-3), (B-29), (B-33), (B-38), and the like are suitably used, and a compound in which the hydrogen atom of the phenolic hydroxyl group of these ballast molecules is substituted by a 1,2-naphthoquinonediazide sulfonyl group is suitably used for the component (B) of the positive type photosensitive resin composition according to the present invention,

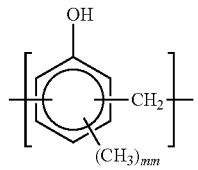
(40)

wherein, a repeating number "mm" is an integer of 0 to 3.

The novolac resin having a repeating unit represented by the formula (40) can be synthesized by condensing a phenol represented by the following formula (41), more specifically, at least one phenol selected from o-cresol, m-cresol, p-cresol, 3,5-xylenol, and the like and an aldehyde by an ordinary method,

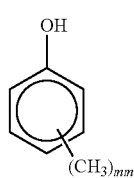
(41)

wherein, a repeating number "mm" is an integer of 0 to 3.

In this case, the aldehyde may be mentioned, for example, formaldehyde, paraformaldehyde, acetaldehyde, benzaldehyde, and the like, and formaldehyde is suitable.

A ratio of the phenol represented by the formula (41) and the aldehyde is preferably 0.2 to 2, particularly 0.3 to 2 in terms of a molar ratio.

As a method for introducing the 1,2-naphthoquinonediazide sulfonyl group into the compound into which the 1,2-naphthoquinonediazide sulfonyl group is introduced, it is preferable to use a dehydrochlorination condensation reaction of 1,2-naphthoquinonediazide sulfonyl chloride with a phenolic hydroxyl group using a basic catalyst. It is preferable that in the case of the ballast molecule represented by the formula (35), trihydroxybenzophenone or tetrahydroxybenzophenone, a ratio of substituting the hydrogen atom of the phenolic hydroxyl group with the 1,2-naphthoquinonediazide sulfonyl group is 10 to 100 mol %, preferably 50 to 100 mol %, and in the case of the novolac resin having a repeating unit represented by the formula (40), a ratio of substituting the hydrogen atom of the phenolic hydroxyl group with the 1,2-naphthoquinonediazide sulfonyl group is 2 to 50 mol %, preferably 3 to 27 mol %.

An amount of the component (B) to be added is preferably 1 to 50 parts by mass, more preferably 10 to 40 parts by mass based on 100 parts by mass of the component (A). Also, the component (B) may be used a single kind or in combination of two or more kinds.

By formulating such a component (B), the solubility in the alkaline aqueous solution is suppressed by the dissolution inhibiting property of the component (B) and the system becomes alkali insoluble before exposure, and when it is exposed, the photosensitive agent of the component (B) generates an acid by light whereby the dissolution rate in an aqueous alkaline solution increases, and the system becomes alkali soluble.

That is, when an aqueous alkaline solution is used as the developing solution, the unexposed portion is not dissolved in the developing solution, and the exposed portion is soluble in the developing solution, so that it is possible to form a positive type pattern.

Next, the component (D) in the positive type photosensitive resin composition of the first embodiment is a solvent. The solvent of the component (D) is not limited as long as it can dissolve the component (A) and the component (B). The solvent may be mentioned, for example, a ketone such as cyclohexanone, cyclopentanone, methyl-2-n-amyl ketone, and the like; an alcohol such as 3-methoxybutanol, 3-methyl-3-methoxybutanol, 1-methoxy-2-propanol, 1-ethoxy-2-propanol, and the like; an ether such as propylene glycol monomethyl ether, ethylene glycol monomethyl ether, propylene glycol monoethyl ether, ethylene glycol monoethyl ether, propylene glycol dimethyl ether, diethylene glycol dimethyl ether, and the like; an ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, γ-butyrolactone, and the like, and one or more kinds thereof may be used. In particular, ethyl lactate, cyclohexanone, cyclopentanone, propylene glycol monomethyl ether acetate, γ-butyrolactone or a mixed solvent thereof is preferable.

A formulation amount of the component (D) is preferably 50 to 2,000 parts by mass, particularly preferably 100 to 1,000 parts by mass based on the total of the formulation amount, 100 parts by mass of the component (A) and the component (B).

Next, the positive type photosensitive resin composition of the second embodiment according to the present invention is mentioned. The positive type photosensitive resin composition of the second embodiment according to the present invention contains, in addition to the components (A), (B) and (D), further (C) at least one of a crosslinking agent(s) selected from an amino condensate modified by formaldehyde or formaldehyde-alcohol, a phenol compound having two or more methylol groups or alkoxymethylol groups in average in one molecule, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

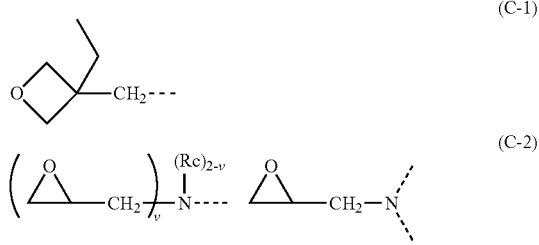

wherein, the dotted line represents a bond; Rc represents a linear, branched or cyclic alkyl group having 1 to 6 carbon atoms; and "v" represents 1 or 2.

The component (A) and the component (B) in the positive type photosensitive resin composition of the second embodiment according to the present invention may be preferably used the same components as used in the positive type photosensitive resin composition of the first embodiment.

The component (C) in the positive type photosensitive resin composition of the second embodiment according to the present invention is at least one of a crosslinking agent(s) selected from an amino condensate modified by formaldehyde or formaldehyde-alcohol, a phenol compound having two or more methylol groups or alkoxymethylol groups in average in one molecule, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

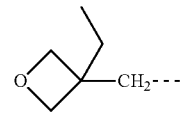

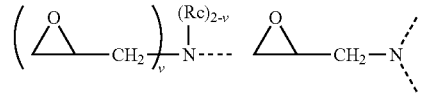

wherein, the dotted line represents a bond; Rc represents a linear, branched or cyclic alkyl group having 1 to 6 carbon atoms; and "v" represents 1 or 2.

The amino condensate modified by the formaldehyde or formaldehyde-alcohol may be mentioned, for example, a melamine condensate modified by formaldehyde or formaldehyde-alcohol, or a urea condensate modified by formaldehyde or formaldehyde-alcohol.

Preparation of the melamine condensate modified by the formaldehyde or formaldehyde-alcohol may be carried out, for example, by firstly according to the conventionally known method, modifying the melamine monomer by formalin to methylolation, or further modifying it by an alcohol to alkoxylation to make a modified melamine represented by the following general formula (42). The alcohol is preferably a lower alcohol, for example, an alcohol having 1 to 4 carbon atoms,

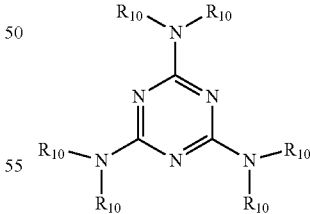

wherein, $R_{10}$s may be the same or different from each other, and represent a methylol group, an alkoxymethyl group containing an alkoxy group having 1 to 4 carbon atoms or a hydrogen atom, and at least one of which is a methylol group or the alkoxymethyl group.

The $R_{10}$ may be mentioned, for example, an alkoxymethyl group such as a methylol group, a methoxymethyl group, an ethoxymethyl group, and the like, and a hydrogen atom, and the like.

The modified melamine represented by the general formula (42) may be more specifically mentioned trimethoxymethylmonomethylol melamine, dimethoxymethylmonomethylol melamine, trimethylol melamine, hexamethylol melamine, hexamethoxymethylol melamine, and the like. Then, the modified melamine represented by the general formula (42) or its multimer (for example, an oligomer such as a dimer or a trimer) is subjected to addition condensation polymerization with formaldehyde until the product has a desired molecular weight according to the conventional method to obtain a melamine condensate modified by formaldehyde or formaldehyde-alcohol.

Preparation of the urea condensate modified by the formaldehyde or formaldehyde-alcohol may be carried out, for example, according to the conventionally known method, by modifying the urea condensate having a desired molecular weight by formaldehyde to methylolation, or further modifying it by an alcohol to alkoxylation.

Specific examples of the urea condensate modified by the formaldehyde or formaldehyde-alcohol may be mentioned, for example, a methoxymethylated urea condensate, an ethoxymethylated urea condensate, a propoxymethylated urea condensate, and the like.

These modified melamine condensates and modified urea condensates may be used one kind or in combination of two or more kinds in admixture.

Then, the phenol compound having two or more methylol groups or alkoxymethylol groups in one molecule in average may be mentioned, for example, (2-hydroxy-5-methyl)-1,3-benzenedimethanol, 2,2',6,6'-tetramethoxymethylbisphenol A, compounds represented by the following formulae (C-3) to (C-7), and the like,

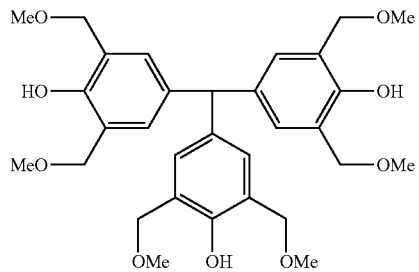

C-3

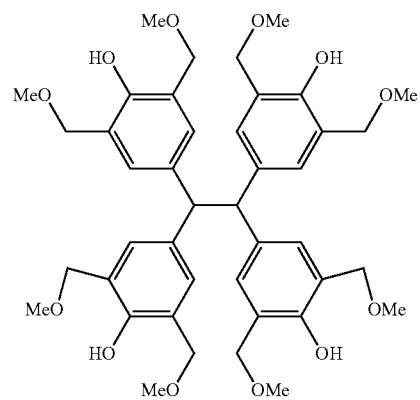

C-4

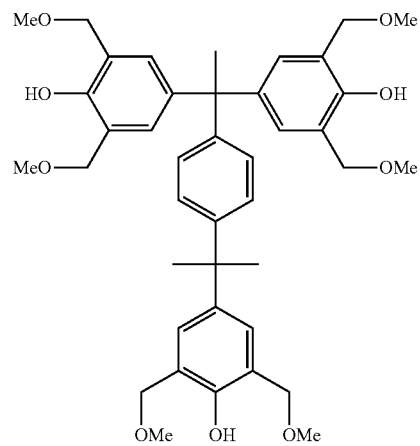

C-5

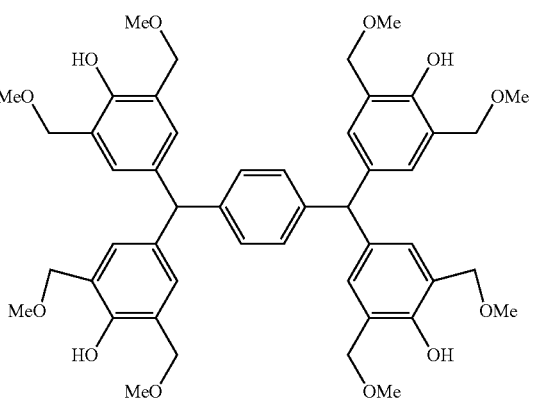

C-6

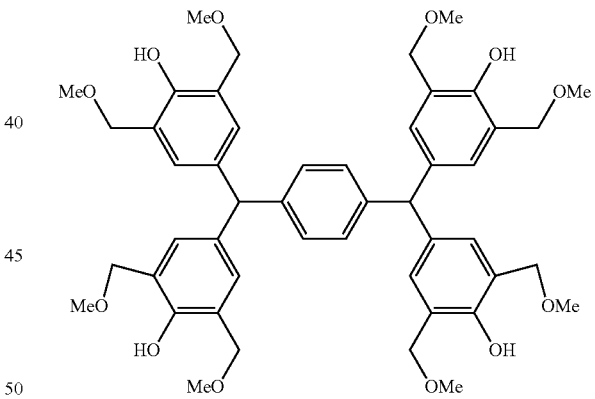

C-7

The crosslinking agents may be used one kind or in combination of two or more kinds.

On the other hand, the compound in which a hydrogen atom of a hydroxyl group of a polyvalent phenol is substituted by a glycidyl group may be mentioned bisphenol A, tris(4-hydroxyphenyl)methane, and a compound obtained by reacting the hydroxyl group of 1,1,1-tris(4-hydroxyphenyl)ethane with epichlorohydrin in the presence of a base. Suitable examples of the compound in which a hydrogen atom of a hydroxyl group of a polyvalent phenol is substituted by a glycidyl group may be mentioned the compounds represented by the following formulae (C-8) to (C-14),

C-8

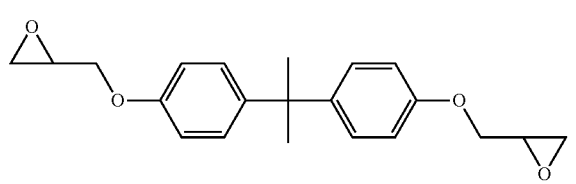

C-9

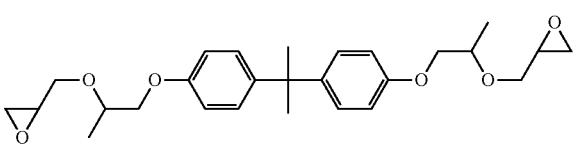

C-10

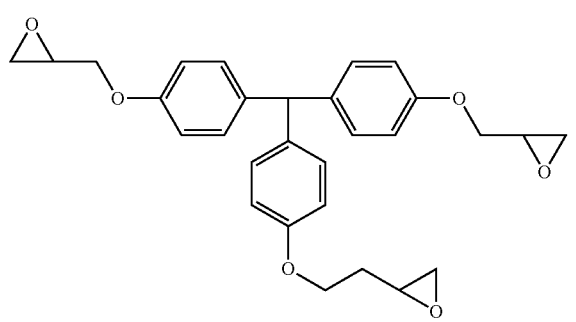

C-11

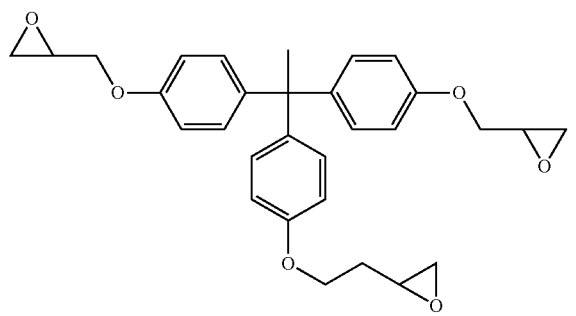

C-12

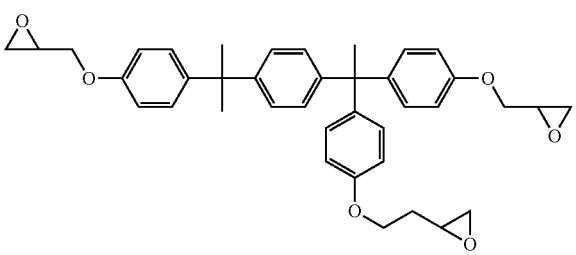

C-13

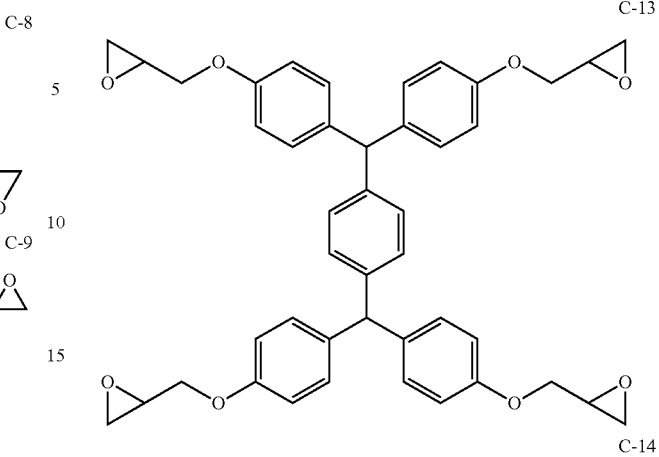

C-14

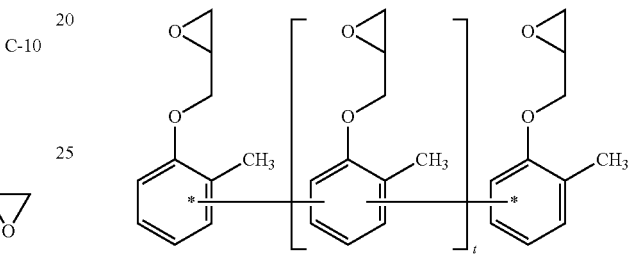

wherein, a repeating number "t" is 2≤t≤3.

One kind or two kinds of these compounds in which a hydroxyl group of a polyvalent phenol is substituted by a glycidoxy group (a compound in which a hydrogen atom of a hydroxyl group of a polyvalent phenol is substituted by a glycidyl group) may be used as a crosslinking agent.

The compound in which a hydrogen atom of a hydroxyl group of a polyvalent phenol is substituted by a substituent represented by the following formula (C-1) may be mentioned a compound having two or more of the substituents and represented by the following formula (C-15),

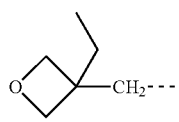 (C-1)

wherein, the dotted line represents a bond.

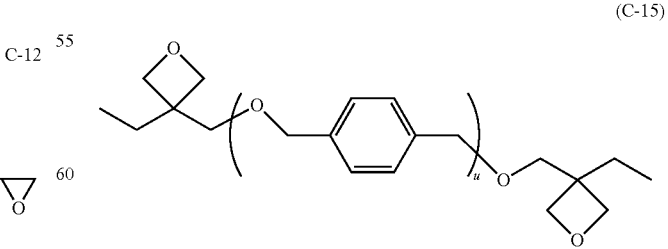 (C-15)

wherein, a repeating number "u" is 1≤u≤3.

On the other hand, the compound having two or more nitrogen atoms having a glycidyl group represented by the following formula (C-2) may be mentioned a compound represented by the following formula (C-16),

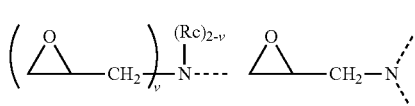
(C-2)

wherein, the dotted line represents a bond; Rc represents a linear, branched or cyclic alkyl group having 1 to 6 carbon atoms; and "v" represents 1 or 2,

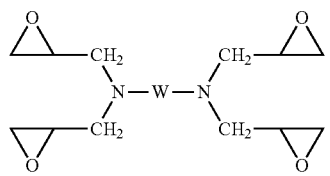
(C-16)

wherein, W represents a linear, branched, or cyclic alkylene group having 2 to 12 carbon atoms, or a divalent aromatic group.

Examples of the compound represented by the formula (C-16) may be mentioned, for example, compounds represented by the following formulae (C-17) to (C-20),

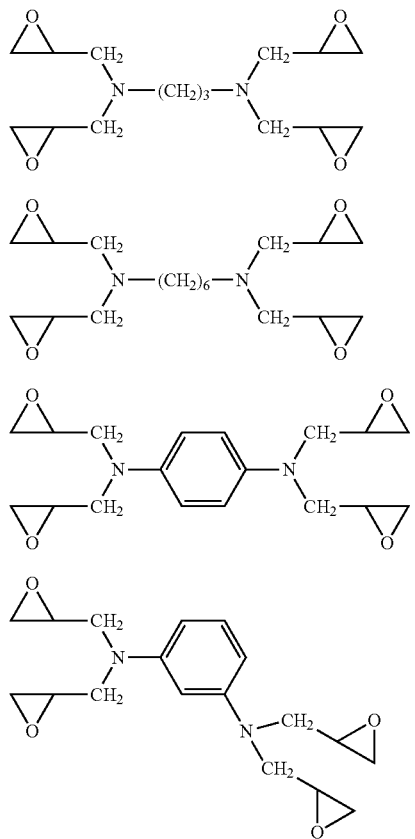

Also, on the other hand, the compound having two or more nitrogen atoms each of which has a glycidyl group(s) and represented by the formula (C-2) may be suitably used a compound represented by the following formula (C-21),

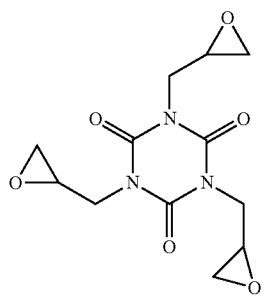
C-21

These compounds having two or more nitrogen atoms having a glycidyl group represented by the formula (C-2) may be used a single kind or two kinds thereof as a crosslinking agent(s).

The component (C) is a component that causes a crosslinking reaction upon post-curing after pattern formation of the positive type photosensitive resin composition using the polymer of a polyimide precursor of the present invention, and further increases the strength of the cured product. A weight average molecular weight of such a component (C) is preferably 150 to 10,000, particularly preferably 200 to 3,000 from the viewpoints of photocurability and heat resistance.

In the positive type photosensitive resin composition of the second embodiment according to the present invention, a formulation amount of the component (C) is preferably 0.5 to 50 parts by mass, particularly preferably 1 to 30 parts by mass based on 100 parts by mass of the component (A).

As the solvent of the component (D) in the positive type photosensitive resin composition of the second embodiment according to the present invention, a solvent similar to the solvent explained in the positive type photosensitive resin composition of the first embodiment is mentioned as a preferable solvent.

The positive type photosensitive resin composition of the present invention may further contain (E) a compound which generates an acid or a radical by heat. The compound which generates an acid or a radical by heat of the component (E) may be added for the purpose of thermally accelerating the crosslinking reaction with the component (A) in the process of heating and post-curing at a temperature of 100 to 300° C. which is subjected after the pattern formation.

In particular, the component (E) is preferably a material which does not promote curing of the film until a pattern is formed by development, and does not inhibit pattern formation. In order to realize this, the component (E) is preferably a material that does not generate an acid or a radical at the temperature of the process of removing the solvent and drying it after coating the photosensitive resin composition, but firstly generates an acid or a radical by the heat treatment after pattern formation whereby promoting the curing of the pattern or the film of the positive type photosensitive resin composition. More specifically, it is preferably a compound which is decomposed by the heat treatment at 100 to 300° C., preferably at 150° C. to 300° C. to generate an acid or a radical. By containing such a component (E), the pattern or the film of the positive type photosensitive resin composition can be changed to the pattern or the film in which crosslinking and curing reaction are more advanced in the process of heating and post-curing at a temperature of 100 to 300° C. which is subjected after the pattern formation. The component (E) makes it possible to further improve the mechanical strength, chemical resistance, adhesiveness, and the like of the obtained pattern or the film by further promoting the crosslinking and curing reaction.

The suitable compound which generates an acid by heat may be used the compounds disclosed at the paragraphs [0061] to [0085] of Japanese Patent Laid-Open Publication No. 2007-199653.

A formulation amount of the compound which generates an acid by heat is preferably 0.1 parts by mass or more, more preferably 0.5 parts by mass or more, and is preferably 30 parts by mass or less, more preferably 10 parts by mass or less based on 100 parts by mass of the component (A) in the positive type photosensitive resin composition of the present invention.

The compound which generates a radical by heat may be preferably mentioned an organic peroxide such as diisopropylbenzene hydroperoxide, 1,1,3,3-tetramethylbutyl hydroperoxide, cumene hydroperoxide, t-butyl hydroperoxide, and t-butyltrimethylsilyl peroxide, and the like, and a radical initiator composed of carbons and hydrogens such as 2,3-dimethyl-2,3-diphenylbutane, and the like. Among these, the radical initiator composed of carbons and hydrogens is more preferable since it has a large activation energy and is difficulty decomposed by heat at the time of drying.

A formulation amount of the compound which generates a radical by heat is preferably in the range of 0.5 to 4 parts by mass, more preferably in the range of 1 to 3 parts by mass based on 100 parts by mass of the component (A) in the positive type photosensitive resin composition according to the present invention.

Also, the positive type photosensitive resin composition of the present invention may further contain a component other than the component (A), the component (B), the component (C), the component (D), and the component (E). The other components may be mentioned, for example, an adhesion aid, (G) a surfactant, and the like, and the surfactant (G) may be suitably used the compounds exemplified the following, and the like.

The surfactant (G) is preferably a nonionic surfactant, and may be mentioned, for example, a fluorine-based surfactant, more specifically, a perfluoroalkyl polyoxyethylene ethanol, a fluorinated alkyl ester, a perfluoroalkylamine oxide, a fluorine-containing organosiloxane-based compound, and the like.

These surfactants which can be used are commercially available and may be mentioned, for example, Fluorad "FC-4430" (available from Sumitomo 3M Limited), Surflon "S-141" and "S-145" (all available from ASAHI GLASS CO., LTD.), UNIDYNE "DS-401", "DS-4031" and "DS-451" (all available from DAIKIN INDUSTRIES, LTD.), Megafac "F-8151" (available from DIC Corporation), "X-70-093" (available from Shin-Etsu Chemical Co., Ltd.), etc. Among these, preferred are Fluorad "FC-4430" (available from Sumitomo 3M Limited) and "X-70-093" (available from Shin-Etsu Chemical Co., Ltd.).

[Negative Type Photosensitive Resin Composition]

Next, in the photosensitive resin composition using the polymer of a polyimide precursor of the present invention as a base resin, a negative type photosensitive resin composition capable of developing with an alkali will be explained. The negative type photosensitive resin composition of the present invention can be made, for example, three embodiments explained below, but the invention is not limited thereto.

The first embodiment of the negative type photosensitive resin composition of the present invention comprises
(A') the polymer of a polyimide precursor containing either one of or both of the structural units represented by the general formulae (14) and (15) among the polymers of a polyimide precursor,
(B') a photoradical initiator, and
(D) a solvent.

The component (A') in the negative type photosensitive resin composition of the first embodiment is the polymer of a polyimide precursor containing either one of or both of the structural units represented by the general formulae (14) and (15) among the polymers of a polyimide precursor. The polymer has a polymerizable unsaturated bonding group in the molecule, so that the negative type photosensitive resin composition can be obtained by the combination of the polymer and the photoradical initiator.

Among the polymers of a polyimide precursor of the component (A'), a preferable ratio of the polymerizable unsaturated bonding group can be described by the number of moles of the polymerizable unsaturated bonding group in 100 g of the component (A'), and the number of moles is preferably 0.05 mol or more and 0.2 mol or less. It is further preferably 0.10 mol or more and 0.15 mol or less. If the introduction of the polymerizable unsaturated bonding group in the component (A') is made 0.20 mol or less, it becomes easy on a design, while if it is 0.10 mol or more, negaturation by the crosslinking reaction occurs sufficiently.

The polymer of a polyimide precursor of the component (A') in the negative type photosensitive resin composition of the present invention contains the structural unit (1) so that it contains $R_1$. The $R_1$ contains the Rf group in which a part or whole of the hydrogen atom(s) is/are substituted by a fluorine atom(s) at the terminal of the substituent as explained in the positive type photosensitive resin composition, so that it easily becomes soluble in a versatile organic solvent and a safe composition can be obtained.

A suitable ratio of the Rf group such as a perfluoroalkyl group, and the like to the terminal of the substituent introduced into the component (A') can be described by the number of moles of the $R_1$ in 100 g of the component (A'), and the same number of moles explained in the positive type photosensitive resin composition is preferably introduced.

On the other hand, from the viewpoint of making it possible to use a developing solution of an aqueous alkaline solution of the negative type photosensitive resin composition according to the present invention, as explained in the positive type photosensitive resin composition, it can be similarly described by the number of moles of the phenolic hydroxyl group derived from the diamine represented by the general formula (25) in the structural unit (1) in 100 g of the component (A'). The number of moles of the phenolic hydroxyl group is preferably introduced in the same manner as described above.

The component (B') in the negative type photosensitive resin composition of the first embodiment is a photoradical initiator. The photoradical initiator may be optionally selected the compound conventionally used as a photopolymerization initiator for UV curing. For example, the photoradical initiator may be preferably mentioned a benzophenone derivative such as benzophenone, methyl o-benzoyl benzoate, 4-benzoyl-4'-methyl diphenyl ketone, dibenzyl ketone, fluorenone, and the like; an acetophenone derivative such as 2,2'-diethoxyacetophenone, 2-hydroxy-2- methylpropiophenone, 1-hydroxycyclohexyl phenyl ketone, and the like; a thioxanthone derivative such as thioxanthone, 2-methylthioxanthone, 2-isopropylthioxanthone, diethylthioxanthone, and the like; a benzyl derivative such as benzyl, benzyl dimethyl ketal, benzyl-β-methoxyethyl acetal, and the like; a benzoin derivative such as benzoin, benzoin methyl ether, and the like; an oxime such as 1-phenyl-1,2-butanedione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime, 1-phenyl-3-ethoxypropanetrione-2-(O-benzoyl)oxime, and the like; an N-arylglycine such as N-phenylglycine, and the like; a peroxide such as benzoyl perchloride, and the like; and an aromatic biimidazole, and the like, and the invention is not limited by these. These may be used a single kind alone or in combination of two or more in admixture. Among the photoradical initiators, an oxime is more preferable, in particular, in the point of photosensitivity.

A formulation amount of the component (B') is preferably 0.1 part by mass to 20 parts by mass based on 100 parts by mass of the polymer of a polyimide precursor of the present invention of the component (A'), and more preferably 2 parts by mass to 15 parts by mass from the viewpoint of photosensitivity characteristics. By formulating the component (B') in an amount of 0.1 part by mass or more based on 100 parts by mass of the component (A'), the obtainable negative type photosensitive resin composition is excellent in photosensitivity, and on the other hand, by formulating the same in an amount of 20 parts by mass or less, the obtainable negative type photosensitive resin composition is excellent in the curing property of the thick film.

Next, the component (D) in the negative type photosensitive resin composition of the first embodiment is a solvent. The solvent of the component (D) is not limited as long as it can dissolve the component (A') and the component (B'). The solvent of the component (D) may be preferably used the solvents as exemplified in the above positive type photosensitive resin composition.

A formulation amount of the component (D) is preferably 50 to 2,000 parts by mass, particularly preferably 100 to 1,000 parts by mass based on 100 parts by mass of the total formulation amounts of the component (A') and the component (B').

The negative type photosensitive resin composition of the first embodiment may further contain the other component(s) than the component (A'), the component (B'), and the component (D). The other component(s) may be mentioned, for example, (F) a sensitizer, an adhesion aid, a polymerization inhibitor for heightening preservation stability, (G) a surfactant conventionally used for improving coating property, and the like. The surfactant (G) preferably used is the surfactant explained in the positive type photosensitive resin composition similarly.

The sensitizer (F) may be mentioned, for example, 7-N,N-diethylaminocoumarin, 7-diethylamino-3-thenoylcoumarin, 3,3'-carbonylbis(7-N,N-diethylamino)coumarin, 3,3'-carbonylbis(7-N,N-dimethoxy)coumarin, 3-thienylcarbonyl-7-N,N-diethylaminocoumarin, 3-benzoylcoumarin, 3-benzoyl-7-N,N-methoxycoumarin, 3-(4'-methoxybenzoyl)coumarin, 3,3'-carbonylbis-5,7-(dimethoxy)coumarin, benzalacetophenone, 4'-N,N-dimethylaminobenzalacetophenone, 4'-acetaminobenzal-4-methoxyacetophenone, dimethylaminobenzophenone, diethylaminobenzophenone, 4,4'-bis(N-ethyl, N-methyl)-benzophenone, and the like. A content thereof is preferably 0.05 to 20 parts by mass, more preferably 0.1 to 10 parts by mass based on 100 parts by mass of the polymer of a polyimide precursor of the present invention.

Next, the negative type photosensitive resin composition of the second embodiment according to the present invention will be explained. The negative type photosensitive resin composition of the second embodiment according to the present invention comprises (A') the polymer of a polyimide precursor containing either one of or both of the structural units represented by the general formulae (14) and (15) among the polymers of a polyimide precursor, (B') a photoradical initiator, (C') a crosslinking agent having two or more photopolymerizable unsaturated bonding groups in one molecule, and (D) a solvent.

The polymer of a polyimide precursor of the component (A') in the negative type photosensitive resin composition of the second embodiment can be assumed the case that it has few structures capable of polymerizing or crosslinking in the polymer molecule, so that the negative type photosensitive resin composition of the second embodiment can be constituted by newly adding and supplementing a crosslinking agent having a polymerizable unsaturated bonding group of the component (C'). In addition, even when the polymer of a polyimide precursor of the component (A') contains either one of or both of the structural units (14) and (15), and sufficiently contains a structure capable of polymerizing or crosslinking in the polymer molecule, it is also preferable to separately add a crosslinking agent having a polymerizable unsaturated bonding group of the component (C').

The component (B') in the negative type photosensitive resin composition of the second embodiment is a photoradical initiator. The photoradical initiator of the component (B') which can be used may be the same as those exemplified in the first embodiment.

A formulation amount of the component (B') is preferably the same formulation amount as exemplified in the first embodiment.

The component (C') of the negative type photosensitive resin composition of the second embodiment is a crosslinking agent having two or more photopolymerizable unsaturated bonding groups in one molecule. As the crosslinking agent having two or more photopolymerizable unsaturated bond groups in one molecule, a (meth)acrylic compound is preferable and preferably mentioned, for example, ethylene glycol diacrylate, ethylene glycol dimethacrylate, polyethylene glycol diacrylate (a number of each ethylene glycol unit: 2 to 20), polyethylene glycol dimethacrylate (a number of each ethylene glycol unit: 2 to 20), poly(1,2-propylene glycol) diacrylate, poly(1,2-propylene glycol) dimethacrylate, 1,6-hexanediol diacrylate, neopentyl glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, glycerol diacrylate, glycerol dimethacrylate, methylenebisacrylamide, N-methylolacrylamide, ethylene glycol diglycidyl ether-methacrylic acid adduct, glycerol diglycidyl ether-acrylic acid adduct, bisphenol A diglycidyl ether-acrylic acid adduct, bisphenol A diglycidyl ether-methacrylic acid adduct, N,N'-bis(2-methacryloyloxyethyl)urea, and the like, but the invention is not limited by these.

The component (C') is preferably formulated in an amount of 1 to 100 parts by mass, more preferably in the range of 3 to 50 parts by mass based on 100 parts by mass of the component (A'). If it is in the range of 1 to 100 parts by mass, the intended effect can be sufficiently obtained, and there is no adverse effect on developability. As the copolymerizable monomer, one kind of the compound may be used, or several kinds may be used in admixture.

The component (D) in the negative type photosensitive resin composition of the second embodiment is a solvent. The solvent of the component (D) is not limited as long as it can dissolve the component (A'), the component (B'), and the component (C'). The component (D) may be mentioned the same ones as those exemplified for the positive type photosensitive resin composition or the negative type photosensitive resin composition of the first embodiment.

A formulation amount of the component (D) preferably used may be the same formulation amount as that of the positive type photosensitive resin composition or the negative type photosensitive resin composition of the first embodiment.

The negative type photosensitive resin composition of the second embodiment may also contain other component(s) than the component (A'), the component (B'), the component (C'), and the component (D), that is, (F) a sensitizer, an adhesion aid, a polymerization inhibitor for heightening preservation stability, (G) a surfactant conventionally used for improving coating property, and the like. These components (F) and (G) preferably used are those exemplified above.

The third embodiment of the negative type photosensitive resin composition according to the present invention comprises
(A") the polymer of a polyimide precursor containing the structural unit (1), or the polymer of a polyimide precursor further containing at least one of the structural units (9) to (13) in addition to the structural unit (1),
(B") a photoacid generator,
(C) at least one of a crosslinking agent(s) selected from an amino condensate modified by formaldehyde or formaldehyde-alcohol, a phenol compound having two or more methylol groups or alkoxymethylol groups in one molecule in average, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

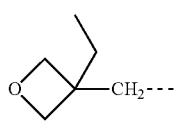
(C-1)

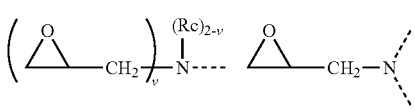
(C-2)

wherein, the dotted line represents a bond; Rc represents a linear, branched or cyclic alkyl group having 1 to 6 carbon atoms; and "v" represents 1 or 2, and
(D) a solvent.

The component (A") in the negative type photosensitive resin composition of the third embodiment is the polymer of a polyimide precursor containing the structural unit (1), or the polymer of a polyimide precursor further containing at least one of the structural units (9) to (13) in addition to the structural unit (1).

The component (A") in the negative type photosensitive resin composition of the third embodiment does not contain a polymerizable unsaturated bonding group in the structural molecule different from the component (A') in the negative type photosensitive resin composition of the first and the second embodiments. Therefore, in the negative type photosensitive resin composition of the third embodiment, a crosslinking group of the component (C) is crosslinked with the polymer of the component (A") with an acid generated from the component (B") as a catalyst whereby a negative type photosensitive resin composition can be formed.

The component (B") in the negative type photosensitive resin composition of the third embodiment is a photoacid generator. The photoacid generator may be used a material which generates an acid by irradiation with light having a wavelength of 190 to 500 nm and serving as a curing catalyst. Examples thereof may be mentioned, for example, an onium salt, a diazomethane derivative, a glyoxime derivative, a β-ketosulfone derivative, a disulfone derivative, a nitrobenzyl sulfonate derivative, a sulfonic acid ester derivative, an imid-yl-sulfonate derivative, an oxime sulfonate derivative, an iminosulfonate derivative, a triazine derivative, and the like.

The onium salt may be mentioned, for example, a compound represented by the following general formula (43), $$(R_{10})_j M^+ K^- \qquad (43)$$

wherein, $R_{10}$ represents a linear, branched, or cyclic alkyl group having 1 to 12 carbon atoms, an aryl group having 6 to 12 carbon atoms or an aralkyl group having 7 to 12 carbon atoms each of which may have a substituent(s), $M^+$ represents iodonium or sulfonium, "$K^-$" represents a non-nucleophilic counter ion, and "j" represents 2 or 3.

In the $R_{10}$, the alkyl group may be mentioned, for example, a methyl group, an ethyl group, a propyl group, a butyl group, a cyclohexyl group, a 2-oxocyclohexyl group, a norbornyl group, an adamantyl group, and the like. The aryl group may be mentioned, for example, a phenyl group; an alkoxyphenyl group may be mentioned an o-, m- or p-methoxyphenyl group, an ethoxyphenyl group, a m- or p-tert-butoxyphenyl group, and the like; and an alkylphenyl group may be mentioned a 2-, 3- or 4-methylphenyl group, an ethylphenyl group, a 4-tert-butylphenyl group, a 4-butylphenyl group, a dimethylphenyl group, and the like. The aralkyl group may be mentioned, for example, each group of a benzyl group, a phenethyl group, and the like.

The non-nucleophilic counter ion of "$K^-$" may be mentioned a halide ion such as a chloride ion, a bromide ion, and the like; a fluoroalkyl sulfonate such as triflate, 1,1,1-trifluoroethanesulfonate, nonafluoro-butanesulfonate, and the like; an arylsulfonate such as tosylate, benzenesulfonate, 4-fluorobenzenesulfonate, 1,2,3,4,5-pentafluorobenzenesulfonate, and the like; an alkylsulfonate such as mesylate, butanesulfonate, and the like.

The diazomethane derivative may be mentioned a compound represented by the following general formula (44), $$R_{11}-SO_2-\overset{\overset{N_2}{\|}}{C}-SO_2-R_{11} \qquad (44)$$

wherein, $R_{11}$s may be the same or different from each other, and represent a linear, branched, or cyclic alkyl group or halogenated alkyl group having 1 to 12 carbon atoms, an aryl group or halogenated aryl group having 6 to 12 carbon atoms, or an aralkyl group having 7 to 12 carbon atoms.

In the $R_{11}$, the alkyl group may be mentioned, for example, a methyl group, an ethyl group, a propyl group, a butyl group, an amyl group, a cyclopentyl group, a cyclohexyl group, a norbornyl group, an adamantyl group, and the like. The halogenated alkyl group may be mentioned, for example, a trifluoromethyl group, a 1,1,1-trifluoroethyl group, a 1,1,1-trichloroethyl group, a nonafluorobutyl group, and the like. The aryl group may be mentioned, for example, a phenyl group; an alkoxyphenyl group may be mentioned an o-, m- or p-methoxyphenyl group, an ethoxyphenyl group, a m- or p-tert-butoxyphenyl group, and the like; an alkylphenyl group may be mentioned a 2-, 3- or 4-methylphenyl group, an ethylphenyl group, a 4-tert-butylphenyl group, a 4-butylphenyl group, a dimethylphenyl group, and the like. The halogenated aryl group may be mentioned, for example, a fluorophenyl group, a chlorophenyl group, a 1,2,3,4,5-pentafluorophenyl group, and the like. The aralkyl group may be mentioned, for example, a benzyl group, a phenethyl group, and the like.

Such a photoacid generator may be more specifically mentioned an onium salt such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxo-cyclohexyl)sulfonium p-toluenesulfonate, dimethylphenyl-sulfonium trifluoromethanesulfonate, dimethylphenyl-sulfonium p-toluenesulfonate, dicyclohexylphenylsulfonium trifluoromethanesulfonate, dicyclohexylphenylsulfonium p-toluenesulfonate, diphenyl(4-thiophenoxyphenyl)sulfonium hexafluoroantimonite, and the like; a diazomethane derivative such as bis(benzenesulfonyl)diazomethane, bis(p-toluenesulfonyl)diazomethane, bis(xylenesulfonyl)diazomethane, bis(cyclohexylsulfonyl)diazomethane, bis(cyclo-pentylsulfonyl)diazomethane, bis(n-butylsulfonyl)diazomethane, bis(isobutylsulfonyl)diazomethane, bis(sec-butylsulfonyl) diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)-diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, 1-tert-amylsulfonyl-1-(tert-butylsulfonyl)diazomethane, and the like; a glyoxime derivative such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, bis-o-(camphorsulfonyl)-α-dimethylglyoxime, and the like; an oximesulfonate derivative such as α-(benzenesulfoniumoxyimino)-4-methylphenylacetonitrile, and the like; a β-ketosulfone derivative such as 2-cyclohexylcarbonyl-2-(p-toluenesulfonyl)propane, 2-isopropylcarbonyl-2-(p-toluenesulfonyl)propane, and the like; a disulfone derivative such as diphenyldisulfone, dicyclohexyldisulfone, and the like; a nitrobenzylsulfonate derivative such as 2,6-dinitrobenzyl p-toluenesulfonate, 2,4-dinitrobenzyl p-toluenesulfonate, and the like; a sulfonate ester derivative such as 1,2,3-tris(methanesulfonyloxy)benzene, 1,2,3-tris(trifluoromethanesulfonyloxy)benzene, 1,2,3-tris(p-toluenesulfonyloxy)benzene, and the like; an imid-yl-sulfonate derivative such as phthalimid-yl-triflate, phthalimid-yl-tosylate, 5-norbornene 2,3-dicarboxyimid-yl-triflate, 5-norbornene 2,3-dicarboxyimid-yl-tosylate, 5-norbornene 2,3-dicarboxyimid-yl-n-butylsulfonate, n-trifluoromethylsulfonyloxynaphthylimide, and the like; an iminosulfonate such as (5-(4-methylphenyl)sulfonyloxyimino-5H-thiophen-2-ylidene)-(2-methylphenyl)acetonitrile, (5-(4-(4-methylphenylsulfonyloxy)phenylsulfonyloxyimino)-5H-thiophen-2-ylidene)-(2-methylphenyl)-acetonitrile, and the like; and 2-methyl-2[(4-methylphenyl)sulfonyl]-1-[(4-methylthio) phenyl]-1-propane, and the like. Among these, an imid-yl-sulfonate, an iminosulfonate, an oxime sulfonate, and the like, are suitably used. The photoacid generator may be used one kind or in combination of two or more kinds.

A formulation amount of the photoacid generator of the component (B") is preferably 0.05 to 20 parts by mass, particularly preferably 0.2 to 5 parts by mass based on 100 parts by mass of the component (A") in the negative type photosensitive resin composition of the third embodiment of the present invention from the viewpoints of the light absorption of the photoacid generator itself and photocurability of the thick film.

The component (C) in the negative type photosensitive resin composition of the third embodiment according to the present invention is preferably used the same crosslinking agent as the component (C) explained in the second embodiment of the positive type photosensitive resin composition.

The component (C) in the negative type photosensitive resin composition of the third embodiment is a component which can form a negative type pattern in which a crosslinking group of the component (C) is crosslinked with the polymer of the component (A") with an acid generated from the component (B") as a catalyst as mentioned above, as well as increases the strength of the cured product by causing a crosslinking reaction in the post-curing after the pattern formation. The weight average molecular weight of such a component (C) is preferably 150 to 10,000, particularly preferably 200 to 3,000 from the viewpoints of photocurability and heat resistance.

The component (C) is a component which causes a crosslinking reaction in the post-curing after the pattern formation of the negative type photosensitive resin composition using the polymer of a polyimide precursor of the present invention, and further increases the strength of the cured product. The weight average molecular weight of such a component (C) is preferably 150 to 10,000, particularly preferably 200 to 3,000 from the viewpoints of photocurability and heat resistance.

A formulation amount of the component (C) is preferably 0.5 to 50 parts by mass, particularly preferably 1 to 30 parts by mass based on 100 parts by mass of the component (A") in the negative type photosensitive resin composition of the third embodiment according to the present invention.

Also, the solvent of the component (D) in the negative type photosensitive resin composition of the third embodiment according to the present invention may be mentioned the similar solvent to the solvent explained in the negative type photosensitive resin composition of the first embodiment and the second embodiment.

The negative type photosensitive resin composition of the third embodiment may also further contain the other component(s) than the component (A"), the component (B"), the component (C), and the component (D). The other component(s) may be mentioned, for example, (F) a sensitizer, an adhesion aid, a polymerization inhibitor for heightening preservation stability, and (G) a surfactant to be contained for the purpose of improving the coating property, and the like, and the sensitizer (F) and the surfactant (G) may be suitably applied the compound as exemplified above, and the like.

Also, to the negative type photosensitive resin composition of the third embodiment, a basic compound may be added as a component (H), if necessary. As the basic compound, a compound capable of suppressing the diffusion rate when an acid generated from a photoacid generator diffuses the resist film is suitable. By formulating the basic compound, resolution is improved, change in sensitivity after exposure is suppressed, the substrate and environment dependency are reduced, and exposure margin, pattern shape, and the like can be improved.

The basic compound may be mentioned a primary, secondary, and tertiary aliphatic amine, a hybrid amine, an aromatic amine, a heterocyclic amine, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, an amide derivative, an imide derivative, and further a compound represented by the following general formula (45), and the like, $$N(\alpha)_q(\beta)_{3-q} \quad (45)$$

In the formula, "q" is 1, 2, or 3. The side chains α's may be the same or different from each other, and represent any of the substituents represented by the following general formulae (46) to (48). The side chains β's may be the same or different from each other, and represent a hydrogen atom, or a linear, branched or cyclic alkyl group having 1 to 20 carbon atoms, which may contain an ether bond or a hydroxyl group. In addition, the side chains α's are bonded to each other to form a ring,

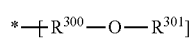  (46)

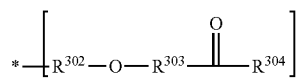  (47)

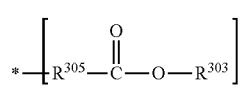  (48)

Here, $R^{300}$, $R^{302}$, and $R^{305}$ each represent a linear or branched alkylene group having 1 to 4 carbon atoms, $R^{301}$, and $R^{304}$ each represent a hydrogen atom or a linear, branched or cyclic alkyl group having 1 to 20 carbon atoms, which may contain one or a plurality of a hydroxyl group(s), an ether bond(s), an ester bond(s) and/or a lactone ring(s). $R^{303}$ represents a single bond or a linear or branched alkylene group having 1 to 4 carbon atoms, and $R^{306}$ represents a linear, branched or cyclic alkyl group having 1 to 20 carbon atoms, which may contain one or a plurality of a hydroxyl group(s), an ether bond(s), an ester bond(s) and/or a lactone ring(s). Incidentally, * represents a terminal of the bonding.

The primary aliphatic amine may be exemplified by, for example, ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like.

The secondary aliphatic amine may be exemplified by, for example, dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, and the like.

The tertiary aliphatic amine may be exemplified by, for example, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecyl-amine, tridodecylamine, tricetylamine, N,N,N',N'-tetra-methylmethylenediamine, N,N,N',N'-tetramethylethylene-diamine, N,N,N',N'-tetramethyltetraethylenepentamine, and the like.

The hybrid amine may be exemplified by, for example, dimethylethylamine, methylethylpropylamine, benzylamine, phenethylamine, benzyldimethylamine, and the like.

The aromatic amine and the heterocyclic amine may be exemplified by, for example, an aniline derivative (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, a pyrrole derivative (for example, pyrrole, 2H-pyrrole, 1-methylpyrrole, 2,4-dimethylpyrrole, 2,5-dimethylpyrrole, N-methylpyrrole, and the like), an oxazole derivative (for example, oxazole, isoxazole, and the like), a thiazole derivative (for example, thiazole, isothiazole, and the like), an imidazole derivative (for example, imidazole, 4-methylimidazole, 4-methyl-2-phenylimidazole, and the like), a pyrazole derivative, a furazan derivative, a pyrroline derivative (for example, pyrroline, 2-methyl-1-pyrroline, and the like), a pyrrolidine derivative (for example, pyrrolidine, N-methylpyrrolidine, pyrrolidinone, N-methylpyrrolidone, and the like), an imidazoline derivative, an imidazolidine derivative, a pyridine derivative (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine, and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinolinecarbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, an uridine derivative, and the like.

The nitrogen-containing compound having a carboxyl group may be exemplified by, for example, aminobenzoic acid, indolecarboxylic acid, amino acid derivative (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, and the like), and the like.

The nitrogen-containing compound having a sulfonyl group may be exemplified by, for example, 3-pyridinesulfonic acid, pyridinium p-toluenesulfonate, and the like.

The nitrogen-containing compound having a hydroxyl group, the nitrogen-containing compound having a hydroxyphenyl group, the alcoholic nitrogen-containing compound may be exemplified by, for example, 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl) phthalimide, N-(2-hydroxyethyl)isonicotinamide, and the like.

The amide derivative may be exemplified by, for example, formamide, N-methylformamide, N,N-dimethylformamide, acetamide, N-methylacetamide, N,N-dimethylacetamide, propionamide, benzamide, and the like.

The imide derivative may be exemplified by, for example, phthalimide, succinimide, maleimide, and the like.

The compound represented by the general formula (45) may be exemplified by, for example, tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy) ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl) 2-(methoxycarbonyl)ethylamine, N,N-bis(2-acetoxyethyl) 2-(methoxycarbonyl)ethylamine, N,N-bis(2-hydroxyethyl) 2-(ethoxycarbonyl)ethylamine, N,N-bis(2-acetoxyethyl) 2-(ethoxycarbonyl)ethylamine, N,N-bis(2-hydroxyethyl) 2-(2-methoxyethoxycarbonyl)ethylamine, N,N-bis(2-acetoxyethyl) 2-(2-methoxyethoxycarbonyl)ethylamine, N,N-bis(2-hydroxyethyl)2-(2-hydroxyethoxycarbonyl)ethylamine, N,N-bis(2-acetoxyethyl) 2-(2-acetoxyethoxycarbonyl)ethylamine, N,N-bis(2-hydroxyethyl) 2-[(methoxycarbonyl)-methoxycarbonyl]ethylamine, N,N-bis(2-acetoxyethyl) 2-[(methoxycarbonyl)methoxycarbonyl]ethylamine, N,N-bis(2-hydroxyethyl) 2-(2-oxopropoxycarbonyl)ethylamine, N,N-bis(2-acetoxyethyl) 2-(2-oxopropoxycarbonyl)ethylamine, N,N-bis(2-hydroxyethyl) 2-(tetrahydrofurfuryloxycarbonyl)ethylamine, N,N-bis(2-acetoxyethyl) 2-(tetrahydrofurfuryl-oxycarbonyl)ethylamine, N,N-bis(2-hydroxyethyl) 2-[(2-oxotetrahydrofuran-3-yl)oxycarbonyl]ethylamine, N,N-bis(2-acetoxyethyl) 2-[(2-oxotetrahydrofuran-3-yl)oxycarbonyl]ethylamine, N,N-bis(2-hydroxyethyl) 2-(4-hydroxybutoxycarbonyl)ethylamine, N,N-bis(2-formyloxyethyl) 2-(4-formyloxybutoxycarbonyl)ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)-amine, N-hexylbis(methoxycarbonylmethyl)amine, and β-(diethylamino)-δ-valerolactone, but the invention is not limited by these. The basic compound may be used one kind or in combination of two or more kinds.

A formulation amount of the basic compound is preferably 0 to 3 parts by mass, particularly preferably 0.01 to 1 parts by mass based on 100 parts by mass of the component (A") in the negative type photosensitive resin composition of the third embodiment according to the present invention from the viewpoint of sensitivity.

(Patterning Process)

Next, a patterning process using the positive type photosensitive resin composition and the negative type photosensitive resin composition of the present invention will be explained.

For forming a pattern in either of the cases of the positive type photosensitive resin composition and the negative type photosensitive resin composition according to the present invention, it can be carried out by employing a conventionally known lithography technique and, for example, a photosensitive resin composition is coated onto a substrate such as a silicon wafer or a $SiO_2$ substrate, a SiN substrate, or a substrate on which a pattern such as copper wiring, and the like, has been formed, by a means of spin coating (a spin coating method), and is prebaked under the conditions of a temperature at 80 to 130° C. for 50 to 600 seconds to form a film of a photosensitive material with a thickness of 1 to 50 μm, preferably 1 to 30 μm, further preferably 5 to 20 μm.

In the spin coating method, the photosensitive resin composition can be coated onto the substrate by rotating the silicon substrate after dispensing the photosensitive resin composition onto the substrate by about 5 mL. At this time, it is possible to easily adjust the film thickness of the film of the photosensitive material on the substrate by adjusting the rotation speed.

Next, a mask for forming an objective pattern is placed over the film of the photosensitive material, high energy radiation such as i line, g line or the like having a wavelength of 190 to 500 nm or an electron beam is irradiated with an exposure amount of about 1 to 5,000 mJ/cm$^2$, preferably about 100 to 2,000 mJ/cm$^2$.

Next, a heat treatment after the exposure (post exposure bake (PEB)) may be carried out on a hot plate at 60 to 150° C. for 1 to 10 minutes, preferably at 80 to 120° C. for 1 to 5 minutes, if necessary.

Thereafter, development is carried out. In the positive type photosensitive resin composition of the first embodiment and the second embodiment, and the negative type photosensitive resin composition of the first embodiment, the second embodiment and the third embodiment according to the present invention, development by an alkali by an aqueous alkaline solution is possible in either of the compositions.

On the other hand, a suitable aqueous alkaline solution which can be used for the development by an alkali is a 2.38% aqueous tetramethylhydroxy ammonium (TMAH) solution. Development can be carried out by an ordinary method such as a spray method, a paddle method, or the like, or by dipping in a developing solution, or the like. Thereafter, if necessary, cleaning, rinsing, drying and the like are carried out to obtain a resist film having a desired pattern.

The film subjected to pattern formation obtained by the patterning process is heated and post-cured at a temperature of 100 to 300° C., preferably 150 to 300° C., more preferably 180 to 250° C. by using an oven or a hot plate whereby a cured film can be formed. In this post-curing process, imide ring-closing reaction occurs in the structural unit of the polyimide precursor in the polymer of a polyimide precursor of the present invention, the Rf group such as a perfluoroalkyl group, and the like is split off and removed from the system. If the post-curing temperature is 100 to 300° C., the crosslinking density of the film of the photosensitive resin composition can be increased and residual volatile components can be removed, so that it is preferable from the viewpoints of adhesion to the substrate, heat resistance and strength, and further electric characteristics. The post-curing time can be made from 10 minutes to 10 hours.

The formed pattern is used for the purpose of a protective film for covering wirings, circuits and substrates, and the like, these formed pattern and protective film have excellent adhesive force to a metal layer such as Cu in wirings and circuits to be covered, on a metal electrode existing onto the substrate, or on an insulating substrate such as SiN existing in wirings and circuits to be covered while possessing excellent insulating property, and it is possible to remarkably improve the resolution performance for enabling a finer pattern formation while having the mechanical strength appropriate as a protective film.

The cured film thus obtained is excellent in adhesiveness to the substrate, heat resistance, electric characteristics, mechanical strength and chemical resistance to an alkaline peeling solution, and the like, and also excellent in reliability of a semiconductor device using the film as a protective film, in particular, it is possible to prevent occurrence of cracks in the temperature cycle test, whereby it can be suitably used as a protective film (an interlayer insulating film or a surface protective film) for electric and electronic parts, a semiconductor device, and the like.

That is, in the present invention, there is provided an interlayer insulating film or a surface protective film comprising a cured film in which the positive type photosensitive resin composition, or the negative type photosensitive resin composition has been cured.

The film for protection is effective for an insulating film for a semiconductor device including rewiring use, an insulating film for a multilayer printed board, a solder mask, a cover lay film use, and the like, from its heat resistance, chemical resistance and insulating property.

Further, in the present invention, there are provided electronic parts having the interlayer insulating film or the surface protective film.

EXAMPLE

In the following, the present invention will be explained in more detail by referring to Synthesis Examples, Comparative Synthesis Examples, Examples, and Comparative Examples, but the present invention is not limited by the following examples.

Chemical structure formula and names of the compounds used in the following Synthesis Examples are shown below,

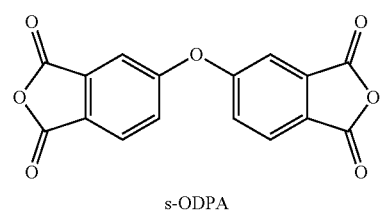

s-ODPA

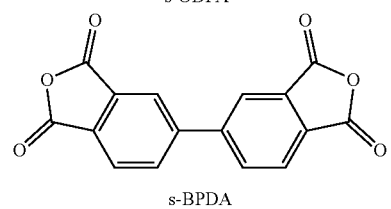

s-BPDA

-continued

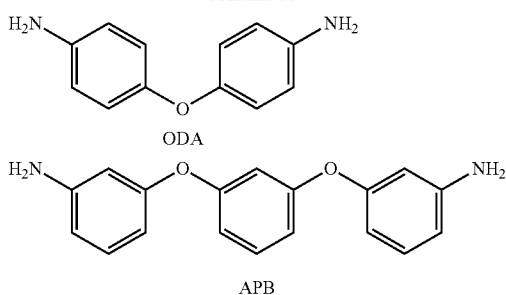
ODA

APB

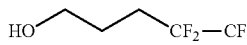
Rf-1

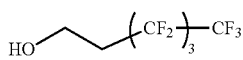
Rf-2

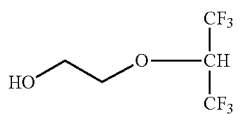
Rf-3

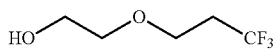
Rf-4

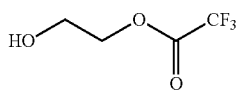
Rf-5

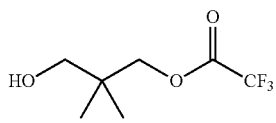
Rf-6

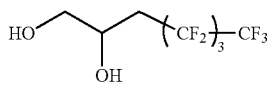
Rf-7

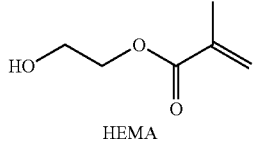
HEMA

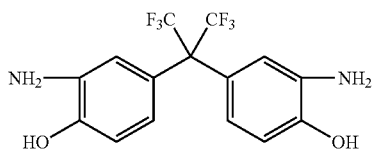
6FAP

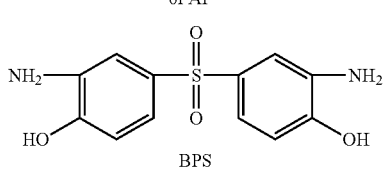
BPS

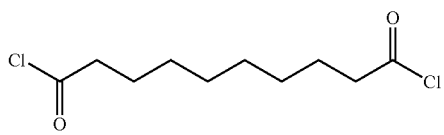
DC-1

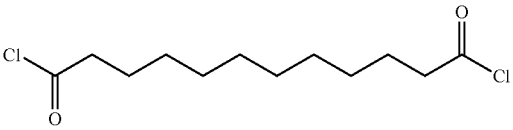
DC-2 s-ODPA: 3,3',4,4'-Oxydiphthalic acid dianhydride
s-BPDA: 3,3',4,4'-Biphenyltetracarboxylic dianhydride
ODA: 4,4'-Diaminophenyl ether
APB: 1,3-Bis(3-aminophenoxy)benzene
Rf-1: 4,4,5,5,5-Pentafluoropentanol
Rf-2: 1H,1H,2H,2H-nonafluoro-1-hexanol
Rf-3: 1-Trifluoromethyl-2,2,2-trifluoroethyl-2'-hydroxyethyl ether
Rf-4: 3,3,3-Trifluoropropyl-2'-hydroxyethyl ether
Rf-5: Hydroxyethyltrifluoro acetate
Rf-6: 3-Hydroxy-2,2-dimethylpropyltrifluoro acetate
Rf-7: 4,4,5,5,6,6,7,7,7-Nonafluoro-1,2-heptanediol
HEMA: Hydroxyethylmethacrylate
6FAP: 2,2-Bis(3-amino-4-hydroxyphenyl)hexafluoropropane
BPS: Bis(3-amino-4-hydroxyphenyl)sulfone
DC-1: Sebacic acid dichloride
DC-2: Dodecanedioyl dichloride

[Synthesis Example 1] Synthesis of Tetracarboxylic Acid Diester Dichloride (X-1)

Into a 3 L flask equipped with a stirrer and a thermometer were charged 100 g (322 mmol) of 3,3',4,4'-oxydiphthalic acid dianhydride (s-ODPA), 65.2 g (644 mmol) of triethylamine, 39.3 g (322 mmol) of N,N-dimethyl-4-aminopyridine and 400 g of γ-butyrolactone, and to the mixture stirring at room temperature was added dropwise 114.7 g (644 mmol) of 4,4,5,5,5-pentafluoropentanol (Rf-1), then, the resulting mixture was stirred under room temperature for 24 hours. Thereafter, under ice-cooling, 370 g of a 10% aqueous hydrochloric acid solution was added dropwise to the mixture to stop the reaction. To the reaction mixture was added 800 g of 4-methyl-2-pentanone, and the organic layer was collected by separation and washed six times each with 600 g of ultrapure water. The solvent of the obtained organic layer was removed by distillation to obtain 193 g of the tetracarboxylic acid diester compound (X'-1). To the obtained tetracarboxylic acid diester compound was added 772 g of N-methyl-2-pyrrolidone, and the mixture was dissolved by stirring at room temperature. Next, under ice-cooling, 75.8 g (637 mmol) of thionyl chloride was added dropwise to the mixture so that the temperature of the reaction solution maintained at 10° C. or lower, and after completion of the dropwise addition, the mixture was stirred under ice-cooling for 2 hours to obtain an N-methyl-2-pyrrolidone solution of the tetracarboxylic acid diester dichloride (X-1).

[Synthesis Example 2] Synthesis of Tetracarboxylic Acid Diester Dichloride (X-2)

In the same manner as in Synthesis Example 1 except for changing 3,3',4,4'-oxydiphthalic acid dianhydride (s-ODPA) to 94.8 g (322 mmol) of 3,3',4,4'-biphenyltetracarboxylic dianhydride (s-BPDA), an N-methyl-2-pyrrolidone solution of the tetracarboxylic acid diester dichloride (X-2) was obtained.

[Synthesis Example 3] Synthesis of Tetracarboxylic Acid Diester Dichloride (X-3)

In the same manner as in Synthesis Example 1 except for changing 4,4,5,5,5-pentafluoropentanol (Rf-1) to 170.1 g (644 mmol) of 1H,1H,2H,2H-nonafluoro-1-hexanol (Rf-2), an N-methyl-2-pyrrolidone solution of the tetracarboxylic acid diester dichloride (X-3) was obtained.

[Synthesis Example 4] Synthesis of Tetracarboxylic Acid Diester Dichloride (X-4)

In the same manner as in Synthesis Example 1 except for changing 4,4,5,5,5-pentafluoropentanol (Rf-1) to 136.6 g (644 mmol) of 1-trifluoromethyl-2,2,2-trifluoroethyl-2'-hydroxyethyl ether (Rf-3), an N-methyl-2-pyrrolidone solution of the tetracarboxylic acid diester dichloride (X-4) was obtained.

[Synthesis Example 5] Synthesis of Tetracarboxylic Acid Diester Dichloride (X-5)

In the same manner as in Synthesis Example 1 except for changing 4,4,5,5,5-pentafluoropentanol (Rf-1) to 112.2 g (644 mmol) of 3,3,3-trifluoropropyl-2'-hydroxyethyl ether (Rf-4), an N-methyl-2-pyrrolidone solution of the tetracarboxylic acid diester dichloride (X-5) was obtained.

[Synthesis Example 6] Synthesis of Tetracarboxylic Acid Diester Dichloride (X-6)

In the same manner as in Synthesis Example 1 except for changing 4,4,5,5,5-pentafluoropentanol (Rf-1) to 101.8 g (644 mmol) of 2-hydroxyethyl trifluoroacetate (Rf-5), an N-methyl-2-pyrrolidone solution of the tetracarboxylic acid diester dichloride (X-6) was obtained.

[Synthesis Example 7] Synthesis of Tetracarboxylic Acid Diester Dichloride (X-7)

In the same manner as in Synthesis Example 1 except for changing 4,4,5,5,5-pentafluoropentanol (Rf-1) to 101.8 g (644 mmol) of 3-hydroxy-2,2-dimethylpropyl trifluoroacetate (Rf-6), an N-methyl-2-pyrrolidone solution of the tetracarboxylic acid diester dichloride (X-7) was obtained.

[Synthesis Example 8] Synthesis of Tetracarboxylic Acid Diester Dichloride (X-8)

In the same manner as in Synthesis Example 1 except for changing 4,4,5,5,5-pentafluoropentanol (Rf-1) to 189.4 g (644 mmol) of 4,4,5,5,6,6,7,7,7-nonafluoro-1,2-heptanediol (Rf-7), an N-methyl-2-pyrrolidone solution of the tetracarboxylic acid diester dichloride (X-8) was obtained.

[Synthesis Example 9] Synthesis of Tetracarboxylic Acid Diester Dichloride (X-9)

In the same manner as in Synthesis Example 1 except for changing 4,4,5,5,5-pentafluoropentanol (Rf-1) to 83.8 g (644 mmol) of hydroxyethyl methacrylate (HEMA), an N-methyl-2-pyrrolidone solution of the tetracarboxylic acid diester dichloride (X-9) was obtained.

[Synthesis Example 10] Synthesis of Polymer of Polyimide Precursor (A-1)

In a 500 ml of a flask equipped with a stirrer and a thermometer were charged 30 g (81.9 mmol) of 2,2-bis(3-amino-4-hydroxyphenyl)hexafluoropropane (6FAP) and 170 g of N-methyl-2-pyrrolidone (hereinafter referred to as "NMP"), and the mixture was stirred at room temperature to dissolve the material. Next, under room temperature, to the solution was added dropwise a solution in which 12.7 g (41.0 mmol) of 3,3',4,4'-oxydiphthalic acid dianhydride (s-ODPA) had been dissolved in 146 g of N-methyl-2-pyrrolidone, and after completion of the dropwise addition, the mixture was stirred under room temperature for 3 hours. Thereafter, 40 g of xylene was added to the reaction liquid, and the mixture was heated under reflux for 3 hours while removing the formed water to out of the system at 160° C. After cooling to room temperature, 1.4 g (18.0 mmol) of pyridine was added to the mixture, and a mixed liquid of 14.7 g (4.1 mmol as the tetracarboxylic acid diester dichloride) of an NMP solution containing tetracarboxylic acid diester dichloride (X-1) separately prepared in Synthesis Example 1, and 7.8 g (32.8 mmol) of sebacic acid dichloride (DC-1) was added dropwise to the mixture while maintaining the temperature of the liquid to 5° C. or lower. After completion of the dropwise addition, the temperature of the mixture was returned to room temperature, and the reaction mixture was added dropwise into 2 L of ultrapure water under stirring, and the precipitates were collected by filtration, optionally washed with water, and dried under reduced pressure at 40° C. for 48 hours to obtain the polymer of a polyimide precursor (A-1). When the molecular weight of the polymer was measured by GPC, it had a weight average molecular weight of 35,000 in terms of the polystyrene.

[Synthesis Example 11] Synthesis of Polymer of Polyimide Precursor (A-2)

In the same manner as in Synthesis Example 10, as shown in the following Table 1, except for changing the mixed solution of the dichlorides of the N-methyl-2-pyrrolidone solution containing tetracarboxylic acid diester dichloride (X-1) separately prepared in Synthesis Example 1 and sebacic acid dichloride (DC-1) to 29.4 g (8.2 mmol as the tetracarboxylic acid diester dichloride) of the NMP solution containing tetracarboxylic acid diester dichloride (X-1) separately prepared in Synthesis Example 1 and 6.8 g (28.7 mmol) of sebacic acid dichloride (DC-1), the polymer of a polyimide precursor (A-2) was obtained. When the molecular weight of the polymer was measured by GPC, it had a weight average molecular weight of 34,100 in terms of the polystyrene.

[Synthesis Example 12] to [Synthesis Example 18] Syntheses of Polymers of Polyimide Precursors (A-3) to (A-9)

Similarly, the mixed solution of the dichlorides in Synthesis Example 10 was changed to a mixed solution of the dichlorides with weights shown in Synthesis Example 12 to Synthesis Example 18 in the following Table 1, the polymer of a polyimide precursor (A-3) to (A-9) were obtained in the same manner as in Synthesis Example 10 except for the above. The respective molecular weights of the polymers were measured by GPC, and the weight average molecular weights in terms of the polystyrene are shown in Table 1.

[Synthesis Example 19] to [Synthesis Example 21] Syntheses of Polymers of Polyimide Precursors (A-10) to (A-12)

Similarly, the diamine compound of 2,2-bis(3-amino-4-hydroxyphenyl) hexafluoropropane in Synthesis Example 10 was changed to the diamine compound or a mixture of the diamine compounds with weights shown in Synthesis Example 19 to Synthesis Example 21 in the following Table 1, so that the polymers of polyimide precursors (A-10) to (A-12) were obtained in the same manner as in Synthesis Example 10 except for the above. The molecular weights of the respective polymers were measured by GPC, and the weight average molecular weights in terms of the polystyrene are shown in the following Table 1.

[Synthesis Example 22] to [Synthesis Example 24]
Syntheses of Polymers of Polyimide Precursors (A-13) to (A-15)

Similarly, the mixed solution of the dichloride compound in Synthesis Example 10 was changed to a mixed solution of the dichlorides with weights shown in Synthesis Example 22 to Synthesis Example 24 in the following Table 1, so that the polymers of polyimide precursors (A-13) to (A-15) were obtained in the same manner as in Synthesis Example 10 except for the above. The molecular weights of the respective polymers were measured by GPC, and the weight average molecular weights in terms of the polystyrene are shown in the following Table 1.

[Synthesis Example 25] to [Synthesis Example 27]
Syntheses of Polymers of Polyimide Precursors (A-16) to (A-18)

In Synthesis Example 10, the amount of 3,3',4,4'-oxydiphthalic acid dianhydride (s-ODPA) was changed to 2.5 g (8.2 mmol), and further the mixed solution of the dichlorides was changed to a mixed solution of the dichlorides with weights of Synthesis Example 25 to Synthesis Example 27 shown in the following Table 1, so that the polymers of polyimide precursors (A-16) to (A-18) were obtained in the same manner as in Synthesis Example 10 except for the above. The molecular weights of the respective polymers were measured by GPC, and the weight average molecular weights in terms of the polystyrene are shown in the following Table 1.

[Synthesis Example 28] Synthesis of Polymer of Polyimide Precursor (A-19)

In 500 ml of a flask equipped with a stirrer and a thermometer were charged 30 g (81.9 mmol) of 2,2-bis(3-amino-4-hydroxyphenyl)hexafluoropropane, 4.3 g (54.1 mmol) of pyridine, and 170 g of NMP, and the mixture was stirred at room temperature and dissolved. Under ice-cooling, a mixed solution of the dichlorides comprising 44.1 g (12.3 mmol as the tetracarboxylic acid diester dichloride) of an NMP solution containing tetracarboxylic acid diester dichloride (X-1) separately prepared in Synthesis Example 1, and 15.6 g (65.6 mmol) of sebacic acid dichloride was added dropwise to the mixture while maintaining the temperature of the liquid to 5° C. or lower. After completion of the dropwise addition, the temperature of the mixture was returned to room temperature, the reaction mixture was added dropwise into 2 L of ultrapure water under stirring, and the precipitates were collected by filtration, optionally washed with water, and dried under reduced pressure at 40° C. for 48 hours to obtain the following polymer of a polyimide precursor (A-19). When the molecular weight of the polymer was measured by GPC, a weight average molecular weight in terms of the polystyrene was 32,000.

[Synthesis Example 29] to [Synthesis Example 31]
Syntheses of Polymers of Polyimide Precursors (A-20) to (A-22)

In Synthesis Example 28, the mixed solution of dichlorides was changed to mixed solutions of the dichlorides with weights shown in Synthesis Example 29 to Synthesis Example 31 in the following Table 1, so that the polymers of polyimide precursors (A-20) to (A-22) were obtained in the same manner as in Synthesis Example 28 except for the above. The molecular weights of the respective polymers were measured by GPC, and the weight average molecular weights in terms of the polystyrene are shown in the following Table 1.

[Comparative Synthesis Example 1] to [Comparative Synthesis Example 12] Syntheses of Polymers of Polyimide Precursors (A-23) to (A-34)

Similarly to the Synthesis Example 1 to Synthesis Example 27 except for changing the diamine compound or a mixture of the diamine compounds, the mixed solution of the dichlorides to those shown in the following Table 2, so that the polymers of a polyimide precursors (A-23) to (A-34) were obtained in the same manner except for the above. The molecular weights of the respective polymers were measured by GPC, and the weight average molecular weights in terms of the polystyrene are shown in the following Table 2.

[Comparative Synthesis Example 13] to [Comparative Synthesis Example 15] Syntheses of Polymers of Polyimide Precursors (A-35) to (A-37)

Similarly to the Synthesis Example 28 to Synthesis Example 31 except for changing the diamine compound and the mixed solution of the dichlorides to those shown in the following Table 2, so that the polymers of a polyimide precursors (A-35) to (A-37) were obtained in the same manner except for the above. The molecular weights of the respective polymers were measured by GPC, and the weight average molecular weights in terms of the polystyrene are shown in the following Table 2.

TABLE 1

| | | | | | | | | Sebacic acid | Dodecane-dioyl | Tetracarboxylic acid diester dichloride NMP solution Numeral in the parentheses is a molar number as tetracarboxylic acid diester dichloride | | |
|---|---|---|---|---|---|---|---|---|---|---|---|---|
| | | Diamine compound | | | | | | dichloride | dichloride | Synthesis Example 9 | Synthesis Example 1 | Synthesis Example 2 |
| | | 6FAP | BPS | APB | ODA | s-ODPA | DC-1 | DC-2 | | X-9 | X-1 | X-2 |
| Synthesis Example 10 | A-1 | 30.0 g (81.9 mmol) | | | | 12.7 g (41.0 mmol) | 7.8 g (32.8 mmol) | | | | 14.7 g (4.1 mmol) | |

TABLE 1-continued

| Synthesis Example | Compound | Col1 | Col2 | Col3 | Col4 | Col5 | Col6 | Col7 |
|---|---|---|---|---|---|---|---|---|
| Synthesis Example 11 | A-2 | 30.0 g (81.9 mmol) | | | 12.7 g (41.0 mmol) | 6.8 g (28.7 mmol) | | 29.4 g (8.2 mmol) |
| Synthesis Example 12 | A-3 | 30.0 g (81.9 mmol) | | | 12.7 g (41.0 mmol) | 7.8 g (32.8 mmol) | | |
| Synthesis Example 13 | A-4 | 30.0 g (81.9 mmol) | | | 12.7 g (41.0 mmol) | 7.8 g (32.8 mmol) | | |
| Synthesis Example 14 | A-5 | 30.0 g (81.9 mmol) | | | 12.7 g (41.0 mmol) | 7.8 g (32.8 mmol) | | |
| Synthesis Example 15 | A-6 | 30.0 g (81.9 mmol) | | | 12.7 g (41.0 mmol) | 7.8 g (32.8 mmol) | | |
| Synthesis Example 16 | A-7 | 30.0 g (81.9 mmol) | | | 12.7 g (41.0 mmol) | 7.8 g (32.8 mmol) | | |
| Synthesis Example 17 | A-8 | 30.0 g (81.9 mmol) | | | 12.7 g (41.0 mmol) | 7.8 g (32.8 mmol) | | |
| Synthesis Example 18 | A-9 | 30.0 g (81.9 mmol) | | | 12.7 g (41.0 mmol) | 7.8 g (32.8 mmol) | | 14.4 g (4.1 mmol) |
| Synthesis Example 19 | A-10 | | 23.0 g (61.9 mmol) | | 12.7 g (41.0 mmol) | 7.8 g (32.8 mmol) | | 14.7 g (4.1 mmol) |
| Synthesis Example 20 | A-11 | 24.0 g (65.6 mmol) | 4.8 g (16.4 mmol) | | 12.7 g (41.0 mmol) | 7.8 g (32.8 mmol) | | 14.7 g (4.1 mmol) |
| Synthesis Example 21 | A-12 | 24.0 g (65.6 mmol) | | 3.3 g (16.4 mmol) | 12.7 g (41.0 mmol) | 7.8 g (32.8 mmol) | | 14.7 g (4.1 mmol) |
| Synthesis Example 22 | A-13 | 30.0 g (81.9 mmol) | | | 12.7 g (41.0 mmol) | 8.8 g 32.8 mmol) | | 14.7 g (4.1 mmol) |
| Synthesis Example 23 | A-14 | 30.0 g (81.9 mmol) | | | 12.7 g (41.0 mmol) | 2.1 g (8.2 mmol) | 67.7 g (24.6 mmol) | 14.7 g (4.1 mmol) |
| Synthesis Example 24 | A-15 | 30.0 g (81.9 mmol) | | | 12.7 g (41.0 mmol) | | 90.2 g (32.8 mmol) | 14.7 g (4.1 mmol) |
| Synthesis Example 25 | A-16 | 30.0 g (81.9 mmol) | | | 2.5 g (8.2 mmol) | 6.2 g (24.6 mmol) | 112.8 g (41.0 mmol) | 14.7 g (4.1 mmol) |
| Synthesis Example 26 | A-17 | 30.0 g (81.9 mmol) | | | 2.5 g (8.2 mmol) | 2.1 g (8.2 mmol) | 146.6 g (53.3 mmol) | 29.4 g (8.2 mmol) |
| Synthesis Example 27 | A-18 | 30.0 g (81.9 mmol) | | | 2.5 g (8.2 mmol) | | 169.2 g (61.5 mmol) | 29.4 g (8.2 mmol) |
| Synthesis Example 28 | A-19 | 30.0 g (81.9 mmol) | | | | 15.6 g (65.6 mmol) | | 44.1 g (12.3 mmol) |
| Synthesis Example 29 | A-20 | 30.0 g (81.9 mmol) | | | 7.8 g (41.0 mmol) | | 90.2 g (32.8 mmol) | 14.7 g (4.1 mmol) |
| Synthesis Example 30 | A-21 | 30.0 g (81.9 mmol) | | | | 2.1 g (8.2 mmol) | 169.2 g (61.5 mmol) | 29.4 g (8.2 mmol) |
| Synthesis Example 31 | A-22 | 30.0 g (81.9 mmol) | | | | | 191.8 g (69.7 mmol) | 29.4 g (8.2 mmol) |

Tetracarboxylic acid diester dichloride NMP solution
Numeral in the parentheses is a molar number as tetracarboxylic acid diester dichloride

| | Synthesis Example 3 X-3 | Synthesis Example 4 X-4 | Synthesis Example 5 X-5 | Synthesis Example 6 X-6 | Synthesis Example 7 X-7 | Synthesis Example 8 X-8 | Molecular weight of obtained polymer |
|---|---|---|---|---|---|---|---|
| Synthesis Example 10 | | | | | | | 35,000 |
| Synthesis Example 11 | | | | | | | 34,100 |
| Synthesis Example 12 | 17.9 g (4.1 mmol) | | | | | | 35,200 |

TABLE 1-continued

| | Col A | Col B | Col C | Col D | Mw |
|---|---|---|---|---|---|
| Synthesis Example 13 | 14.3 g (4.1 mmol) | | | | 33,600 |
| Synthesis Example 14 | | 11.8 g (4.1 mmol) | | | 34,000 |
| Synthesis Example 15 | | | 12.3 g (4.1 mmol) | | 33,900 |
| Synthesis Example 16 | | | | 13.9 g (4.1 mmol) | 34,500 |
| Synthesis Example 17 | | | | | 17.4 g (4.1 mmol) / 34,900 |
| Synthesis Example 18 | | | | | 33,100 |
| Synthesis Example 19 | | | | | 34,100 |
| Synthesis Example 20 | | | | | 34,700 |
| Synthesis Example 21 | | | | | 34,000 |
| Synthesis Example 22 | | | | | 35,000 |
| Synthesis Example 23 | | | | | 31,100 |
| Synthesis Example 24 | | | | | 31,700 |
| Synthesis Example 25 | | | | | 29,800 |
| Synthesis Example 26 | | | | | 30,900 |
| Synthesis Example 27 | | | | | 29,900 |
| Synthesis Example 26 | | | | | 32,000 |
| Synthesis Example 29 | | | | | 30,000 |
| Synthesis Example 30 | | | | | 28,700 |
| Synthesis Example 31 | | | | | 25,800 |

TABLE 2

| | | Diamine compound | | | | s-ODPA | Sebacic acid dichloride DC-1 | Dodecanedioyl dichloride DC-2 | Tetracarboxylic acid diester dichloride NMP solution Numeral in the parentheses is a molar number as tetracarboxylic acid diester dichloride | | |
|---|---|---|---|---|---|---|---|---|---|---|---|
| | | 6FAP | BPS | APB | ODA | | | | Synthesis Example 9 X-9 | Synthesis Example 1 X-1 | Synthesis Example 2 X-2 |
| Comparative Synthesis Example 1 | A-23 | 30.0 g (81.9 mmol) | | | | 12.7 g (41.0 mmol) | 8.8 g (36.9 mmol) | | | | |
| Comparative Synthesis Example 2 | A-24 | | 23.0 g (81.9 mmol) | | | 12.7 g (41.0 mmol) | 8.8 g (36.9 mmol) | | | | |
| Comparative Synthesis Example 3 | A-25 | 24.0 g (65.6 mmol) | | 4.8 g (16.4 mmol) | | 12.7 g (41.0 mmol) | 8.8 g (36.9 mmol) | | | | |
| Comparative Synthesis Example 4 | A-26 | 24.0 g (65.6 mmol) | | | 3.3 g (16.4 mmol) | 12.7 g (41.0 mmol) | 8.8 g (36.9 mmol) | | | | |
| Comparative Synthesis Example 5 | A-27 | 30.0 g (81.9 mmol) | | | | 12.7 g (41.0 mmol) | | 9.9 g (36.9 mmol) | | | |
| Comparative Synthesis Example 6 | A-28 | 30.0 g (81.9 mmol) | | | | 12.7 g (41.0 mmol) | 2.1 g (8.2 mmol) | | 82.0 g (28.7 mmol) | | |
| Comparative Synthesis Example 7 | A-29 | 30.0 g (81.9 mmol) | | | | 12.7 g (41.0 mmol) | | | 101.5 g (36.9 mmol) | | |

TABLE 2-continued

| | | | | | | | |
|---|---|---|---|---|---|---|---|
| Comparative Synthesis Example 8 | A-30 | 16.4 g (81.9 mmol) | 12.7 g (41.0 mmol) | 7.8 g (32.8 mmol) | | 14.7 g (4.1 mmol) | |
| Comparative Synthesis Example 9 | A-31 | 16.4 g (81.9 mmol) | 12.7 g (41.0 mmol) | 7.8 g (32.8 mmol) | | | 14.7 g (4.1 mmol) |
| Comparative Synthesis Example 10 | A-32 | 16.4 g (81.9 mmol) | 12.7 g (41.0 mmol) | 8.8 g (36.9 mmol) | | | |
| Comparative Synthesis Example 11 | A-33 | 16.4 g (81.9 mmol) | 12.7 g (41.0 mmol) | | 82.0 g (28.7 mmol) | | |
| Comparative Synthesis Example 12 | A-34 | 16.4 g (81.9 mmol) | 12.7 g (41.0 mmol) | | 101.5 g (36.9 mmol) | | |
| Comparative Synthesis Example 13 | A-35 | 16.4 g (81.9 mmol) | | 9.8 g (41.0 mmol) | 101.5 g (36.9 mmol) | | |
| Comparative Synthesis Example 14 | A-36 | 16.4 g (81.9 mmol) | | 2.1 g (8.2 mmol) | 191.7 g (69.7 mmol) | | |
| Comparative Synthesis Example 15 | A-37 | 16.4 g (81.9 mmol) | | | 214.3 g (77.9 mmol) | | |

Tetracarboxylic acid diester dichloride NMP solution
Numeral in the parentheses is a molar number as tetracarboxylic acid diester dichloride

| | Synthesis Example 3 X-3 | Synthesis Example 4 X-4 | Synthesis Example 5 X-5 | Synthesis Example 6 X-6 | Synthesis Example 7 X-7 | Synthesis Example 8 X-8 | Molecular weight of obtained polymer |
|---|---|---|---|---|---|---|---|
| Comparative Synthesis Example 1 | | | | | | | 28,800 |
| Comparative Synthesis Example 2 | | | | | | | 27,400 |
| Comparative Synthesis Example 3 | | | | | | | 26,200 |
| Comparative Synthesis Example 4 | | | | | | | 26,800 |
| Comparative Synthesis Example 5 | | | | | | | 28,100 |
| Comparative Synthesis Example 6 | | | | | | | 28,700 |
| Comparative Synthesis Example 7 | | | | | | | 27,800 |
| Comparative Synthesis Example 8 | | | | | | | 24,500 |
| Comparative Synthesis Example 9 | | | | | | | 24,600 |
| Comparative Synthesis Example 10 | | | | | | | 23,800 |
| Comparative Synthesis Example 11 | | | | | | | 27,200 |
| Comparative Synthesis Example 12 | | | | | | | 27,500 |
| Comparative Synthesis Example 13 | | | | | | | 26,800 |
| Comparative Synthesis Example 14 | | | | | | | 27,100 |
| Comparative Synthesis Example 15 | | | | | | | 26,900 |

In Table 2, the polymers of the polyimide precursors (A-23) to (A-29) do not use any of (X-1) to (X-8) as the tetracarboxylic acid diester dichloride at the time of synthesis, so that these do not contain the structural unit (1). Also, the polymers of the polyimide precursors (A-30) and (A-31) do not use 6FAP or BPS as the diamine compound at the time of synthesis, so that these do not contain the structural unit (1). Further, the polymers of the polyimide precursors (A-32) to (A-37) do neither use any of (X-1) to (X-8) nor 6FAP and BPS at the time of synthesis, so that these do not contain the structural unit (1).

II. Preparation of Photosensitive Resin Composition

The polymers synthesized in the Synthesis Example 10 to Synthesis Example 31 and Comparative Synthesis Examples 1 to 15 were used as a base resin, and resin compositions each having a resin content of 40% by mass in terms of resin were prepared with the compositions and formulation amounts shown in Tables 3 to 24. Thereafter, each mixture was stirred, mixed and dissolved, and then, subjected to precise filtration with a 0.5 µm filter made of Teflon (registered trademark) to obtain photosensitive resin compositions. In the table, GBL of the solvent represents γ-butyrolactone.

TABLE 3

|  | Photosensitive resin composition 1 | Photosensitive resin composition 2 | Photosensitive resin composition 3 | Photosensitive resin composition 4 | Photosensitive resin composition 5 | Photosensitive resin composition 6 |
|---|---|---|---|---|---|---|
| Base resin | A-13 100 parts by weight | A-14 100 parts by weight | A-15 100 parts by weight | A-16 100 parts by weight | A-17 100 parts by weight | A-18 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Solvent | GBL 150 parts by weight | GBL 150 parts by weight | GBL 150 parts by weight | GBL 150 parts by weight | GBL 150 parts by weight | GBL 150 parts by weight |

TABLE 4

|  | Photosensitive resin composition 7 | Photosensitive resin composition 8 | Photosensitive resin composition 9 |
|---|---|---|---|
| Base resin | A-20 100 parts by weight | A-21 100 parts by weight | A-22 100 parts by weight |
| Photosensitive agent | Photosensitive agent 1 15 parts by weight | Photosensitive agent 1 15 parts by weight | Photosensitive agent 1 15 parts by weight |
| Solvent | GBL 150 parts by weight | GBL 150 parts by weight | GBL 150 parts by weight |

The photosensitive resin compositions 1 to 9 shown in Tables 3 and 4 relate to the positive type photosensitive resin compositions of the first embodiment according to the present invention.

TABLE 5

|  | Comparative Photosensitive resin composition 1 | Comparative Photosensitive resin composition 2 | Comparative Photosensitive resin composition 3 | Comparative Photosensitive resin composition 4 | Comparative Photosensitive resin composition 5 | Comparative Photosensitive resin composition 6 |
| --- | --- | --- | --- | --- | --- | --- |
| Base resin | A-28 100 parts by weight | A-29 100 parts by weight | A-33 100 parts by weight | A-34 100 parts by weight | A-35 100 parts by weight | A-36 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Solven-t | GBL 150 parts by weight | GBL 150 parts by weight | GBL 150 parts by weight | GBL 150 parts by weight | GBL 150 parts by weight | GBL 150 parts by weight |
| Solubility of base resin | Turbid | Turbid | Turbid | Turbid | Turbid | Turbid |

TABLE 6

|  | Comparative Photosensitive resin composition 7 |
| --- | --- |
| Base resin | A-37 100 parts by weight |
| Photosensitive agent | Photosensitive agent 1 15 parts by weight |
| Solvent | GBL 150 parts by weight |
| Solubility of base resin | Turbid |

The comparative photosensitive resin compositions 1 to 7 shown in Tables 5 and 6 are materials in which, in the positive type photosensitive resin composition of the first embodiment according to the present invention, the polymers of a polyimide precursor synthesized in Comparative Synthesis Examples 6 and 7 and Comparative Synthesis Examples 11 to 15 were used as the base resin in place of the polymer of a polyimide precursor of the present invention. These polymers of a polyimide precursor synthesized in Comparative Synthesis Examples were not the polymer containing the structural unit (1), i.e., these do not contain an alkyl group or aromatic group in which a part or whole of the hydrogen atom(s) is/are substituted by a fluorine atom(s) represented by the Rf group, so that these were never dissolved completely in versatile γ-butyrolactone, and became turbid.

TABLE 7

|  | Comparative Photosensitive resin composition 8 | Comparative Photosensitive resin composition 9 | Comparative Photosensitive resin composition 10 | Comparative Photosensitive resin composition 11 | Comparative Photosensitive resin composition 12 | Comparative Photosensitive resin composition 13 |
| --- | --- | --- | --- | --- | --- | --- |
| Base resin | A-28 100 parts by weight | A-29 100 parts by weight | A-33 100 parts by weight | A-34 100 parts by weight | A-35 100 parts by weight | A-36 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Solven-t | NMP 150 parts by weight | NMP 150 parts by weight | NMP 150 parts by weight | NMP 150 parts by weight | NMP 150 parts by weight | NMP 150 parts by weight |

TABLE 8

|  | Comparative Photosensitive resin composition 14 |
| --- | --- |
| Base resin | A-37 100 parts by weight |
| Photosensitive agent | Photosensitive agent 1 15 parts by weight |
| Solvent | NMP 150 parts by weight |

The polymers of a polyimide precursor synthesized in Comparative Synthesis Examples 6 and 7 and Comparative Synthesis Examples 11 to 15 did not dissolve in γ-butyrolactone, so that the comparative photosensitive resin compositions 8 to 14 were prepared by using N-methyl-2-pyrrolidone (NMP) as a solvent as in the compositions shown in Tables 7 and 8.

TABLE 9

|  | Photosensitive resin composition 10 | Photosensitive resin composition 11 | Photosensitive resin composition 12 | Photosensitive resin composition 13 | Photosensitive resin composition 14 | Photosensitive resin composition 15 |
|---|---|---|---|---|---|---|
| Base resin | A-1 100 parts by weight | A-2 100 parts by weight | A-3 100 parts by weight | A-4 100 parts by weight | A-5 100 parts by weight | A-6 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Crosslinking agent | CL-2 5 parts by weight | CL-2 5 parts by weight | CL-2 5 parts by weight | CL-2 5 parts by weight | CL-2 5 parts by weight | CL-2 5 parts by weight |
| Crosslinking agent | CL-3 15 parts by weight | CL-3 15 parts by weight | CL-3 15 parts by weight | CL-3 15 parts by weight | CL-3 15 parts by weight | CL-3 15 parts by weight |
| Solvent | GBL 150 parts by weight | GBL 150 parts by weight | GBL 150 parts by weight | GBL 150 parts by weight | GBL 150 parts by weight | GBL 150 parts by weight |

TABLE 10

|  | Photosensitive resin composition 16 | Photosensitive resin composition 17 | Photosensitive resin composition 18 | Photosensitive resin composition 19 | Photosensitive resin composition 20 | Photosensitive resin composition 21 |
|---|---|---|---|---|---|---|
| Base resin | A-7 100 parts by weight | A-8 100 parts by weight | A-9 100 parts by weight | A-10 100 parts by weight | A-11 100 parts by weight | A-12 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Crosslinking agent | CL-2 5 parts by weight | CL-2 5 parts by weight | CL-2 5 parts by weight | CL-2 5 parts by weight | CL-2 5 parts by weight | CL-2 5 parts by weight |
| Crosslinking agent | CL-3 15 parts by weight | CL-3 15 parts by weight | CL-3 15parts by weight | CL-3 15 parts by weight | CL-3 15 parts by weight | CL-3 15 parts by weight |
| Solvent | GBL 150 parts by weight | GBL 150 parts by weight | GBL 150 parts by weight | GBL 150 parts by weight | GBL 150 parts by weight | GBL 150 parts by weight |

TABLE 11

|  | Photosensitive resin composition 22 |
|---|---|
| Base resin | A-13 100 parts by weight |
| Photosensitive agent | Photosensitive agent 1 15 parts by weight |
| Crosslinking agent | CL-2 5 parts by weight |
| Crosslinking agent | CL-3 15 parts by weight |
| Solvent | GBL 150 parts by weight |

The photosensitive resin compositions 10 to 22 shown in Tables 9 to 11 relate to the positive type photosensitive resin composition of the second embodiment according to the present invention.

TABLE 12

|  | Comparative Photosensitive resin composition 15 | Comparative Photosensitive resin composition 16 | Comparative Photosensitive resin composition 17 | Comparative Photosensitive resin composition 18 | Comparative Photosensitive resin composition 19 |
|---|---|---|---|---|---|
| Base resin | A-23 100 parts by weight | A-24 100 parts by weight | A-25 100 parts by weight | A-26 100 parts by weight | A-27 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Cross-linking agent | CL-2 5 parts by weight | CL-2 5 parts by weight | CL-2 5 parts by weight | CL-2 5 parts by weight | CL-2 5 parts by weight |
| Cross-linking agent | CL-3 15 parts by weight | CL-3 15 parts by weight | CL-3 15 parts by weight | CL-3 15 parts by weight | CL-3 15 parts by weight |
| Solvent | GBL 150 parts by weight | GBL 150 parts by weight | GBL 150 parts by weight | GBL 150 parts by weight | GBL 150 parts by weight |
| Solubility of base resin | Turbid | Turbid | Turbid | Turbid | Turbid |

TABLE 13

|  | Comparative Photosensitive resin composition 20 | Comparative Photosensitive resin composition 21 | Comparative Photosensitive resin composition 22 |
|---|---|---|---|
| Base resin | A-30 100 parts by weight | A-31 100 parts by weight | A-32 100 parts by weight |
| Photosensitive agent | Photosensitive agent 1 15 parts by weight | Photosensitive agent 1 15 parts by weight | Photosensitive agent 1 15 parts by weight |
| Crosslinking agent | CL-2 5 parts by weight | CL-2 5 parts by weight | CL-2 5 parts by weight |
| Crosslinking agent | CL-3 15 parts by weight | CL-3 15 parts by weight | CL-3 15 parts by weight |
| Solvent | GBL 150 parts by weight | GBL 150 parts by weight | GBL 150 parts by weight |
| Solubility of base resin | Dissolved | Dissolved | Turbid |

The comparative photosensitive resin compositions 15 to 19 and the comparative photosensitive resin composition 22 shown in Tables 12 and 13 are materials in which, in the positive type photosensitive resin composition of the second embodiment according to the present invention, the polymers of a polyimide precursor synthesized in Comparative Synthesis Examples 1 to 5 and Comparative Synthesis Example 10 were used as the base resin in place of the polymer of a polyimide precursor of the present invention. The polymers of a polyimide precursor synthesized in these Comparative Synthesis Examples were not the polymer containing the structural unit (1), i.e., these do not contain an alkyl group or aromatic group in which a part or whole of the hydrogen atom(s) is/are substituted by a fluorine atom(s) represented by the Rf group, so that these were never dissolved completely in versatile γ-butyrolactone, and became turbid. On the other hand, the comparative photosensitive resin compositions 20 and 21 use the polymers which were synthesized in Comparative Synthesis Example 8 and Comparative Synthesis Example 9, which polymers do not contain the structural unit (1) but contain the structural unit (13), so that these contain the group represented by the Rf group whereby these were soluble in an versatile organic solvent and were soluble in γ-butyrolactone.

TABLE 14

|  | Comparative Photosensitive resin composition 23 | Comparative Photosensitive resin composition 24 | Comparative Photosensitive resin composition 25 | Comparative Photosensitive resin composition 26 | Comparative Photosensitive resin composition 27 | Comparative Photosensitive resin composition 28 |
|---|---|---|---|---|---|---|
| Base resin | A-23 100 parts by weight | A-24 100 parts by weight | A-25 100 parts by weight | A-26 100 parts by weight | A-27 100 parts by weight | A-32 100 parts by weight |

TABLE 14-continued

|  | Comparative Photosensitive resin composition 23 | Comparative Photosensitive resin composition 24 | Comparative Photosensitive resin composition 25 | Comparative Photosensitive resin composition 26 | Comparative Photosensitive resin composition 27 | Comparative Photosensitive resin composition 28 |
|---|---|---|---|---|---|---|
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Cross-linking agent | CL-2 5 parts by weight | CL-2 5 parts by weight | CL-2 5 parts by weight | CL-2 5 parts by weight | CL-2 5 parts by weight | CL-2 5 parts by weight |
| Cross-linking agent | CL-3 15 parts by weight | CL-3 15 parts by weight | CL-3 15 parts by weight | CL-3 15 parts by weight | CL-3 15 parts by weight | CL-3 15 parts by weight |
| Solvent | NMP 150 parts by weight | NMP 150 parts by weight | NMP 150 parts by weight | NMP 150 parts by weight | NMP 150 parts by weight | NMP 150 parts by weight |

The polymers of a polyimide precursor synthesized in Comparative Synthesis Example 1 to 5 and Comparative Synthesis Example 10 do not dissolve in γ-butyrolactone, so that the comparative photosensitive resin compositions 23 to 28 were prepared by using N-methyl-2-pyrrolidone (NMP) as a solvent as in the compositions shown in Table 14.

TABLE 15

|  | Photosensitive resin composition 23 | Photosensitive resin composition 24 | Photosensitive resin composition 25 | Photosensitive resin composition 26 | Photosensitive resin composition 27 |
|---|---|---|---|---|---|
| Base resin | A-1 100 parts by weight | A-9 100 parts by weight | A-10 100 parts by weight | A-11 100 parts by weight | A-12 100 parts by weight |
| Photosensitive agent | Photosensitive agent 1 15 parts by weight | Photosensitive agent 1 15 parts by weight | Photosensitive agent 1 15 parts by weight | Photosensitive agent 1 15 parts by weight | Photosensitive agent 1 15 parts by weight |
| Cross-linking agent | CL-2 5 parts by weight | CL-2 5 parts by weight | CL-2 5 parts by weight | CL-2 5 parts by weight | CL-2 5 parts by weight |
| Cross-linking agent | CL-3 15 parts by weight | CL-3 15 parts by weight | CL-3 15 parts by weight | CL-3 15 parts by weight | CL-3 15 parts by weight |
| Heat acid generator | E-1 2 parts by weight | E-1 2 parts by weight | E-1 2 parts by weight | E-1 2 parts by weight | E-1 2 parts by weight |
| Solvent | GBL 150 parts by weight | GBL 150 parts by weight | GBL 150 parts by weight | GBL 150 parts by weight | GBL 150 parts by weight |

The photosensitive resin compositions 23 to 27 shown in Table 15 relate to the embodiment, in particular, which contain the component (E) among the positive type photosensitive resin compositions of the present invention.

TABLE 16

|  | Photosensitive resin composition 28 | Photosensitive resin composition 29 | Photosensitive resin composition 30 | Photosensitive resin composition 31 | Photosensitive resin composition 32 |
|---|---|---|---|---|---|
| Base resin | A-16 100 parts by weight | A-17 100 parts by weight | A-18 100 parts by weight | A-21 100 parts by weight | A-22 100 parts by weight |

TABLE 16-continued

|  | Photosensitive resin composition 28 | Photosensitive resin composition 29 | Photosensitive resin composition 30 | Photosensitive resin composition 31 | Photosensitive resin composition 32 |
|---|---|---|---|---|---|
| Photoradical initiator | Photoradical initiator 1 2 parts by weight | Photoradical initiator 1 2 parts by weight | Photoradical initiator 1 2 parts by weight | Photoradical initiator 1 2 parts by weight | Photoradical initiator 1 2 parts by weight |
| Solvent | GBL 150 parts by weight | GBL 150 parts by weight | GBL 150 parts by weight | GBL 150 parts by weight | GBL 150 parts by weight |

The photosensitive resin composition 28 to 32 shown in Table 16 relate to the negative type photosensitive resin compositions of the first embodiment according to the present invention.

TABLE 17

|  | Comparative Photosensitive resin composition 29 | Comparative Photosensitive resin composition 30 | Comparative Photosensitive resin composition 31 | Comparative Photosensitive resin composition 32 |
|---|---|---|---|---|
| Base resin | A-28 100 parts by weight | A-29 100 parts by weight | A-36 100 parts by weight | A-37 100 parts by weight |
| Photoradical initiator | Photoradical initiator 1 2 parts by weight | Photoradical initiator 1 2 parts by weight | Photoradical initiator 1 2 parts by weight | Photoradical initiator 1 2 parts by weight |
| Solvent | NMP 150 parts by weight | NMP 150 parts by weight | NMP 150 parts by weight | NMP 150 parts by weight |

The comparative photosensitive resin compositions 29 to 32 shown in Table 17 were materials in which, in the negative type photosensitive resin composition of the first embodiment according to the present invention, the polymers of a polyimide precursor synthesized in Comparative Synthesis Examples 6 and 7 and Comparative Synthesis Examples 14 and 15 were used as the base resin in place of the polymer of a polyimide precursor of the present invention. These polymers of a polyimide precursor synthesized in Comparative Synthesis Examples were not the polymer containing the structural unit (1), i.e., these do not contain an alkyl group or aromatic group in which a part or whole of the hydrogen atom(s) is/are substituted by a fluorine atom(s) represented by the Rf group, so that it is clear that these do not completely dissolve in versatile γ-butyrolactone as mentioned above. Accordingly, the comparative photosensitive resin compositions 29 to 32 were prepared by using N-methyl-2-pyrrolidone as a solvent as shown in Table 17.

TABLE 18

|  | Photosensitive resin composition 33 | Photosensitive resin composition 34 | Photosensitive resin composition 35 |
|---|---|---|---|
| Base resin | A-14 100 parts by weight | A-15 100 parts by weight | A-20 100 parts by weight |
| Photoradical initiator | Photoradical initiator 1 2 parts by weight | Photoradical initiator 1 2 parts by weight | Photoradical initiator 1 2 parts by weight |
| Crosslinking agent | CL-1 15 parts by weight | CL-1 15 parts by weight | CL-1 15 parts by weight |
| Solvent | GBL 150 parts by weight | GBL 150 parts by weight | GBL 150 parts by weight |

The photosensitive resin compositions 33 to 35 shown in Table 18 relate to the negative type photosensitive resin composition of the second embodiment according to the present invention.

TABLE 19

|  | Comparative Photosensitive resin composition 33 | Comparative Photosensitive resin composition 34 | Comparative Photosensitive resin composition 35 |
|---|---|---|---|
| Base resin | A-33 100 parts by weight | A-34 100 parts by weight | A-35 100 parts by weight |
| Photoradical initiator | Photoradical initiator 1 2 parts by weight | Photoradical initiator 1 2 parts by weight | Photoradical initiator 1 2 parts by weight |
| Crosslinking agent | CL-1 15 parts by weight | CL-1 15 parts by weight | CL-1 15 parts by weight |
| Solvent | NMP 150 parts by weight | NMP 150 parts by weight | NMP 150 parts by weight |

The comparative photosensitive resin compositions 33 to 35 shown in Table 19 were materials in which, in the negative type photosensitive resin composition of the second embodiment according to the present invention, the polymers of a polyimide precursor synthesized in Comparative Synthesis Examples 11 to 13 were used as the base resin in place of the polymer of a polyimide precursor of the present invention. These polymers of a polyimide precursor synthesized in Comparative Synthesis Examples were not the polymer containing the structural unit (1), i.e., these do not contain an alkyl group or aromatic group in which a part or whole of the hydrogen atom(s) is/are substituted by a fluorine atom(s) represented by the Rf group, so that it is clear that these do not completely dissolve in versatile γ-butyrolactone as mentioned above. Accordingly, the comparative photosensitive resin compositions 33 to 35 were prepared by using N-methyl-2-pyrrolidone as a solvent as shown in Table 19.

TABLE 20

|  | Photosensitive resin composition 36 | Photosensitive resin composition 37 | Photosensitive resin composition 38 | Photosensitive resin composition 39 | Photosensitive resin composition 40 | Photosensitive resin composition 41 |
| --- | --- | --- | --- | --- | --- | --- |
| Base resin | A-1 100 parts by weight | A-2 100 parts by weight | A-3 100 parts by weight | A-4 100 parts by weight | A-5 100 parts by weight | A-6 100 parts by weight |
| Photoacid generator | Photoacid generator 1 2 parts by weight | Photoacid generator 1 2 parts by weight | Photoacid generator 1 2 parts by weight | Photoacid generator 1 2 parts by weight | Photoacid generator 1 2 parts by weight | Photoacid generator 1 2 parts by weight |
| Crosslinking agent | CL 2 15 parts by weight | CL 2 15 parts by weight | CL 2 15 parts by weight | CL 2 15 parts by weight | CL 2 15 parts by weight | CL 2 15 parts by weight |
| Crosslinking agent | CL-3 15 parts by weight | CL-3 15 parts by weight | CL-3 15 parts by weight | CL-3 15 parts by weight | CL-3 15 parts by weight | CL-3 15 parts by weight |
| Solvent | GBL 150 parts by weight | GBL 150 parts by weight | GBL 150 parts by weight | GBL 150 parts by weight | GBL 150 parts by weight | GBL 150 parts by weight |

TABLE 21

|  | Photosensitive resin composition 42 | Photosensitive resin composition 43 | Photosensitive resin composition 44 | Photosensitive resin composition 45 | Photosensitive resin composition 46 | Photosensitive resin composition 47 |
| --- | --- | --- | --- | --- | --- | --- |
| Base resin | A-7 100 parts by weight | A-8 100 parts by weight | A-9 100 parts by weight | A-10 100 parts by weight | A-11 100 parts by weight | A-12 100 parts by weight |
| Photoacid generator | Photoacid generator 1 2 parts by weight | Photoacid generator 1 2 parts by weight | Photoacid generator 1 2 parts by weight | Photoacid generator 1 2 parts by weight | Photoacid generator 1 2 parts by weight | Photoacid generator 1 2 parts by weight |
| Crosslinking agent | CL-2 15 parts by weight | CL-2 15 parts by weight | CL-2 15 parts by weight | CL-2 15 parts by weight | CL-2 15 parts by weight | CL-2 15 parts by weight |
| Crosslinking agent | CL-3 15 parts by weight | CL-3 15 parts by weight | CL-3 15 parts by weight | CL-3 15 parts by weight | CL-3 15 parts by weight | CL-3 15 parts by weight |
| Solvent | GBL 150 parts by weight | GBL 150 parts by weight | GBL 150 parts by weight | GBL 150 parts by weight | GBL 150 parts by weight | GBL 150 parts by weight |

TABLE 22

|  | Photosensitive resin composition 48 | Photosensitive resin composition 49 |
| --- | --- | --- |
| Base resin | A-13 100 parts by weight | A-19 100 parts by weight |
| Photoacid generator | Photoacid generator 1 2 parts by weight | Photoacid generator 1 2 parts by weight |
| Crosslinking agent | CL-2 15 parts by weight | CL-2 15 parts by weight |
| Crosslinking agent | CL-3 15 parts by weight | CL-3 15 parts by weight |
| Solvent | GBL 150 parts by weight | GBL 150 parts by weight |

The photosensitive resin compositions 36 to 49 shown in Tables 20 to 22 relate to the negative type photosensitive resin composition of the third embodiment according to the present invention.

TABLE 23

|  | Comparative Photosensitive resin composition 36 | Comparative Photosensitive resin composition 37 | Comparative Photosensitive resin composition 38 | Comparative Photosensitive resin composition 39 | Comparative Photosensitive resin composition 40 |
|---|---|---|---|---|---|
| Base resin | A-23 100 parts by weight | A-24 100 parts by weight | A-25 100 parts by weight | A-26 100 parts by weight | A-27 100 parts by weight |
| Photoacid generator | Photoacid generator 1 2 parts by weight | Photoacid generator 1 2 parts by weight | Photoacid generator 1 2 parts by weight | Photoacid generator 1 2 parts by weight | Photoacid generator 1 2 parts by weight |
| Crosslinking agent | CL-2 15 parts by weight | CL-2 15 parts by weight | CL-2 15 parts by weight | CL-2 15 parts by weight | CL-2 15 parts by weight |
| Crossliking agent | CL-3 15 parts by weight | CL-3 15 parts by weight | CL-3 15 parts by weight | CL-3 15 parts by weight | CL-3 15 parts by weight |
| Solvent | NMP 150 parts by weight | NMP 150 parts by weight | NMP 150 parts by weight | NMP 150 parts by weight | NMP 150 parts by weight |

TABLE 24

|  | Comparative Photosensitive resin composition 41 | Comparative Photosensitive resin composition 42 | Comparative Photosensitive resin composition 43 |
|---|---|---|---|
| Base resin | A-30 100 parts by weight | A-31 100 parts by weight | A-32 100 parts by weight |
| Photoacid generator | Photoacid generator 1 2 parts by weight | Photoacid generator 1 2 parts by weight | Photoacid generator 1 2 parts by weight |
| Crosslinking agent | CL-2 15 parts by weight | CL-2 15 parts by weight | CL-2 15 parts by weight |
| Crosslinking agent | CL-3 15 parts by weight | CL-3 15 parts by weight | CL-3 15 parts by weight |
| Solvent | GBL 150 parts by weight | GBL 150 parts by weight | NMP 150 parts by weight |

The comparative photosensitive resin compositions 36 to 40 and the comparative photosensitive resin composition 43 shown in Tables 23 and 24 were materials in which, in the negative type photosensitive resin composition of the third embodiment according to the present invention, the polymers of a polyimide precursor synthesized in Comparative Synthesis Examples 1 to 5 and Comparative Synthesis Example 10 were used as the base resin in place of the polymer of a polyimide precursor of the present invention. These polymers of a polyimide precursor synthesized in Comparative Synthesis Examples were not the polymer containing the structural unit (1), i.e., these do not contain an alkyl group or aromatic group in which a part or whole of the hydrogen atom(s) is/are substituted by a fluorine atom(s) represented by the Rf group, so that it is clear that these do not completely dissolve in versatile γ-butyrolactone as mentioned above. Accordingly, the comparative photosensitive resin compositions 36 to 40 and the comparative photosensitive resin composition 43 were prepared by using N-methyl-2-pyrrolidone as a solvent as shown in Tables 23 and 24. On the other hand, the comparative photosensitive resin compositions 41 and 42 use the polymers which were synthesized in Comparative Synthesis Example 8 and Comparative Synthesis Example 9, which polymers do not contain the structural unit (1) but contain the structural unit (13), so that these contain the group represented by the Rf group, whereby these were soluble in an versatile organic solvent, i.e., soluble in γ-butyrolactone, and thus, the comparative photosensitive resin compositions 41 and 42 of Table 24 were prepared.

In Tables 3 to 24, details of the photoradical initiator (the photoradical initiator 1), the photoacid generator (the photoacid generator 1), the photosensitive agent which is a quinonediazide compound (the photosensitive agent 1), the crosslinking agents (CL-1) to (CL-3), and the heat acid generator (E-1) are as follows.

Photoradical initiator (Photoradical initiator 1): available from ADEKA corporation, NP-1919

(Photoacid generator 1)

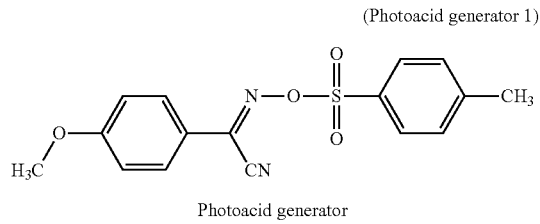

Photoacid generator

-continued (Photosensitive agent 1)

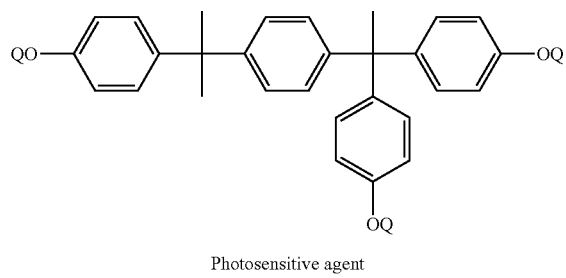

Photosensitive agent wherein, Q represents a 1,2-naphthoquinonediazide sulfonyl group represented by the following formula (33) or a hydrogen atom, and 90% of Q are substituted by the 1,2-naphthoquinonediazide sulfonyl group represented by the following formula (33), (33)

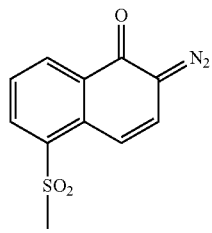

Crosslinking agent (CL-1): Ethylene glycol diacrylate

Crossing agent (CL-2)

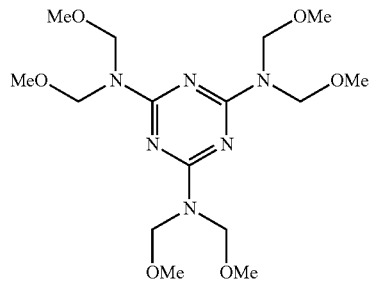

Crosslinking agent (CL-3)

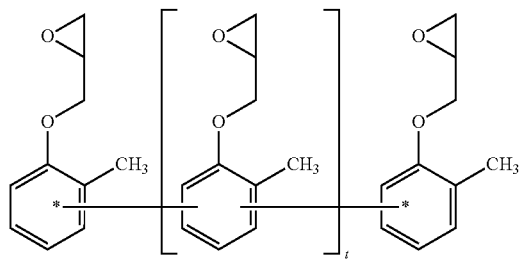

wherein, a repeating number "t" is 2≤t≤3.

Heat acid generator (E-1)

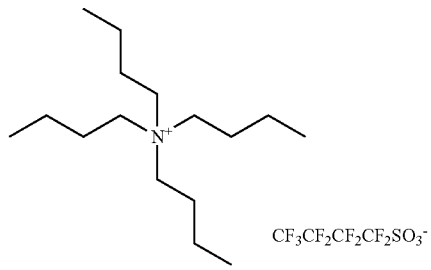

$CF_3CF_2CF_2CF_2SO_3^-$

III. Pattern Formation

The photosensitive resin compositions 1 to 49, and the comparative photosensitive resin compositions 8 to 14, 20, 21, and 23 to 43 were each dispensed on a silicon substrate in an amount of 5 mL, and then the substrate was rotated, that is, by spin coating method, and coated so as to have a film thickness of 10 μm after heating for post-curing which was subjected to after the pattern formation. That is, it was examined beforehand that the film thickness decreased after the post-curing, and the rotational speed at the time of coating was so adjusted that the finished film thickness after the post-curing would be 10 μm.

Next, pre-baking was performed on a hot plate at 100° C. for 2 minutes. Then, i line exposure and pattern formation were carried out using an i-line stepper NSR-2205i11 manufactured by Nikon Corporation. In the pattern formation, masks for the positive type pattern and the negative type pattern were used suitably in accordance with the photosensitive resin composition used. The mask has a pattern which can form a hole of 20 μm in lengthwise and breadthwise arrangement of 1:1, and can form a hole pattern of 10 μm in increments from 50 μm to 20 μm, 5 μm from 20 μm to 10 μm and 1 μm from 10 μm to 1 μm.

Next, those subjected to the heating were carried out with the conditions as shown in the following Tables 25 to 28.

In the development, an aqueous alkaline solution was used as a developing solution, and a 2.38% aqueous tetramethylammonium hydroxide solution was used as a developing solution. Paddle development with a 2.38% aqueous tetramethylammonium hydroxide (TMAH) solution for 1 minute was carried out with an appropriate number of times as shown in Tables 25 to 28, and then rinsing with ultrapure water was carried out.

Subsequently, the pattern on the substrate obtained was post-cured by using an oven at 250° C. for 2 hours while purging with nitrogen.

Next, in order to observe the shape of the obtained hole pattern, each substrate was cut out and the shape of the hole pattern was observed using a scanning electron microscope (SEM). The aperture diameter of the smallest opening hole at the film thickness of 10 μm after post-curing was obtained, and the shape of the pattern was evaluated. Together with these results, the sensitivities at which the minimum pattern could be formed are shown in Tables 25 to 28.

The pattern shape of the hole was evaluated according to the following criteria, and the evaluation results are shown in Tables 25 to 28.

Good: Those in which the rectangular or forward tapered shape (the shape in which the dimension of the hole upper part is larger than that of the bottom part) of the hole was observed Not good: Those in which inversely tapered shape (the shape in which the dimension of the hole upper part is smaller than that of the bottom part), overhang shape (the shape in which the hole upper part is protruded), or residue at the bottom of the hole was observed First, the results of subjecting to patterning using the positive type photosensitive resin compositions (the photosensitive resin compositions 1 to 27, the comparative photosensitive resin compositions 8 to 14, 20, 21 and 23 to 28) are shown in Tables 25 and 26.

TABLE 25

| | Composition | Pattern | Baking after exposure | Development condition | Hole shape | Minimum hole diameter ($\mu$m) | Sensitivity (mJ/cm$^2$) |
|---|---|---|---|---|---|---|---|
| Example 1 | Photosensitive resin composition 1 | Positive type | None | Paddle 60 sec 3 times | Good | 6 | 440 |
| Example 2 | Photosensitive resin composition 2 | Positive type | None | Paddle 60 sec 3 times | Good | 6 | 460 |
| Example 3 | Photosensitive resin composition 3 | Positive type | None | Paddle 60 sec 3 times | Good | 6 | 460 |
| Example 4 | Photosensitive resin composition 4 | Positive type | None | Paddle 60 sec 3 times | Good | 6 | 440 |
| Example 5 | Photosensitive resin composition 5 | Positive type | None | Paddle 60 sec 3 times | Good | 6 | 480 |
| Example 6 | Photosensitive resin composition 6 | Positive type | None | Paddle 60 sec 3 times | Good | 6 | 440 |
| Example 7 | Photosensitive resin composition 7 | Positive type | None | Paddle 60 sec 3 times | Good | 6 | 460 |
| Example 8 | Photosensitive resin composition 8 | Positive type | None | Paddle 60 sec 3 times | Good | 6 | 440 |
| Example 9 | Photosensitive resin composition 9 | Positive type | None | Paddle 60 sec 3 times | Good | 6 | 440 |
| Example 10 | Photosensitive resin composition 10 | Positive type | None | Paddle 60 sec 3 times | Good | 6 | 480 |
| Example 11 | Photosensitive resin composition 11 | Positive type | None | Paddle 60 sec 3 times | Good | 5 | 320 |
| Example 12 | Photosensitive resin composition 12 | Positive type | None | Paddle 60 sec 3 times | Good | 5 | 340 |
| Example 13 | Photosensitive resin composition 13 | Positive type | None | Paddle 60 sec 3 times | Good | 5 | 360 |
| Example 14 | Photosensitive resin composition 14 | Positive type | None | Paddle 60 sec 3 times | Good | 5 | 320 |
| Example 15 | Photosensitive resin composition 15 | Positive type | None | Paddle 60 sec 3 times | Good | 5 | 320 |
| Example 16 | Photosensitive resin composition 16 | Positive type | None | Paddle 60 sec 3 times | Good | 5 | 340 |
| Example 17 | Photosensitive resin composition 17 | Positive type | None | Paddle 60 sec 3 times | Good | 5 | 340 |
| Example 18 | Photosensitive resin composition 18 | Positive type | None | Paddle 60 sec 3 times | Good | 5 | 360 |
| Example 19 | Photosensitive resin composition 19 | Positive type | None | Paddle 60 sec 3 times | Good | 5 | 360 |
| Example 20 | Photosensitive resin composition 20 | Positive type | None | Paddle 60 sec 3 times | Good | 5 | 320 |
| Example 21 | Photosensitive resin composition 21 | Positive type | None | Paddle 60 sec 3 times | Good | 5 | 340 |
| Example 22 | Photosensitive resin composition 22 | Positive type | None | Paddle 60 sec 3 times | Good | 5 | 340 |

TABLE 25-continued

| | Composition | Pattern | Baking after exposure | Development condition | Hole shape | Minimum hole diameter (μm) | Sensitivity (mJ/cm$^2$) |
|---|---|---|---|---|---|---|---|
| Example 23 | Photosensitive resin composition 23 | Positive type | None | Paddle 60 sec 3 times | Good | 5 | 320 |
| Example 24 | Photosensitive resin composition 24 | Positive type | None | Paddle 60 sec 3 times | Good | 5 | 320 |
| Example 25 | Photosensitive resin composition 25 | Positive type | None | Paddle 60 sec 3 times | Good | 5 | 360 |
| Example 26 | Photosensitive resin composition 26 | Positive type | None | Paddle 60 sec 3 times | Good | 5 | 360 |
| Example 27 | Photosensitive resin composition 27 | Positive type | None | Paddle 60 sec 3 times | Good | 5 | 320 |

TABLE 26

| | Composition | Pattern | Baking after exposure | Development condition | Hole shape | Minimum hole diameter (μm) | Sensitivity (mJ/cm$^2$) |
|---|---|---|---|---|---|---|---|
| Comparative Example 1 | Comparative Photosensitive resin composition 8 | Positive type | None | Paddle 60 sec 3 times | Good | 6 | 440 |
| Comparative Example 2 | Comparative Photosensitive resin composition 9 | Positive type | None | Paddle 60 sec 3 times | Good | 6 | 460 |
| Comparative Example 3 | Comparative Photosensitive resin composition 10 | Positive type | None | Paddle 60 sec 5 times | Resolution impossible, no pattern obtained. | | |
| Comparative Example 4 | Comparative Photosensitive resin composition 11 | Positive type | None | Paddle 60 sec 5 times | Resolution impossible, no pattern obtained. | | |
| Comparative Example 5 | Comparative Photosensitive resin composition 12 | Positive type | None | Paddle 60 sec 5 times | Resolution impossible, no pattern obtained. | | |
| Comparative Example 6 | Comparative Photosensitive resin composition 13 | Positive type | None | Paddle 60 sec 5 times | Resolution impossible, no pattern obtained. | | |
| Comparative Example 7 | Comparative Photosensitive resin composition 14 | Positive type | None | Paddle 60 sec 5 times | Resolution impossible, no pattern obtained. | | |
| Comparative Example 8 | Comparative Photosensitive resin composition 20 | Positive type | None | Paddle 60 sec 5 times | Resolution impossible, no pattern obtained. | | |
| Comparative Example 9 | Comparative Photosensitive resin composition 21 | Positive type | None | Paddle 60 sec 5 times | Resolution impossible, no pattern obtained. | | |
| Comparative Example 10 | Comparative Photosensitive resin composition 23 | Positive type | None | Paddle 60 sec 3 times | Good | 7 | 380 |
| Comparative Example 11 | Comparative Photosensitive resin composition 24 | Positive type | None | Paddle 60 sec 3 times | Good | 7 | 400 |
| Comparative Example 12 | Comparative Photosensitive resin composition 25 | Positive type | None | Paddle 60 sec 3 times | Good | 7 | 400 |
| Comparative Example 13 | Comparative Photosensitive resin composition 26 | Positive type | None | Paddle 60 sec 3 times | Good | 7 | 420 |
| Comparative Example 14 | Comparative Photosensitive resin composition 27 | Positive type | None | Paddle 60 sec 3 times | Good | 7 | 400 |
| Comparative Example 15 | Comparative Photosensitive resin composition 28 | Positive type | None | Paddle 60 sec 3 times | Good | 7 | 400 |

As shown in Table 25, the positive type photosensitive resin compositions of the present invention show a good pattern shape in development with an alkaline solvent, and the minimum hole size shows a smaller value as compared with the finished film thickness of 10 μm, so that it could be found that the aspect ratio of 1 or more can be achieved.

On the other hand, as shown in Table 26, in the comparative photosensitive resin compositions 20 and 21 used in Comparative Examples 8 and 9, the base resins thereof were soluble in γ-butyrolactone, but the structural unit (1) was not contained in the base resin so that these did not dissolve in the alkaline developing solution. Therefore, a pattern could not be obtained. Similarly, the comparative photosensitive resin compositions 10 to 14 used in Comparative Examples 3 to 7 also did not contain the structural unit (1) in the base resin, so that these were not soluble in the alkaline developing solution and patterns could not be obtained.

On the other hand, in Table 26, the comparative photosensitive resin compositions 8 and 9 used in Comparative Examples 1 and 2 contain any of the structural units (9), (10), and (14) in the base resin so that these were soluble in alkali, whereby the positive type photosensitive resin compositions can be prepared and good patterns can be obtained by subjecting to the alkali development. However, the base resins of Comparative Examples 1 and 2 do not contain the structural unit (1), so that the solvent of the photosensitive resin composition was an NMP solvent.

Similarly, in Table 26, the comparative photosensitive resin compositions 23 to 28 used in Comparative Examples 10 to 15 were alkali soluble since the base resins contain the structural units (9) or (10), so that the positive type photosensitive resin compositions can be prepared and good patterns can be obtained by subjecting to the alkali development. However, the base resins of Comparative Examples 10 to 15 did not contain the structural unit (1), so that the solvent of the photosensitive resin compositions was an NMP solvent.

Next, the results of patterning using the negative type photosensitive resin compositions (the photosensitive resin compositions 28 to 49, and the comparative photosensitive resin compositions 29 to 43) are shown in Tables 27 to 28.

TABLE 27

| | Composition | Pattern | Baking after exposure | Development condition | Hole shape | Minimum hole diameter (μm) | Sensitivity (mJ/cm$^2$) |
|---|---|---|---|---|---|---|---|
| Example 28 | Photosensitive resin composition 28 | Negative type | None | Paddle 60 sec 3 times | Good | 7 | 280 |
| Example 29 | Photosensitive resin composition 29 | Negative type | None | Paddle 60 sec 3 times | Good | 7 | 300 |
| Example 30 | Photosensitive resin composition 30 | Negative type | None | Paddle 60 sec 3 times | Good | 7 | 280 |
| Example 31 | Photosensitive resin composition 31 | Negative type | None | Paddle 60 sec 3 times | Good | 7 | 260 |
| Example 32 | Photosensitive resin composition 32 | Negative type | None | Paddle 60 sec 3 times | Good | 7 | 280 |
| Example 33 | Photosensitive resin composition 33 | Negative type | None | Paddle 60 sec 3 times | Good | 7 | 280 |
| Example 34 | Photosensitive resin composition 34 | Negative type | None | Paddle 60 sec 3 times | Good | 7 | 260 |
| Example 35 | Photosensitive resin composition 35 | Negative type | None | Paddle 60 sec 3 times | Good | 7 | 260 |
| Example 36 | Photosensitive resin composition 36 | Negative type | 100° C. × 120 sec | Paddle 60 sec 3 times | Good | 8 | 660 |
| Example 37 | Photosensitive resin composition 37 | Negative type | 100° C. × 120 sec | Paddle 60 sec 3 times | Good | 8 | 660 |
| Example 38 | Photosensitive resin composition 38 | Negative type | 100° C. × 120 sec | Paddle 60 sec 3 times | Good | 8 | 680 |
| Example 39 | Photosensitive resin composition 39 | Negative type | 100° C. × 120 sec | Paddle 60 sec 3 times | Good | 8 | 660 |
| Example 40 | Photosensitive resin composition 40 | Negative type | 100° C. × 120 sec | Paddle 60 sec 3 times | Good | 8 | 680 |
| Example 41 | Photosensitive resin composition 41 | Negative type | 100° C. × 120 sec | Paddle 60 sec 3 times | Good | 8 | 640 |
| Example 42 | Photosensitive resin composition 42 | Negative type | 100° C. × 120 sec | Paddle 60 sec 3 times | Good | 8 | 660 |
| Example 43 | Photosensitive resin composition 43 | Negative type | 100° C. × 120 sec | Paddle 60 sec 3 times | Good | 8 | 660 |

TABLE 27-continued

| | Composition | Pattern | Baking after exposure | Development condition | Hole shape | Minimum hole diameter (μm) | Sensitivity (mJ/cm$^2$) |
|---|---|---|---|---|---|---|---|
| Example 44 | Photosensitive resin composition 44 | Negative type | 100° C. × 120 sec | Paddle 60 sec 3 times | Good | 8 | 640 |
| Example 45 | Photosensitive resin composition 45 | Negative type | 100° C. × 120 sec | Paddle 60 sec 3 times | Good | 8 | 640 |
| Example 46 | Photosensitive resin composition 46 | Negative type | 100° C. × 120 sec | Paddle 60 sec 3 times | Good | 8 | 640 |
| Example 47 | Photosensitive resin composition 47 | Negative type | 100° C. × 120 sec | Paddle 60 sec 3 times | Good | 8 | 640 |
| Example 48 | Photosensitive resin composition 48 | Negative type | 100° C. × 120 sec | Paddle 60 sec 3 times | Good | 8 | 680 |
| Example 49 | Photosensitive resin composition 49 | Negative type | 100° C. × 120 sec | Paddle 60 sec 3 times | Good | 7 | 700 |

TABLE 28

| | Composition | Pattern | Baking after exposure | Development condition | Hole shape | Minimum hole diameter (μm) | Sensitivity (mJ/cm$^2$) |
|---|---|---|---|---|---|---|---|
| Comparative Example 16 | Comparative Photosensitive resin composition 29 | Negative type | None | Paddle 60 sec 3 times | Good | 7 | 280 |
| Comparative Example 17 | Comparative Photosensitive resin composition 30 | Negative type | None | Paddle 60 sec 3 times | Good | 7 | 300 |
| Comparative Example 18 | Comparative Photosensitive resin composition 31 | Negative type | None | Paddle 60 sec 5 times | Resolution impossible, no pattern obtained. | | |
| Comparative Example 19 | Comparative Photosensitive resin composition 32 | Negative type | None | Paddle 60 sec 5 times | Resolution impossible, no pattern obtained. | | |
| Comparative Example 20 | Comparative Photosensitive resin composition 33 | Negative type | None | Paddle 60 sec 5 times | Resolution impossible, no pattern obtained. | | |
| Comparative Example 21 | Comparative Photosensitive resin composition 34 | Negative type | None | Paddle 60 sec 5 times | Resolution impossible, no pattern obtained. | | |
| Comparative Example 22 | Comparative Photosensitive resin composition 35 | Negative type | None | Paddle 60 sec 5 times | Resolution impossible, no pattern obtained. | | |
| Comparative Example 23 | Comparative Photosensitive resin composition 36 | Negative type | 100° C. × 120 sec | Paddle 60 sec 3 times | Good | 6 | 640 |
| Comparative Example 24 | Comparative Photosensitive resin composition 37 | Negative type | 100° C. × 120 sec | Paddle 60 sec 3 times | Good | 6 | 660 |
| Comparative Example 25 | Comparative Photosensitive resin composition 38 | Negative type | 100° C. × 120 sec | Paddle 60 sec 3 times | Good | 7 | 620 |
| Comparative Example 26 | Comparative Photosensitive resin composition 39 | Negative type | 100° C. × 120 sec | Paddle 60 sec 3 times | Good | 7 | 640 |
| Comparative Example 27 | Comparative Photosensitive resin composition 40 | Negative type | 100° C. × 120 sec | Paddle 60 sec 3 times | Good | 7 | 660 |
| Comparative Example 28 | Comparative Photosensitive resin composition 41 | Negative type | 100° C. × 120 sec | Paddle 60 sec 5 times | Resolution impossible, no pattern obtained. | | |
| Comparative Example 29 | Comparative Photosensitive resin composition 42 | Negative type | 100° C. × 120 sec | Paddle 60 sec 5 times | Resolution impossible, no pattern obtained. | | |
| Comparative Example 30 | Comparative Photosensitive resin composition 43 | Negative type | 100° C. × 120 sec | Paddle 60 sec 5 times | Resolution impossible, no pattern obtained. | | |

As shown in Table 27, the negative type photosensitive resin compositions of the present invention showed good pattern shapes in the development with an alkali solvent and showed smaller values of the minimum hole size as compared with the finished film thickness of 10 μm, so that it could be understood that the aspect ratio of 1 or more could be accomplished.

On the other hand, as shown in Table 28, the comparative photosensitive resin compositions 31 to 35 used in Comparative Examples 18 to 22 did not dissolve in an alkali developing solution since the base resins thereof did not contain the structural unit (1). Therefore, a pattern could not be obtained. Similarly, the comparative photosensitive resin composition 43 used in Comparative Example 30 did not dissolve in an alkali developing solution since the base resin did not contain the structural unit (1), and a pattern could not be obtained.

Also, on the other hand, as shown in Table 28, in the comparative photosensitive resin compositions 41 and 42 used in Comparative Examples 28 and 29, the base resins were soluble in γ-butyrolactone, but these do not contain the structural unit (1) in the base resin so that these did not dissolve in an alkali developing solution. Thus, a pattern could not be obtained.

Further, in Table 28, in the comparative photosensitive resin compositions 29 and 30 used in Comparative Examples 16 and 17, the base resins are soluble in an alkali since these contain either of the structural units (9), (10), and (14), whereby these are possible to prepare the negative type photosensitive resin compositions, and good patterns can be obtained by subjecting to alkali development. However, as mentioned above, the base resins used in Comparative Examples 16 and 17 did not contain the structural unit (1), so that the solvent of the photosensitive resin composition was an NMP solvent.

Similarly, in Table 28, the comparative photosensitive resin compositions 36 to 40 used in Comparative Examples 23 to 27, the structural units (9) and/or (10) is/are contained in the base resin, so that these are soluble in an alkali, whereby these are possible to prepare the negative type photosensitive resin compositions, and good patterns can be obtained by subjecting to alkali development. However, as mentioned above, the base resins used in Comparative Examples 23 to 27 did not contain the structural unit (1), so that the solvent of the photosensitive resin composition was an NMP solvent.

It must be stated here that the present invention is not restricted to the embodiments shown by the embodiments. The embodiments are merely examples so that any embodiments composed of substantially the same technical concept as disclosed in the claims of the present invention and expressing a similar effect are included in the technical scope of the present invention.

What is claimed is:

1. A polymer of a polyimide precursor which comprises a polymer containing a structural unit represented by the following general formula (1), a structural unit represented by the following general formula (9), and a structural unit represented by the following general formula (10),

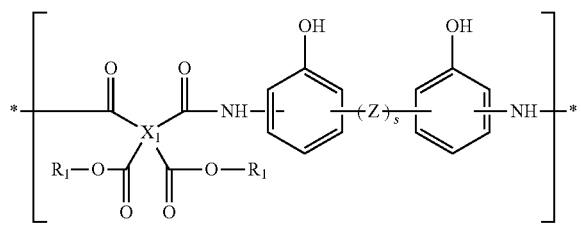

wherein, $X_1$ represents a tetravalent organic group; $R_1$ each represent a group represented by the formula —$CH_2$—$CH_2$—$CH_2$—$CF_2$—$CF_3$; a repeating number "s" represents 1; and Z represents a divalent bonding group represented by the following general formula (3),

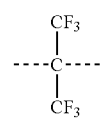

wherein, a dotted line represents a bond,

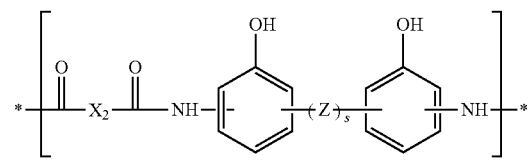

wherein, $X_2$ represents a divalent organic group; and the repeating number "s" and Z represent the same meanings as before,

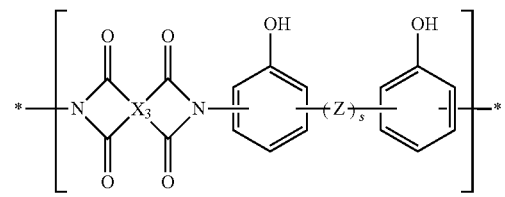

wherein, $X_3$ represents a tetravalent organic group which is the same as or different from the $X_1$; the repeating number "s" and Z represent the same meanings as before, wherein the polymer of a polyimide precursor has a weight average molecular weight measured by GPC of 5,000 to 100,000 in terms of polystyrene.

2. The polymer of a polyimide precursor according to claim 1, wherein the polymer of a polyimide precursor further comprises either one or more kinds of structural units represented by the following general formula (11) to (13),

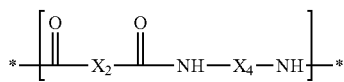
(11)

wherein, $X_2$ represents the same meaning as before; and $X_4$ represents a divalent organic group,

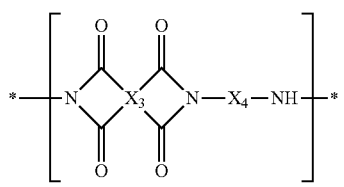
(12)

wherein, $X_3$ and $X_4$ represent the same meanings as before,

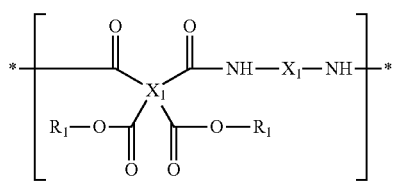
(13)

wherein, $X_1$, $X_4$, and $R_1$ represent the same meanings as before.

3. The polymer of a polyimide precursor according to claim 1, wherein the polymer of a polyimide precursor further comprises either one of or both of structural units represented by the following general formula (14) or (15),

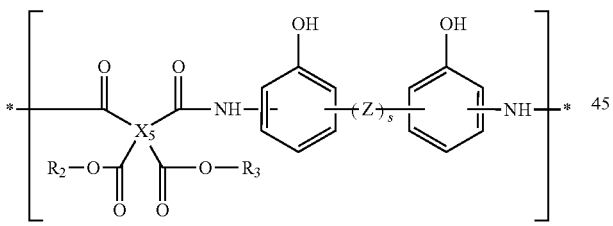
(14)

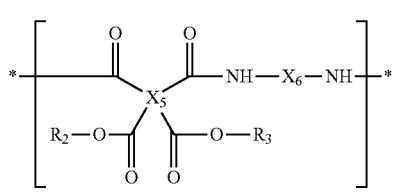
(15)

wherein, $X_5$ represents a tetravalent organic group which is the same as or different from the $X_1$; $X_6$ represents a divalent organic group; a repeating number "s" and Z represent the same meanings as before; $R_2$ and $R_3$ each independently represent a hydrogen atom, a linear, branched or cyclic alkyl group having 1 to 6 carbon atoms or an organic group represented by the following general formula (16), and either one of or both of $R_2$ and $R_3$ is/are an organic group represented by the following general formula (16),

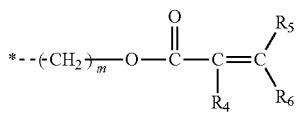
(16)

wherein, a dotted line represents a bond; $R_4$ represents a hydrogen atom or an organic group having 1 to 3 carbon atoms; $R_5$ and $R_6$ each independently represent a hydrogen atom or an organic group having 1 to 3 carbon atoms; and a repeating number "m" is an integer of 2 to 10.

4. A positive type photosensitive resin composition which comprises
(A) the polymer of a polyimide precursor according to claim 1,
(B) a photosensitive agent which generates an acid by light to increase a dissolution rate in an aqueous alkaline solution and is a compound having a quinonediazide structure, and
(D) a solvent.

5. The positive type photosensitive resin composition according to claim 4, wherein the positive type photosensitive resin composition further comprises (C) at least one of a crosslinking agent(s) selected from an amino condensate modified by formaldehyde or formaldehyde-alcohol, a phenol compound having two or more methylol groups or alkoxymethylol groups in one molecule in average, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

(C-1)

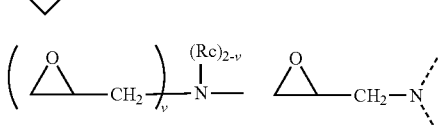
(C-2)

wherein, a dotted line represents a bond; Rc represents a linear, branched or a cyclic alkyl group having 1 to 6 carbon atoms; and "v" represents 1 or 2.

6. The positive type photosensitive resin composition according to claim 4, wherein the positive type photosensitive resin composition further contains (E) a compound which generates an acid or a radical by heat.

7. A negative type photosensitive resin composition which comprises
(A') the polymer of a polyimide precursor according to claim 3,
(B') a photoradical initiator, and
(D) a solvent.

8. A negative type photosensitive resin composition which comprises
(A') the polymer of a polyimide precursor according to claim 3,
(B') a photoradical initiator, (C') a crosslinking agent having two or more photopolymerizable unsaturated bonding groups in one molecule, and
(D) a solvent.

9. A negative type photosensitive resin composition which comprises
(A") the polymer of a polyimide precursor according to claim 1,
(B") a photoacid generator,
(C) at least one of a crosslinking agent(s) selected from an amino condensate modified by formaldehyde or formaldehyde-alcohol, a phenol compound having two or more methylol groups or alkoxymethylol groups in one molecule in average, a compound in which a hydrogen atom of a hydroxyl group of a polyvalent phenol is substituted by a glycidyl group, a compound in which a hydrogen atom of a hydroxyl group of a polyvalent phenol is substituted by a substituent represented by the following formula (C-1), and a compound having two or more nitrogen atoms having a glycidyl group represented by the following formula (C-2),

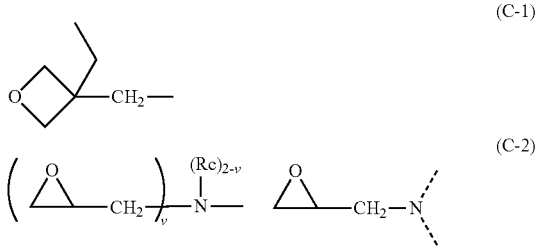

wherein, a dotted line represents a bond; Rc represents a linear, branched or a cyclic alkyl group having 1 to 6 carbon atoms; and "v" represents 1 or 2, and
(D) a solvent.

10. A patterning process which comprises
(1) coating the positive type photosensitive resin composition according to claim 8 onto a substrate to form a film of a photosensitive material,
(2) then, after heat treatment, exposing the film of the photosensitive material by a high energy beam with a wavelength of 190 to 500 nm or an electron beam through a photomask, and
(3) developing the film using a developing solution of an aqueous alkaline solution.

11. A patterning process which comprises
(I) coating the negative type photosensitive resin composition according to claim 7 onto a substrate to form a film of a photosensitive material,
(II) then, after heat treatment, exposing the film of the photosensitive material by a high energy beam with a wavelength of 190 to 500 nm or an electron beam through a photomask, and
(III) developing the film using a developing solution of an aqueous alkaline solution.

12. The patterning process according to claim 11, wherein the method further comprises heating after exposure between the exposure and the development.

13. A method of forming a cured film which comprises heating and post-curing the film subjected to the pattern formation obtained by the patterning process according to claim 10 at a temperature of 100 to 300° C.

14. An interlayer insulating film which comprises a cured film in which the positive type photosensitive resin composition according to claim 4 has been coated on a substrate and heated.

15. A surface protective film which comprises a cured film in which the positive type photosensitive resin composition according to claim 4 has been coated on a substrate and heated.

16. An electronic part which comprises the interlayer insulating film according to claim 14.

* * * * *